United States Patent
Kawada et al.

(10) Patent No.: US 6,853,874 B2
(45) Date of Patent: Feb. 8, 2005

(54) VARIABLE-WIDTH SUBSTRATE CONVEYOR, METHOD OF CHANGING WIDTH OF THE SAME, AND METHOD OF MATCHING WIDTHS OF TWO ADJACENT SUBSTRATE CONVEYORS

(75) Inventors: Tosuke Kawada, Chiryu (JP); Toshinori Shimizu, Kariya (JP); Manabu Mizuno, Toyota (JP); Jun Adachi, Nagoya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 422 days.

(21) Appl. No.: 10/003,086

(22) Filed: Dec. 6, 2001

(65) Prior Publication Data

US 2002/0070102 A1 Jun. 13, 2002

(30) Foreign Application Priority Data

Dec. 8, 2000 (JP) ............................ 2000-374934
Sep. 28, 2001 (JP) ............................ 2001-301549

(51) Int. Cl.$^7$ ............................................. G06F 7/00
(52) U.S. Cl. ................ 700/213; 198/604; 198/836.1; 198/836.3; 29/759; 414/749.6; 414/800; 414/806

(58) Field of Search ................. 700/213, 245, 700/259; 198/479.1, 604, 626.3, 782, 836.1, 836.3, 837; 29/759; 414/749.6, 800, 806

(56) References Cited

U.S. PATENT DOCUMENTS

| | | | |
|---|---|---|---|
| 6,256,869 B1 * | 7/2001 | Asai et al. ..................... 29/740 |
| 6,460,692 B2 * | 10/2002 | Dionne et al. ........... 198/836.3 |
| 6,538,425 B1 * | 3/2003 | Kawada ................... 324/158.1 |
| 6,594,887 B1 * | 7/2003 | Okuda et al. ................. 29/739 |

* cited by examiner

*Primary Examiner*—Khoi H. Tran
(74) *Attorney, Agent, or Firm*—Oliff & Berridge, PLC

(57) ABSTRACT

A method of changing a width of a variable-width substrate conveyor including a feeding device for feeding a circuit substrate along the guide rails, a pair of guide rails having guide surfaces for guiding the circuit substrate being fed by the feeding device, in a longitudinal direction of the guide rails, and a width changing device for moving the guide rails relative to each other toward or away from each other, to change a distance between the guide rails, wherein an image-taking device is operated to take an image of a portion of at least one of the guide rails, and the width changing device is controlled on the basis of the image taken by the image-taking device.

27 Claims, 21 Drawing Sheets

VARIABLE-WIDTH SUBSTRATE CONVEYOR, METHOD OF CHANGING WIDTH OF THE SAME, AND METHOD OF MATCHING WIDTHS OF TWO ADJACENT SUBSTRATE CONVEYORS

This application is based on Japanese Patent Application No. 2000-374934 filed on Dec. 8, 2000 and No. 2001-301549 filed on Sep. 28, 2001, the contents of which are incorporated hereinto by reference.

BACKGROUND OF THE INVENTION

1. Field of the Invention

The present invention relates in general to a variable-width substrate conveyor the width of which is variable, a method of changing the width of such a variable-width substrate conveyor, and a method of matching the widths of two adjacent substrate conveyors. More particularly, this invention is concerned with automatic changing of the width of the substrate conveyor.

2. Discussion of Related Art

A substrate conveyor is provided in various systems and equipment such as an electric-component mounting system, for conveying or feeding a circuit substrate such as a printed-circuit board. The electric-component mounting system is arranged to mount electric components (typically, electronic components) on the printed-circuit board. The substrate conveyor may be a variable-width conveyor. For instance, the variable-width substrate conveyor includes a stationary guide rail, a movable guide rail movable toward and away from the stationary guide rail, a pair of endless belts, and a belt-drive device. The pair of endless belts are guided by the stationary and movable guide rails, respectively, and the circuit substrate is supported at its widthwise opposite sides by straight portions of the endless belts. The endless belts are rotated by the belt-drive device, so that the circuit substrate is fed by the endless belts while the circuit substrate is guided at its side edges by the pair of guide rails.

The width of the variable-width substrate conveyor is changed depending upon the specific width of the circuit substrate to be fed. The width of the substrate conveyor is changed by changing the distance between the pair of guide rails. Conventionally, the width of the substrate conveyor is automatically changed by a movement of the movable guide rail by a width changing device which uses a servomotor as its drive source, for example. The servomotor is an electric motor whose operating angle can be accurately controlled, so that the movable guide rail can be accurately moved to a position at which the width between the two guide rails corresponds to the width of the circuit substrate.

However, the servomotor is expensive and inevitably increases the cost of manufacture of the variable-width substrate conveyor. Further, the use of the servomotor does not necessarily assure a sufficiently high degree of accuracy of positioning of the movable guide rail. Where a single servomotor is used to rotate a plurality of feedscrews arranged in the longitudinal direction of the movable guide rail, for example, the movable guide rail may not be positioned with a sufficiently high degree of accuracy, even if the operating angle of the servomotor itself is accurately controlled. Namely, a rotary motion of the servomotor is transmitted to the plurality of feedscrews through a motion transmitting device including chains and sprockets. The accuracy of motion transmission from the servomotor to the feedscrews may be deteriorated due to backlashes and other factors of the motion transmitting device, so that the positioning accuracy of the movable guide rail may be deteriorated.

SUMMARY OF THE INVENTION

It is therefore a first object of the present invention to provide a method of changing the width of a variable-width substrate conveyor, which method solves at least one of the problems of increased cost of the conveyor and deteriorated width changing accuracy of the conveyor. It is a second object of the present invention to provide a variable-width substrate conveyor which solves at least one of the above-indicated problems.

It is a third object of this invention to provide a method of matching the widths of two adjacent substrate conveyors, which solves at least one of the above-indicated problems.

Each of the objects indicated above may be achieved according to appropriate ones of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A method of changing a width of a variable-width substrate conveyor including (a) a feeding device for feeding a circuit substrate along the guide rails, (b) a pair of guide rails having respective guide surfaces for guiding opposite side faces of the circuit substrate being fed by the feeding device, in a longitudinal direction of the pair of guide rails, and (c) a width changing device for moving the pair of guide rails relative to each other toward or away from each other, to change a distance between the pair of guide rails, for thereby changing the width of the variable-width substrate conveyor, the method comprising:

an image-taking step of operating an image-taking device to take an image of a portion of at least one of the pair of guide rails; and a controlling step of controlling the width changing device on the basis of the image taken by the image-taking device.

The feeding device of the substrate conveyor described above may include a reciprocating member and a drive device for reciprocating the reciprocating member. The reciprocating member is arranged to move the circuit substrate, in engagement with a portion of the circuit substrate, when the reciprocating member is moved in one of opposite directions in the longitudinal direction of the guide rails. Alternatively, the feeding device may include a pair of endless belts and a drive device for rotating the endless belts. The endless belts are guided by the pair of guide rails and which have straight portions for supporting the circuit substrate at its widthwise opposite end portions. The guiding means may consist of a pair of guiding portions of the pair of guide rails, which are formed to guide the circuit substrate at its opposite side faces or edges. Alternatively, the guiding means may consist of positioning portions of the endless belts, which are arranged to engage the opposite side faces or edges of the circuit substrate so as to position the circuit substrate in the direction perpendicular to the longitudinal direction of the guide rails, and which are moved with the endless belts. Alternatively, the guiding means may be a guiding device which is provided separately from the guide rails and the feeding device. The guide rails may be arranged to directly guide the circuit substrate, or to guide the feeding device. The term "guide rail" is interpreted to not only mean a main body of the guide rail per se, but also include a member which is fixed to the guide rail and which is moved with the guide rail. The term "portion of at least one of the pair of guide rails" indicated above is interpreted to include not only a fiducial mark provided on the guide rail to detect the position of the guide rail, but also a specific portion of the guide rail which is provided for some purpose, such as a guiding portion provided to guide the corresponding side face or edge of the circuit substrate.

The pair of guide rails may consist of a stationary guide rail fixed in position and a movable guide rail which is movable toward and away from the stationary guide rail. Alternatively, the pair of guide rails may consist of two movable guide rails movable toward and away from each other.

The circuit substrate may include: a printed-wiring board on which electric components (e.g., electronic components) have been mounted for none of printed wirings formed on an electrically insulating substrate; a printed-wiring board on which electric components have been mounted for some of the printed wirings; a printed-wiring board on which electric components have been soldered to the printed wirings; and a circuit substrate on which are formed solder bumps for package electric components in which chips are enclosed in protective housings.

According to the method of the present invention, a portion of at least one of the pair of guide rails is imaged by the image-taking device, so that the position of each of the at least one guide rail whose portion has been imaged can be obtained on the basis of the position of the image-taking device and the position of the taken image of the portion of the guide rail in question. Accordingly, the image taken by the image-taking device can be used to check if the guide rail has been moved to a desired position at which the desired distance between the guide rails is established to establish the desired width of the substrate conveyor corresponding to the width of the specific circuit substrate, even where the width changing device uses as its drive source an electric motor the operating speed of which can be controlled but the operating amount of which cannot be controlled. The guide rail can be stopped at the desired position with high accuracy on the basis of the image taken by the image-taking device, so that the distance between the guide rails can be changed to change the width of the substrate conveyor with high accuracy, without an increase in the cost of manufacture of the width changing device.

Where the width changing device uses as its drive source a servomotor, the distance between the pair of guide rails can be accurately changed on the basis of the image of the portion of the guide rail in question, even if a rotation-transmitting device for transmitting a rotary motion of the servomotor to a feedscrew or feedscrews or other driven member or members of the width changing device has backlashes or similar defects. The amount and direction of a positioning error of the guide rail due to the backlashes or similar defects of the rotation-transmitting device can be obtained on the basis of the position of the guide rail which is obtained on the basis of the image taken by the image-taking device. Accordingly, the servomotor can be controlled so as to eliminate the positioning error of the guide rail, so that the guide rail can be accurately located at the desired position corresponding to the desired width of the substrate conveyor.

Since the width of the substrate conveyor can be accurately changed depending upon the width of the circuit substrate according to the method described above, the substrate conveyor can be suitably used in an electric-component mounting system, for moving a printed-wiring board as the circuit substrate to a predetermined component-mounting position at which electric components are mounted on the printed-wiring board. The substrate conveyor permits accurate positioning of the printed-wiring board at the component-mounting position in the system, with a reduced positioning error. Accordingly, the printed-wiring board can be positioned such that predetermined areas or spots on the surface of the printed-wiring board at which the respective electric components are to be mounted are located at respective nominal positions. This reduces a need of compensating the position of a component holder of a component-mounting head of the system when the electric component held by the component holder is mounted on the appropriate area of the printed-wiring board. Accordingly, the accuracy of mounting of the electric components on the printed-wiring board is improved. Further, the present method eliminates a need of checking if the desired width of the substrate conveyor is established.

(2) A method according to the above mode (1), wherein the pair of guide rails consist of a stationary guide rail fixed in position and a movable guide rail which is movable toward and away from the stationary guide rail, wherein the image-taking step comprises a movable-guide-rail detecting step of operating the image-taking device to take an image of a portion of the movable guide rail, and detecting a position of the movable guide rail on the basis of the image taken by the image-taking device, and the controlling step comprises controlling the width changing device on the basis of the position of the movable guide rail detected in the guide-rail detecting step, a position of the stationary guide rail, and a desired value of the distance between the stationary and movable guide rails, such that an actual value of the distance coincides with the desired value.

The nominal position or detected position of the stationary guide rail may be used as the position of the stationary guide rail.

A desired position of the movable guide rail at which the desired distance between the two guide rails is established is obtained from the position of the stationary guide rail and the desired distance between the guide rails. However, the desired position of the movable guide rail may be directly represented by position data.

The position of the movable guide rail can be obtained on the basis of the position of the image-taking device and the position of the image of the above-indicated portion of the movable guide rail within the imaging area of the image-taking device. The width of the substrate conveyor can be accurately changed by controlling the width changing device on the basis of the thus obtained position of the movable guide rail, the position of the stationary guide rail and the desired distance between the guide rails, in a manner according to any one of the following modes (3)–(5) of this invention which will be described.

Alternatively, the actual distance between the movable and stationary guide rails is calculated on the basis of the positions of the two guide rails, and the calculated actual distance is compared with the desired distance. The desired width of the substrate conveyor can be established by stopping the movement of the movable guide rail is stopped when the actual distance becomes equal to the desired distance.

(3) A method according to the above mode (1), wherein the pair of guide rails consist of a stationary guide rail fixed in position and a movable guide rail which is movable toward and away from the stationary guide rail, wherein the image-taking step comprises a moving step of moving the image-taking device to a position determined on the basis of a position of the stationary guide rail, and the controlling step comprises controlling the width changing device such that the position of the image-taking device coincides with a position of a portion of the movable guide rail.

The position of the movable guide rail determined by the position of the stationary guide rail is a desired position to which the movable guide rail to establish the distance between the two guide rails which corresponds to the width of the circuit substrate and the desired width of the substrate conveyor.

The image-taking device which has reached the desired position waits for a movement of the movable guide rail toward the desired position. The image-taking device can be generally positioned with high accuracy at the desired position. Accordingly, it is possible to determine that the position of the above-indicated portion of the movable guide rail coincides with the position of the image-taking device, when the image of that portion of the movable guide rail is taken in a predetermined condition, by the image-taking device located at the desired position. The movement of the movable guide rail is stopped when the above-indicated image is taken in the predetermined condition by the image-taking device, so that the movable guide rail can be accurately located at the desired position, to establish the desired width of the substrate conveyor. The "predetermined condition" may be a condition in which the image of the above-indicated portion of the movable guide rail taken by the image-taking device is aligned with the center of the imaging area of the image-taking device, for instance, or a condition in which there is a deviation between the above-indicated image and the center of the imaging area, which deviation is expected to be zeroed by a movement of the movable guide rail to the desired position by inertia after generation of a command to stop the movement while there is the above-indicted deviation.

(4) A method according to the above mode (1), wherein the pair of guide rails consist of a stationary guide rail fixed in position and a movable guide rail which is movable toward and away from the stationary guide rail, wherein the controlling step comprises operating the width changing device to move the movable guide rail, while moving the image-taking device so as to follow a movement of a portion of the movable guide device, and controlling the width changing device such that the movable guide rail is moved to a position determined on the basis of a position of the stationary guide rail.

The image-taking device is moved to follow the movable guide rail such that the image of the above-indicated portion of the movable guide rail is held within the imaging area of the image-taking device. Accordingly, the position of the movable guide rail being moved is continuously detected on the basis of the image taken by the image-taking device, so that the movable guide rail can be stopped at the desired position, on the basis of the position of the image-taking device and the desired position.

As discussed in detail in the DETAILED DESCRIPTION OF THE PREFERRED EMBODIMENTS, the movement of the image-taking device so as to follow or trace the movable guide rail is terminated when the image-taking device has reached a predetermined position close to the desired position, and the image-taking device is moved to the desired position before the movable guide rail reaches the desired position. When the image of the above-indicted portion of the movable guide rail is taken in the predetermined condition, by the image-taking device at the desired position, a command to step the movement of the movable guide rail is generated, so that the movable guide rail can be located at the desired position with high accuracy. Alternatively, the image-taking device may keep following the movable guide rail until the image-taking device reaches the desired position. The movement of the movable guide rail to the desired position can be detected on the basis of the relative position between the image-taking device and the movable guide rail and the position of the image-taking device relative to the desired position. The movement of the movable guide rail is stopped when its movement to the desired position is detected.

(5) A method according to the above mode (1), wherein the pair of guide rails consist of a stationary guide rail fixed in position and a movable guide rail which is movable toward and away from the stationary guide rail, wherein the controlling step comprises moving the image-taking device toward a desired position at which the width of the substrate conveyor is changed to a desired value, and controlling the width changing device so as to minimize an amount of deviation of a position of the image of a portion of the movable guide rail and a predetermined position within an imaging area of the image-taking device.

In the above method (5), the image-taking device is moved to the desired position at a deceleration (acceleration) value or a speed which is controlled in a predetermined pattern, and the width changing device is controlled such that the movable guide rails follows or traces the movement of the image-taking device.

The image-taking device may be stopped at the desired position before the movable guide rail reaches the desired position, so that the image-taking device detects a movement of the movable guide rail to the desired position. Alternatively, the movement of the movable guide rail is stopped when its movement to the desired position is detected on the basis of the relative position between the image-taking device and the movable guide rail and the position of the image-taking device relative to the desired position. In the former case, the width changing device is controlled so as to zero the deviation between the position of the image of the above-indicated portion of the movable guide rail and the predetermined position in the imaging area of the image-taking device. In the latter case in which the above-indicated deviation is not zeroed, the width changing device is controlled to move the movable guide rail so as to follow the movement of the image-taking device such that the image of the movable guide rail is kept within the imaging area of the image-taking device.

(6) A method according to any one of the above modes (2)–(5), comprising a stationary-guide-rail detecting step of operating the image-taking device to take an image of a portion of the stationary guide rail, and detecting a position of the stationary guide rail on the basis of the image of the above-indicated portion of the stationary guide rail taken by the image-taking device.

The position of the stationary guide rail may be detected each time the width changing device is operated to change the width of the substrate conveyor, or only when a predetermined condition is satisfied, or instance, when a predetermined time has passed after the initiation of a working operation on the circuit substrate, or when a working operation is to be performed on the circuit substrate of predetermined kinds.

The stationary guide rail is not necessarily located at its nominal position, due to possible manufacturing and assembling errors. Further, the actual position of the stationary guide rail may change due to thermal expansion, for example. In view of these possibilities, it is desirable to detect the actual position of the stationary guide rail, for establishing the desired width of the substrate conveyor with high accuracy.

(7) A method according to any one of the above modes (1)–(6), wherein the pair of guide rails includes a movable guide rail, the method comprising a step of storing in memory means position data representative of a position of a portion of the movable guide rail which was detected during a last operation of the width changing device to change the width of the substrate conveyor, and a positioning step of positioning the image-taking device on the basis of the position data stored in the memory means.

The method according to the above mode (7) permits efficient detection of the position of the movable guide rail.

(8) A method according to any one of the above modes (1)–(7), wherein the pair of guide rails includes a movable guide rail, the method comprising a searching step of moving the image-taking device over a predetermined search range determined by a range of an operating stroke of the movable guide rail, to search the above-indicated portion of the movable guide rail, as said portion of said at least one of said pair of guide rails.

The predetermined search range determined by the range of the operating stroke of the movable guide rail may be the same as or a part of the range of the operating stroke of the movable guide rail, or may be larger than the range of the operating stroke of the movable guide rail, including the entirety of the range of the operating stroke.

For instance, the image-taking device is moved intermittently by a predetermined incremental distance, from one end toward the other end of the predetermined search range. In this case, the image-taking device takes an image of a portion of the movable guide rail at the end of each intermittent motion. The incremental distance is shorter than the dimension of the imaging area of the image-taking device as measured in the direction of the movement of the movable guide rail. Alternatively, the image-taking device may be continuously moved over the predetermined search range.

The movable guide rail is expected to be located at any position within the predetermined search range determined by the range of its operating stroke, so that the position of the movable guide rail can be detected by the searching by the image-taking device over the predetermined search range. Thus, the searching by moving the image-taking device permits detection of the position of the movable guide rail, where the position of the movable guide rail is not known at all, or where the position of the above-indicated portion of the movable guide rail is represented by the position data stored in the memory means, as in the method according to the above mode (7), or where the actual position of the movable guide rail is different from the position represented by the position data stored in the memory means, because of a manual movement of the movable guide rail by the operator of the width changing device, without updating of the position data according to the manual movement.

(9) A method according to any one of the above modes (1)–(8), wherein the step of operating an image-taking device to take an image of a portion of at least one of the pair of guide rails comprises taking a fiducial mark provided on the above-indicated portion of the at least one of the pair of guide rails.

The fiducial mark may take any desired shape, for instance, a circular or elliptical shape, a polygonal shape such as triangle, square or rectangle, or a cross. The fiducial mark may consist of a simple line or lines.

The fiducial mark may be formed on the guide rail, in any suitable manner, such as by printing directly on the guider ail, or indirectly on a film which is bonded to the guide rail. The fiducial mark may be a raised or recess portion formed on the guide rail. However, the fiducial mark is required to be formed such that the image of the fiducial mark as taken by the image-taking device has an optical characteristic such as brightness and color, which is different from that of the background of the image, so that the image can be distinguished from the background.

(10) A method according to any one of the above modes (1)–(9), wherein the pair of guide rails have a plurality of pairs of fiducial marks which are spaced apart from each other in a longitudinal direction of the guide rails, each of the pairs consisting of two fiducial marks located on the pair of guide rails, respectively, at a same position in the longitudinal direction. In this case, the step of controlling the width changing device comprises controlling the width changing device on the basis of images of the plurality of pairs of fiducial marks taken by the image-taking device.

In the method according to the above mode (10), the distance between the pair of guide rails can be obtained at a plurality of positions corresponding to the positions of the respective pairs of fiducial marks in the longitudinal direction of the guide rails, so that the width of the substrate conveyor can be adjusted with high accuracy over the entire length of the guide rails.

In the present method wherein the two or more pairs of fiducial marks are provided on the pair of guide rails, the desired width of the substrate conveyor can be established by the width changing device, with a reduced amount of variation of the actual distance between the guide rails at different longitudinal positions, with respect to the desired distance, even where the width changing device uses a single drive source to move the guide rails relative to each other. In this case, the single drive source is controlled such that an average of the distances between the guide rails obtained at the respective different longitudinal positions coincides with a desired value corresponding to the desired width of the substrate conveyor.

(11) A method according to the above mode (10), wherein the width changing device is capable of changing the distance of the pair of guide rails at a plurality of positions in the longitudinal direction, independently of each other, and the step of controlling the width changing device comprises controlling the width changing device such that the distance between the fiducial marks of each of the plurality of pairs coincides with a predetermined desired value.

In the method according to the above mode (11), the actual distance between the two guide rails can be obtained at the different longitudinal positions corresponding to the pairs of fiducial marks, on the basis of the images of the fiducial marks, so that a deviation of the actual distance with respect to the desired value can be obtained at the different longitudinal positions, even if there exists such a deviation due to a backlash between drive members and driven members of the width changing device, or due to an error in parallelism between the two guide rails. Accordingly, the two guide rails can be moved relative to each other so as to eliminate the deviation between the actual and desired distance values at the different longitudinal positions, so that the actual width of the substrate conveyor can be changed to the desired value with high accuracy over the entire length of the substrate conveyor. Where the width changing device is capable of changing the distance between the guide rails at three or more longitudinal positions thereof, independently of each other, an undesired flexure or curvature of one of the two guide rails with respect to the other can be corrected by the present width changing device.

The distance between the two guide rails can be changed at the different longitudinal positions independently of each other, by providing the width changing device with either a plurality of drive sources corresponding to the different longitudinal positions, or alternatively a single drive source. In the latter case, the width changing device may use an electric motor as the drive source to rotate a plurality of feedscrews, for example, two feedscrews for moving at least one of the guide rails, a clutch may be disposed between one of the feedscrews and the electric motor, so that transmission of a rotary motion of the electric motor between the electric motor and the above indicated one feedscrew is permitted and inhibited with the clutch placed in respective engaged and released positions, and so that the other feedscrew is directly connected to the electric motor. When the width of the substrate conveyor is changed, the clutch is first placed in its engaged position so that the two feedscrews are rotated by the electric motor, to move the two guide rails relative to each other, for instance, to move a movable guide rail relative to a stationary guide rail, for establishing a desired distance between the movable and stationary guide rails. The movable guide rail is provided with two fiducial marks corresponding to the respective feedscrews. After the above-indicated movement of the movable guide rails, images of the two fiducial marks provided on the movable guide rail are taken, and the actual distance between the two guide rails is obtained at the two positions corresponding to the two feedscrews, on the basis of the taken images, and compared with the desired value. If the actual distances at the two positions deviate from the desired value, the movable guide rail is first moved with the clutch kept in the engaged state, so as to first eliminate or zero the deviation detected on the basis of the image of the fiducial mark corresponding to the above-indicated one feedscrew (which is disconnected from the electric motor by the clutch). Then, the clutch is switched to the released position, and the movable guide rail is moved, so as to eliminate or zero the deviation detected on the basis of the other fiducial mark corresponding to the other feedscrew (which is directly connected to the electric motor).

(12) A method according to any one of the above modes (1)–(11), wherein the image-taking device is provided by an image-taking device operable to take an image of at least a portion of the circuit substrate, for detecting a position of the circuit substrate which has been fed by the feeding device of the variable-width substrate conveyor.

For instance, the image of the circuit substrate taken by the image-taking device is used to detect errors of component-mounting positions on the circuit substrate on which electric components are mounted, for example. When the electric components are mounted on the circuit substrate, the positions of the electric components are compensated for the detected errors, so that the electric components are mounted at the respective component-mounting positions with high accuracy.

In the method according to the above mode (12) wherein the image-taking device provided to take the image of at least a portion of the circuit substrate is utilized to take an image of the predetermined portion of at least one of the guide rails. This image-taking device provided to image the circuit substrate is generally moved by a suitable positioning device with high accuracy, to detect the position of the circuit substrate for assuring a high degree of accuracy of desired working operations to be performed on the circuit substrate, such as operations to mount the electric components (typically, electronic components) on the circuit substrate. Accordingly, the present method permits accurate and economical adjustment of the width of the substrate conveyor, owing to the utilization of the above-indicated image-taking device to take the image of the predetermined portion of the guide rail or rails.

(13) A method according to the above mode (12), wherein the image-taking device takes an image of a fiducial mark provided on at least the above-indicated portion of the circuit substrate.

The foregoing description with respect to the above mode (9) applies to the fiducial mark used in the above mode (13).

(14) A variable-width substrate conveyor comprising:

a feeding device for feeding a circuit substrate along the guide rails;

a pair of guide rails having respective guide surfaces for guiding opposite side faces of the circuit substrate being fed by the feeding device, in a longitudinal direction of the pair of guide rails;

a width changing device for moving the pair of guide rails relative to each other toward or away from each other, to change a distance between the pair of guide rails, for thereby changing a width of the variable-width substrate conveyor;

an image-taking device operable to take an image of a predetermined portion of at least one of the pair of guide rails;

a moving device operable to move the image-taking device in at least a direction of movement of the pair of guide rails relative to each other, and to detect a position of the image-taking device;

an image processing device operable to process image data which are obtained by the image-taking device and which represent the image of the predetermined portion of the at least one of the pair of guide rails; and a control device operable to control the width changing device on the basis of a result of processing of the image data by the image processing device.

The technical features according to any one of the above modes (1)–(13) is applicable to the variable-width substrate conveyor according to the above mode (14).

(15) A variable-width substrate conveyor according to the above mode (14), wherein the pair of guide rails consist of a stationary guide rail fixed in position and a movable guide rail which is movable toward and away from the stationary guide rail, and the image-taking device is operable to take an image of a predetermined portion of the stationary guide rail, as well as an image of a predetermined portion of the movable guide rail, as the predetermined portion of the at least one of the pair of guide rails.

The substrate conveyor according to the above mode (15) has advantages as described above with respect to the above mode (6), for example.

(16) A variable-width conveyor according to the above mode (14) or (15), wherein a fiducial mark is provided on the predetermined portion of the at least one of the pair of guide rails, and the image-taking device is operable to take an image of the fiducial mark, as the image of the predetermined portion of the at least one of the pair of guide rails.

The foregoing description with respect to the above mode (9) applies to the fiducial mark used in the above mode (16).

(17) A method of changing a width of a variable-width substrate conveyor in a substrate working system including (i) the substrate conveyor, (ii) a working device for performing a predetermined working operation on a circuit substrate which is fed to and stopped at a predetermined stop position by the substrate conveyor,(iii) an image-taking device for taking an image of a predetermined part of the circuit substrate stopped at the predetermined stop position, and (iv) a moving device for moving the image-taking device in at least a first direction parallel to a direction of the width of the substrate conveyor and detecting a position of the image-taking device, the substrate conveyor including (a) a feeding device for feeding the circuit substrate in a second direction perpendicular to the first direction, (b) a pair of guide rails having respective guiding surfaces for guiding opposite side faces of the circuit substrate parallel to the second direction while the circuit substrate is fed by the feeding device, and (c) a width changing device for moving at least one of the guide rails relative to the other in the first direction to change a distance between the guiding surfaces, for thereby changing the width of the substrate conveyor, the method comprising:

an initial-width obtaining step of obtaining an initial value of the width of the substrate conveyor;

an imaging step of operating the moving device, after the above-indicated initial value is obtained, to move the image-taking device to an image-taking position at which an image of a predetermined portion of at least one of the pair of guide rails can be taken by the image-taking device, and operating the image-taking device to take the image of the predetermined portion;

a position-obtaining step of obtaining a position of the predetermined portion of the at least one of the pair of guide rails, on the basis of the image-taking position of the image-taking device and a position of the image of the above-indicated predetermined portion within an imaging area of the image-taking device; and a width-changing step of operating the width changing device to move the pair of guide rails relative to each other in the first direction, for moving the predetermined portion of the at least one of the pair of guide rails, to a desired position which is determined on the basis of the position of the above-indicated predetermined portion obtained in the position-obtaining step, the obtained initial value of the width of the substrate conveyor, and a width of the circuit substrate to be fed by the substrate conveyor.

The working device may be a coasting device, a screen printing device, or an electric-component mounting device, for example. The coating device includes a coating head which is movable in a plane parallel to a working surface of the circuit substrate and which is arranged to apply a high-viscosity fluid such as an adhesive agent to a plurality of predetermined spots or areas on the working surface of the circuit substrate. The screen printing device includes a printing screen or stencil having a plurality of through-holes, and a squeegee which is movable in a plane parallel to the printing screen and which is arranged to apply a high-viscosity fluid such as a solder paste through the screen to a plurality of predetermined spots or areas on the circuit substrate. The electric-component mounting device is arranged to mount electronic or other electric components on a plurality of predetermined positions on the circuit substrate.

The feeding device of the variable-width substrate conveyor described above may include a reciprocating member and a drive device for reciprocating the reciprocating member, or alternatively, a pair of endless belts and a drive device for rotating the endless belts, as described above with respect to the above mode (1) of this invention.

The term "guide rail" and "predetermined portion of at least one of the pair of guide rails" indicated above have the meanings explained above with respect to the above mode (1).

The pair of guide rails may consist of a stationary guide rail fixed in position and a movable guide rail movable toward and away from the stationary guide rail, or alternatively, two movable guide rails movable toward and away from each other.

As described above with respect to the above mode (1), the circuit substrate may include a printed-wiring board without electric components mounted thereon, a printed-wiring board with the electric components mounted thereon, a printed-wiring board with the electric components soldered to printed wirings, and a circuit substrate with solder bumps formed thereon.

The above-described initial-width obtaining step may be formulated to measure, with a suitable measuring instrument, a distance between the guiding surfaces of the pair of guide rails, while the width of the substrate conveyor is kept at the present value. Alternatively, the initial-width obtaining step may be formulated to adjust the width of the substrate conveyor to a desired or known initial value while measuring the distance between the guiding surfaces with the measuring instrument. Further alternatively, the initial-width obtaining step is implemented by using a reference board having a known reference width, as described below with respect to the following mode (18) of this invention. Where the reference board is used, the initial value of the width of the substrate conveyor is a sum of the reference width of the reference board and a total amount of gaps or clearances between the guiding surfaces and the opposite side faces of the circuit substrate.

The image-taking device is provided to take the image of the predetermined part of the circuit substrate, for detecting the position of the circuit substrate. For example, the detected position of the circuit substrate is used for improving the accuracy of the working operation performed by the working device. To this end, the moving device for moving the image-taking device is arranged such that the position of the image-taking device can be obtained. Accordingly, the position of the predetermined portion of the guide rail or rails can be obtained on the basis of the position of the image of that predetermined portion taken by the image-taking device. Therefore, the desired position to which the pair of guide rails are moved relative to each other to change the width of the substrate conveyor to a desired value corresponding to the width of the circuit substrate to be fed by the substrate conveyor, that is, the distance of the relative movement of the guide rails to establish the desired width of the substrate conveyor, can be determined on the basis of the width of the circuit substrate in question, the known initial value of the width of the substrate conveyor (initial distance between the guide rails), and the position of the predetermined portion of the above-indicated at least one of the guide rails. According to the present method of changing the width of the substrate conveyor, the width changing device is merely required to move the guide rails relative to each other, and is not required to be equipped with a device for obtaining the position of the guide rails, such as a device for detecting the operating amount or angle of an electric motor used as the drive source of the width changing device. Accordingly, the width changing device requires a relatively small number of components, and is accordingly available at a reduced cost of manufacture. The width changing device, which is simple in construction and comparatively economical to manufacture, is capable of adjusting the width of the substrate conveyor with high accuracy, by utilizing the image-taking device to take the image of the predetermined portion of the guide rails, and the moving device operable to move the image-taking device. In the absence of the device for detecting the operating amount of the drive source of the width changing device, the required size of the width changing device can be reduced, making it possible to accordingly reduce the space required for installing the substrate conveyor in the substrate working system.

(18) A method according to the above mode (17), wherein the initial-width obtaining step comprises placing a reference board having a known reference width on the substrate conveyor, and adjusting the width of the substrate conveyor to the initial value, by adjusting the distance between the guiding surfaces to a value suitable for guiding the reference board.

The reference board may be a board designed exclusively as the reference board, or one of various types of the circuit substrate having different widths. In the latter case, the last type of the circuit substrate on which the working operation was performed and which is changed to another type may be used as the reference board. When the type of the circuit substrate on which the working operation is to be performed is changed from one type to another having a different width, the image of the predetermined portion of at least one of the guide rails is first taken by the image-taking device, to detect the position of the predetermined portion. Then, the desired position to which the guide rails are moved relative to each other to change the width of the substrate conveyor to a value suitable for the width of the new type of the circuit substrate is determined on the basis of the position of the predetermined portion of the above-indicated at least one of the guide rails, and a difference between the width of the last type of the circuit substrate and the width of the new type of the circuit substrate which is to be fed by the substrate conveyor.

In the method according to the above mode (18), the adjustment of the width of the circuit substrate does not require a measuring instrument to measure the distance between the guiding surfaces of the guide rails. Further, the present method facilitates the adjustment of the width of the substrate conveyor such that there exist a suitable amount of gaps between the guiding surfaces and the opposite side faces of the circuit substrate.

(19) A method according to the above mode (17) or (18), wherein the circuit substrate is provided with at least one fiducial mark which functions as the above-indicated predetermined part of the circuit substrate.

(20) A method according to any one of the above modes (17)–(19), wherein the imaging step comprises operating said image-taking device to take an image of a fiducial mark which is provided on said at least one of said pair of guide rails and which functions as the above-indicated predetermined portion of at least one of the guide rails.

The fiducial mark may take any desired shape, for instance, a circular or elliptical shape, a polygonal shape such as triangle, square or rectangle, or a cross, or a simple line or lines, as described above with respect to the above mode (9). The fiducial mark may be formed on the circuit substrate or the guide rail, in any suitable manner, for instance, by printing directly on the circuit substrate or guide rail, or indirectly on a film which is bonded to the circuit substrate or guide rail. The fiducial mark may be a raised or recess portion formed on the circuit substrate or guide rail. As also described above with respect to the above mode (9), however, the fiducial mark is required to be formed such that the image of the fiducial mark as taken by the image-taking device has an optical characteristic such as brightness and color, which is different from that of the background of the image, so that the image can be distinguished from the background.

(21) A method according to any one of the above modes (17)–(20), wherein the substrate working system includes:

a working head for performing the predetermined working operation; and a head moving device for moving the working head in a plane parallel to a working surface of the circuit substrate stopped at the predetermined stop position;

and wherein the imaging step comprises utilizing the head moving device as the moving device for moving the image-taking device.

The working head may be a coating head of the coating device, a printing head of the screen printing device, or an electric-component mounting head of the electric-component mounting device.

The method according to the above mode (21) does not require a moving device exclusively designed to move the image-taking device, and accordingly permits economical adjustment of the width of the substrate conveyor.

(22) A method according to any one of the above modes (17)–(21), wherein the position-obtaining step comprises obtaining, as the position of the predetermined portion of the above-indicated at least one of the pair of guide rails, a position of the image-taking device at which the position of the image of the predetermined portion is located at a predetermined position within the imaging area of the image-taking device.

The position of the predetermined portion of the at least one of the guide rails may be obtained while the position of the image of the predetermined portion is actually located at the predetermined position within the imaging area of the image-taking device, as in the above mode (22), or alternatively at a position spaced apart from the predetermined position. In the latter case, the position of the image-taking device at which the position of the image of the predetermined portion is located at the predetermined position within the imaging area can be calculated on the basis of the image-taking position of the image-taking device, and the position of the image relative to the predetermined position within the imaging area.

Where the moving device for moving the image-taking device uses as its drive device a servomotor the operating amount or angle of which is detected by a rotary position detector such as a rotary encoder, the position of the image-taking device can be obtained on the basis of the output signal of the rotary position detector, and the position of the predetermined portion of the guide rails can be obtained.

(23) A method according to any one of the above modes (17)–(22), wherein the width changing device includes as a drive source thereof a stepping motor, and the width-changing step comprises operating the stepping motor by an angle corresponding to a difference between the initial value of the width of the substrate conveyor and a sum of the width of the circuit substrate to be fed by the substrate conveyor and a total amount of gaps between the guiding surfaces and the opposite side faces of the circuit substrate.

The stepping motor is an electric motor the operating amount or angle of which can be controlled with high accuracy, so that the guide rails can be moved relative to each other to change the distance between the guiding surfaces to a value suitable for the width of the circuit substrate, by controlling the operating angle of the stepping motor. Accordingly, it is not essential to check whether the width of the substrate conveyor has been adjusted to the value suitable for the width of the circuit substrate, as in the method according to the following mode (24).

(24) A method according to any one of the3 above modes (17)–(23), wherein the width-changing step comprises a step of checking whether the width of the substrate conveyor has been changed to a value suitable for the width of the circuit substrate to be fed by the substrate conveyor, the checking being effected on the basis of the position of the image of the predetermined portion of the at least one of the pair of guide rails.

The moving device for moving the image-taking device is arranged such that the position of the image-taking device can be obtained. Accordingly, the actual position of the predetermined portion of the guide rails can be obtained on the basis of the position of the image-taking device and the position of the image of the predetermined portion within the imaging area of the image-taking device. On the basis of the thus obtained position of the guide rails, it is possible to check whether the width of the substrate conveyor has been changed to the value suitable for the width of the circuit substrate to be fed by the substrate conveyor. This arrangement assures a further improvement in the accuracy of adjustment of the width of the substrate conveyor depending upon the width of the circuit substrate.

(25) A method according to the above mode (24), wherein the step of checking comprises; moving the image-taking device in the first direction from the image-taking position by a distance equal to a difference between the initial value of the width of the substrate conveyor and a sum of the width of the circuit substrate to be fed by the substrate conveyor and a total amount of gaps between the guiding surfaces and the opposite side faces of the circuit substrate; operating the image-taking device to take another image of the predetermined portion of the at least one of the pair of guide rails, after the movement of the image-taking device by the distance; and effecting the checking on the basis of the another image.

(26) A method according to any one of the above modes (17)–(24), wherein the substrate conveyor is provided in combination with at least one of an upstream conveyor and a downstream conveyor which are disposed on respective upstream and downstream sides of the substrate conveyor, each of the at least one of the upstream and downstream conveyors including a feeding device, a pair of guide rails and a width changing device, which are identical with those of the substrate working system, the method further comprising a width-matching checking step of checking whether the position of the predetermined portion of the at least one of the pair of guide rails of the substrate conveyor is matched in the first direction with that of a position of a predetermined portion of at least one of the pair of guide rails of each of the at least one of the upstream and downstream conveyors, the width-matching checking step comprising operating the image-taking device to take an image of the predetermined portion of the at least one of the pair of guide rails of the each of the at least one of the upstream and downstream conveyors.

A working operation may or may not be performed on the circuit substrate on the upstream conveyor and/or the downstream conveyor. In other words, a working device may or may not be provided corresponding to the above-indicated at least one of the upstream and downstream conveyors. The substrate working system may include the at least one of the upstream and downstream conveyors as well as the substrate conveyor. Alternatively, the at least one of the upstream and downstream conveyors may constitute another substrate working system. In the former case, the at least one of the upstream and downstream conveyors may be used as a buffer or standby conveyor. Where the upstream conveyor is provided, a trailing one of the two successively fed circuit substrates is loaded onto and remains on the upstream conveyor while the working operation is performed on the leading circuit substrate placed on the substrate conveyor. After the working operation on the leading circuit substrate is completed, the trailing circuit substrate is loaded from the upstream conveyor onto the substrate conveyor when or immediately after the leading circuit substrate is unladed from the substrate conveyor.

Where the downstream conveyor is provided, the circuit substrate remains on this downstream conveyor until a substrate-receiving device or a downstream substrate working system becomes ready to receive from the substrate conveyor the circuit substrate on which the working operation has been performed. The circuit substrate is unladed from the downstream conveyor onto the substrate-receiving device or downstream substrate working system when the substrate-receiving device or downstream substrate working system becomes ready to receive the circuit substrate from the substrate conveyor. The working operation on the trailing circuit substrate on the substrate conveyor can be performed by the working device while the leading circuit substrate remains on the downstream conveyor. That is, the working operation can be initiated on the trailing circuit substrate on the substrate conveyor as soon as the leading circuit substrate has been unloaded from the substrate conveyor onto the downstream conveyor.

The width of the upstream conveyor and/or the downstream conveyor can be changed in the same manner as the width of the substrate conveyor, by the width changing device which is available at a relatively low cost. If the width changing device of each of the substrate conveyor and at least one of the upstream and downstream conveyors used an electric motor and a rotary position detector for detecting the operating amount or angle of the electric motor, the width changing device would require a relatively large number of components, and the cost of manufacture of the width changing device would be accordingly increased. The present method according to the above mode (26) permits economical adjustment of the widths of the two or three conveyors such that the width of the upstream and/or downstream conveyor or conveyors is matched with that of the substrate conveyor.

The present method comprises the width-matching checking step of checking whether the position of the guide rails of the substrate conveyor is matched in the first direction with that of the position of the guide rails of the at least one of the upstream and downstream conveyors. The present method assures smooth loading of the circuit substrate from the upstream conveyor onto the substrate conveyor, and/or unloading of the circuit substrate from the substrate conveyor onto the downstream conveyor, owing to the width-matching checking step which is effective to reduce or eliminate a variation of the actual width values of the two or three conveyors with respect to the nominal value suitable for the specific width of the circuit substrate.

(27) A method of matching widths of a substrate conveyor and at least one of an upstream conveyor and a downstream conveyor in a working system including (i) the substrate conveyor, (ii) the at least one of the upstream and downstream conveyors disposed on respective upstream and downstream sides of the substrate conveyor, (iii) a working device for performing a predetermined working operation on a circuit substrate which is fed to and stopped at a predetermined stop position by the substrate conveyor, (iv) an image-taking device for taking an image of a predetermined part of the circuit substrate stopped at the predetermined stop position, and (v) a moving device for moving the image-taking device in at least a first direction parallel to a direction of the width of the substrate conveyor, each of the substrate conveyor and the at least one of the upstream and downstream conveyors including (a) a feeding device for feeding the circuit substrate in a second direction perpendicular to the first direction, (b) a pair of guide rails having respective guiding surfaces for guiding opposite side faces of the circuit substrate parallel to the second direction while the circuit substrate is fed by the feeding device, and (c) a width changing device for moving the guide rails relative to each other in the first direction to change a distance between the guiding surfaces, the method comprising:

a first imaging step of operating the moving device to move the image-taking device to a first image-taking position at which an image of a predetermined portion of at least one of the pair of guide rails of the substrate conveyor can be taken by the image-taking device, and operating the image-taking device to take the image of the predetermined portion of the substrate conveyor;

a second imaging step of operating the moving device, after or before the first imaging step, to move the image-taking device to a second image-taking position at which an image of a predetermined portion of at least one of the pair of guide rails of the at least one of the upstream and downstream conveyors can be taken by the image-taking device, and operating the image-taking device to take the image of the predetermined portion of the at least one of the upstream and downstream conveyors; and a width-matching step of matching the widths of the substrate conveyor and the at least one of the upstream and downstream conveyors, on the basis of the images of the predetermined portions of the at least one of the pair of guide rails of the substrate conveyor and the at least one of the upstream and downstream conveyors.

The technical feature according to any one of the above modes (17)–(26) is applicable to the method according to the above mode (27) of this invention.

The description given above with respect to the above mode (26) applies to the upstream and downstream conveyors. The width of the substrate conveyor and the width of each of the above-indicated at least one of the upstream and downstream conveyors may be adjusted to a predetermined value, or to one of the present width values of the substrate conveyor and the at least one of the upstream and downstream conveyors. In the former case, the width of the substrate conveyor and the width of each of the at least one of the upstream and downstream conveyors are changed to the predetermined value and are thus matched with each other. In this case, the width of the substrate conveyor and the width of the at least one of the upstream and downstream conveyors may be changed in a desired order. The width of each conveyor is changed by changing the distance between the guiding surfaces of the guide rails, on the basis of the position of the image of the predetermined portion of at least one of the guide rails taken by the image-taking device, so that the widths of the substrate conveyor and the upstream conveyor and/or the downstream conveyor can be matched with each other. It is possible to initially adjust the widths of the two or more conveyors in question to a value close to the desired value, without taking the images of the predetermined portions of the conveyors, and then finely adjust the widths to the desired value on the basis of the images of the predetermined portions of the conveyors which are taken after the initial adjustment.

Where the widths of the substrate conveyor and at least one of the upstream and downstream conveyors are matched with one of the present widths of the conveyors in question, the width of the downstream conveyor may be adjusted to the present width of the substrate conveyor, or the widths of the downstream conveyor and the substrate conveyor may be adjusted to the present width of the upstream conveyor. Alternatively, the width of the upstream conveyor may be adjusted to the present width of the substrate conveyor, or the widths of the upstream conveyor and the substrate conveyor may be adjusted to the present value of the downstream conveyor.

In any case, the images of the predetermined portions of the substrate conveyor and at least one of the upstream and downstream conveyors are used to check whether the widths of the two or three conveyors in question have been adjusted to the desired value, that is, have been matched with each other. If the widths have not been matched with each other, the direction and the amount of deviation of the once adjusted with or width with respect to the desired value are obtained on the basis of the images taken by the image-taking devices. The present method of matching the widths utilizes the image-taking device provided to take the image of the predetermined part of the circuit substrate, and further utilizes the moving device for moving the image-taking device. Accordingly, the present method permits economical matching adjustment of the conveyor widths.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
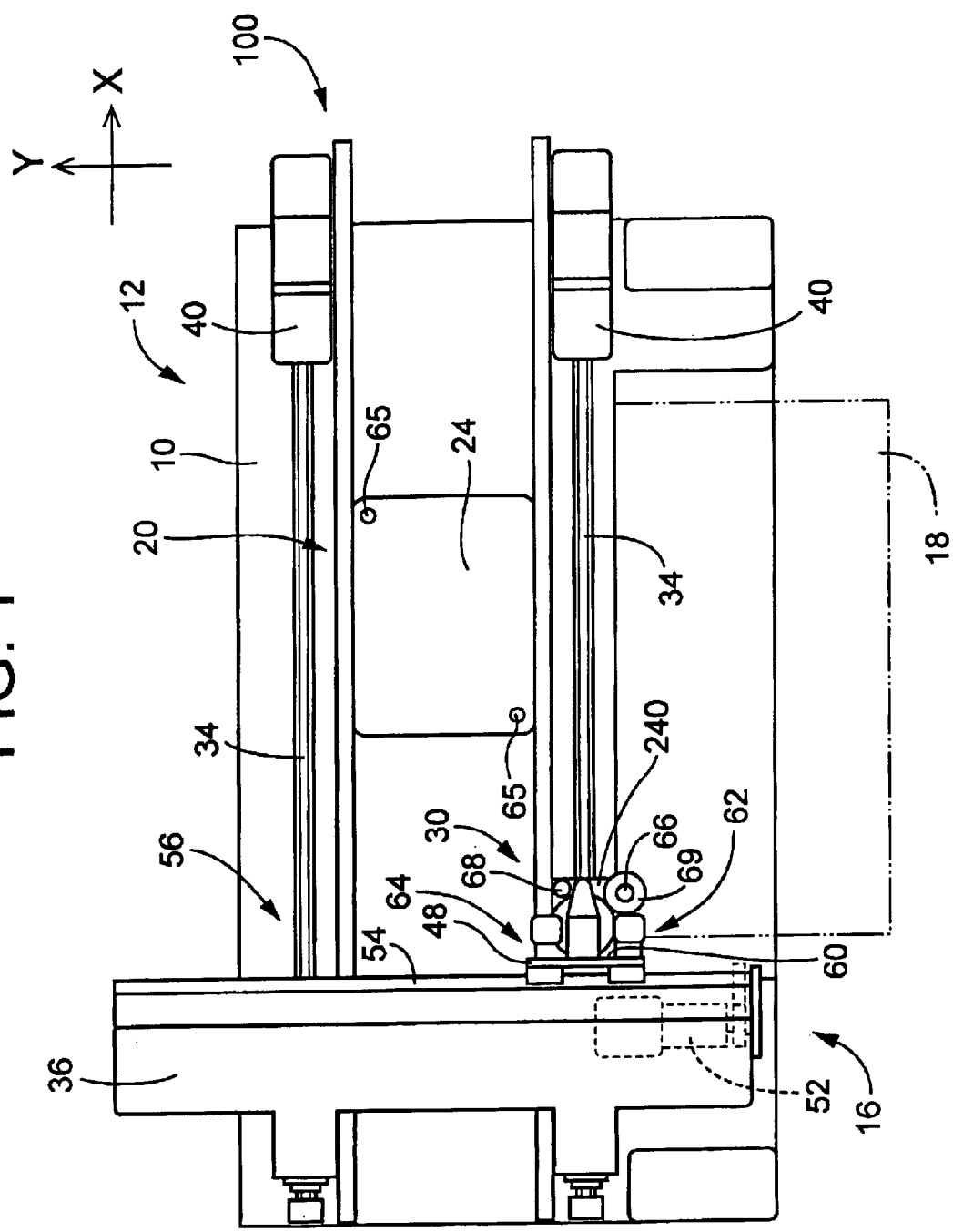
FIG. 1 is a plan view schematically showing an electric-component mounting system including a circuit substrate in the form of a printed-wiring-board conveyor which is constructed according to one embodiment of the present invention and the width of which is changed by a method according to the invention.

Referring first to FIG. 1, reference sign 10 denotes a machine base or frame of an electric-component mounting system 12. On the machine base 10, there are mounted an electric-component mounting device 16, a component supply device 18 and a printed-wiring-board supporting and transferring device 20 (hereinafter referred to as "PWB transferring device 20"), which cooperate with each other to mount electric components (typically, electronic components) on a printed-wiring board. On one side of the PWB transferring deice 20, there is fixedly disposed the component supply device 18. Since the component supply device 18 does not directly relate to the present invention, no further description of this device 18 is deemed necessary to understand the invention.

Figure 2:
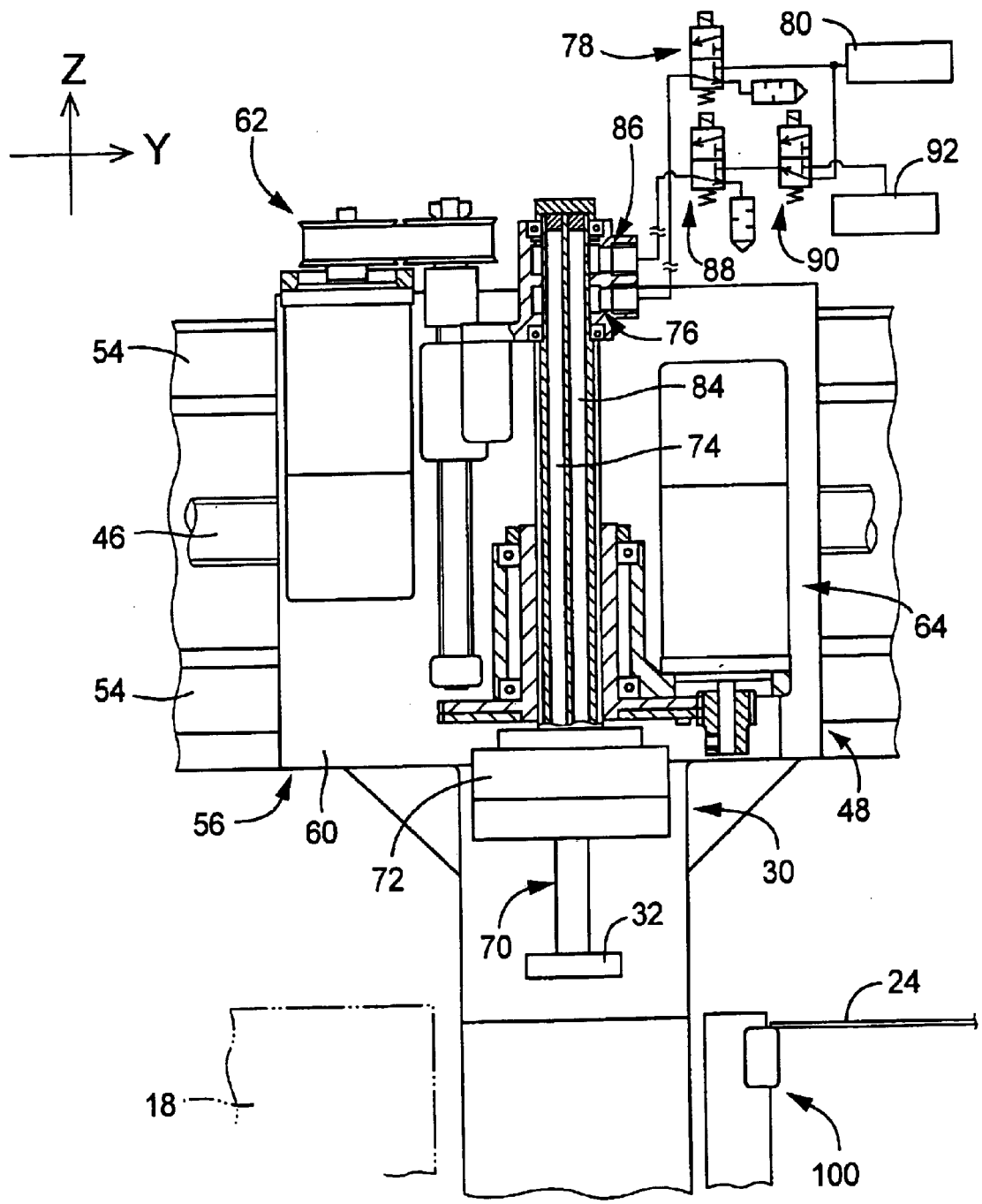
FIG. 2 is a side elevational view (partly in cross section of an electric-component mounting device of the electric-component mounting system of FIG. 1.

The electric-component mounting device 16 will be described first. As shown in FIG. 2, the electric-component mounting device 16 includes a component mounting head 30, which functions as a component holding head or device. The component mounting head 30 is arranged to hold an electric component 32, and is linearly movable, along mutually perpendicular X-axis and Y-axis, to a desired position above a circuit substrate in the form of a printed-wiring board 24, so that the electric component 32 is mounted on the surface of the printed-wiring board 24. In the present embodiment, the printed-wiring board 24 is positioned such that the component-mounting surface of the board 24 on which the electric component 32 is mounted is parallel to an XY plane of an XY coordinate system defined by the X- and Y-axes. In the present embodiment, the printed-wiring board 24 is supported by the PWB transferring device 20 such that the component-mounting surface is parallel to the horizontal direction, so that the XY plane and the X- and Y-axes are parallel to the horizontal direction.

Figure 3:
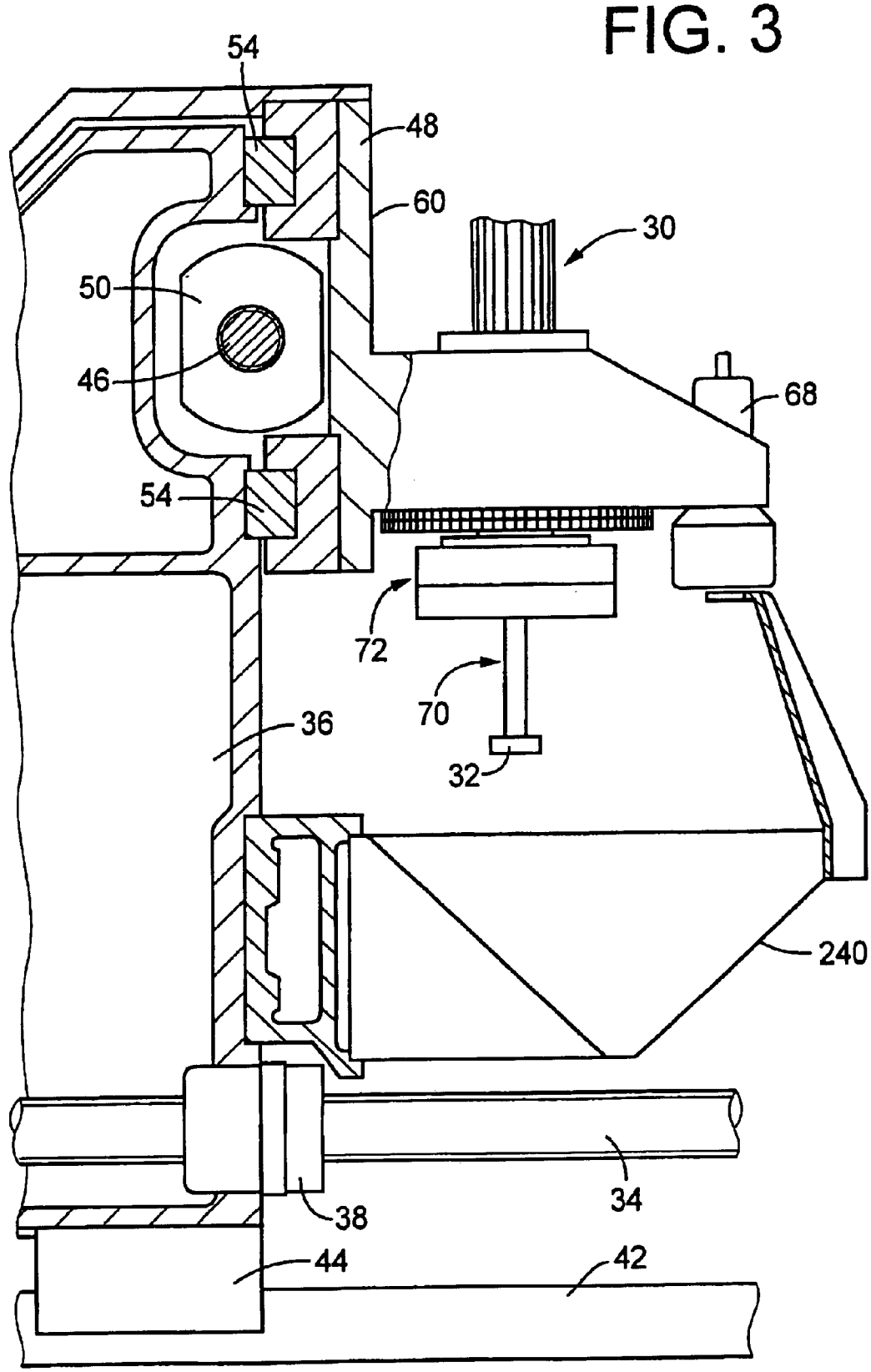
FIG. 3 is a front elevational view (partly in cross section) of the electric-component mounting device of FIG. 2.

As shown in FIG. 1, two feedscrews 34 are disposed on the machine base 10, on the opposite sides of the PWB transferring device 20, such that the two feedscrews 34 are spaced apart from each other in the Y-axis direction and extend in the X-axis direction. These feedscrews 34 are held in meshing engagement with respective nuts 38 (only one of which is shown in FIG. 3) fixed to an X-axis slide 36. These feedscrews 34 are rotated in synchronization with each other by respective X-axis drive motors 40 (FIG. 1), so that the X-axis slide 36 is moved in the X-axis direction. In the present embodiment, the feedscrews 34 and nuts 38 are ballscrews and ballnuts which engage each other via steel balls. Other feedscrews and nuts used in the present electric-component mounting system 12 as described below are also ballscrews and ballnuts. On the machine base 10, there are also disposed two guide members in the form of two guide rails 42 such that the guide rails 42 are located below the respective feedscrews 34, as shown in FIG. 3. The X-axis slide 36 has a guide block 44 at which the slide 36 is slidably supported and moved by the guide rails 42.

On the X-axis slide, there is disposed a feedscrew 46 so as to extend in the Y-axis direction, as shown in FIG. 3. The feedscrew 46 is held in meshing engagement with a nut 50 fixed to a Y-axis slide 48. The feedscrew 46 is rotated by a Y-axis drive motor 52 shown in FIG. 1, so that the Y-axis slide 48 is moved in the Y-axis direction while being guided by a pair of guide rails 54. The nuts 38, feedscrews 34, X-axis slide 36, X-axis drive motor 40, nut 50, feedscrew 46, Y-axis slide 48 and Y-axis drive motor 52 cooperate with each other to constitute an XY robot 56, which functions as a moving device for moving the component mounting head 30 in the XY plane.

As shown in FIGS. 1 and 2, the Y-axis slide 48 has a vertically extending side surface 50 on which is vertically movably mounted the component mounting head 30 such that the component mounting head 30 is rotatable about its axis. On the side surface 50, there are also mounted: an elevator device 62 for vertically moving the component mounting head 30; a rotary drive device 64 for rotating the component mounting head 30 about its axis; an image-taking device in the form of a CCD camera 66 (FIG. 1) for taking images of two fiducial marks 65 (FIG. 1) provided on the printed-wiring board 24; and another image-taking device in the form of a CCD camera (FIG. 3) for taking an image of the electric component 32. In the present embodiment, the two fiducial marks 65 are located at respective two corner portions of the rectangle of the printed-wiring board 24, which are opposed to each other diagonally of the rectangle. However, at least one fiducial mark may be provided on the board 24.

In the present embodiment, the CCD camera 66 includes a lens system and an array of CCD elements (charge-coupled elements), which are not shown. The CCD camera 66 is arranged to take a two-dimensional image of an object at one time. The CCD array consists of a multiplicity of minute light-receiving elements which are arranged in a matrix in a plane and generate electric signals depending upon the amounts of light incident thereupon. The matrix of light-receiving elements defines an imaging area. In FIG. 3, the CCD camera 66 is not shown since this CCD camera 66 is completely superposed on the CCD camera 68, as seen in the plane of FIG. 3. The CCD camera 66 has the same configuration as the CCD camera 68, and is positioned with its optical axis extending in the vertical direction such that the CCD camera 66 faces downwards, like the CCD camera 68.

The CCD camera 66 is moved with the component mounting head 30, when the XY robot 56 is moved along the X- and Y-axes. That is, the CCD camera 66 is movable in the XY plane to a desired position above the component-mounting surface of the printed-wiring board 24. In this embodiment, the XY robot 56 functions as a moving device for moving an image-taking device in the form of the CCD camera 66. On the Y-axis slide 48, there is disposed an illuminating device 69 (FIG. 1) in opposed relationship with the CCD camera 66. The illuminating device 69 is arranged to illuminate the imaging object and its vicinity.

In the present embodiment, the component mounting head 30 includes a component holder in the form of a suction nozzle 70 for holding the electric component 32 by suction under a reduced or negative pressure, and a nozzle holder 72 for removably holding the suction nozzle 70, as shown in FIG. 2. The suction nozzle 70 is held by the nozzle holder 72 by suction. To this end, the nozzle holder 72 is connected to a negative-pressure source 80 and the atmosphere through an air passage 74, a rotary valve 76 and a solenoid-operated directional control valve 78. With a switching action of the directional control valve 78, the nozzle holder 72 is selectively communicated with the negative-pressure source 80 and the atmosphere, for selectively holding and releasing the suction nozzle 70.

On the other hand, the suction nozzle 70 is connected to the negative pressure source 80, a positive-pressure source and the atmosphere through an air passage 84, a rotary valve 86, and solenoid-operated directional control valves 88 and 90. With switching actions of the directional control valves 88, 90, the suction nozzle 70 is selectively communicated with the negative-pressure source 80, the positive-pressure source 82 and the atmosphere, so that the electric component 32 is held by suction by the suction nozzle 70 under a negative pressure, and is released by a positive pressure.

There will next be described the PWB transferring device 20. The PWB transferring device 20 includes a printed-wiring-board conveyor 100 (hereinafter referred to as "PWB conveyor 100"), as sown in FIG. 1, and a printed-wiring-board support device (not shown) disposed at a longitudinally middle portion of the PWB conveyor 100, and a printed-wiring-board clamping device which will described. These PWB conveyor 100, support device and clamping device are arranged in the X-axis direction (in the left and right direction as seen in FIG. 1).

Figure 4:
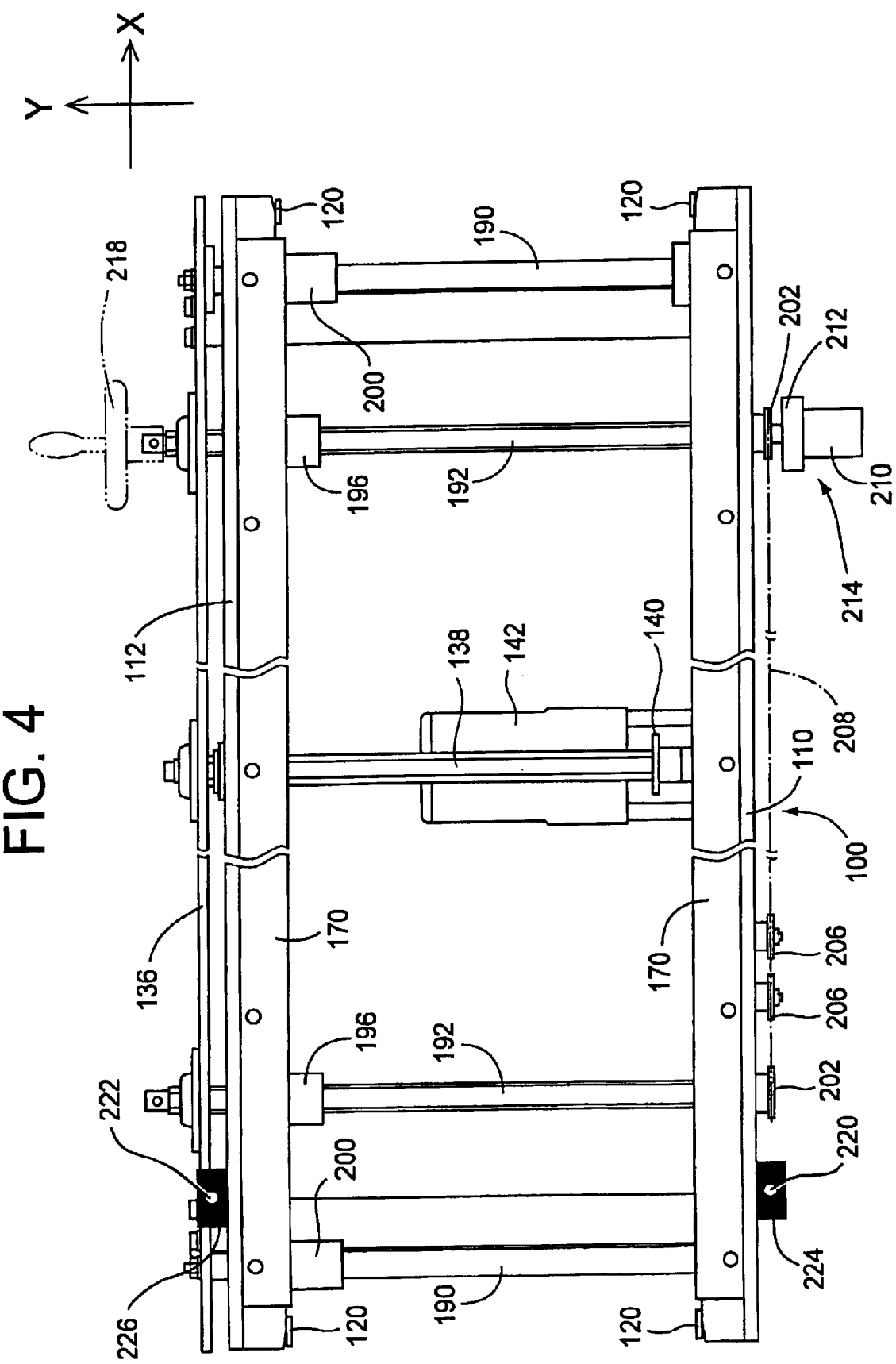
FIG. 4 is a plan view of the printed-wiring-board conveyor shown in FIG. 1.

The PWB conveyor 100 will be described first. As shown in FIG. 4, the PWB conveyor 100 includes a pair of guide rails consisting of a stationary guide rail 110 and a movable guide rail 112. The stationary and movable guide rails 110, 112 are disposed in parallel with the X-axis direction and extend in the horizontal direction. The stationary guide rail 110 is fixedly disposed on the machine base 10, while the movable guide rail 112 is supported movably in the Y-axis direction toward and away from the stationary guide rail 110.

Figure 6:
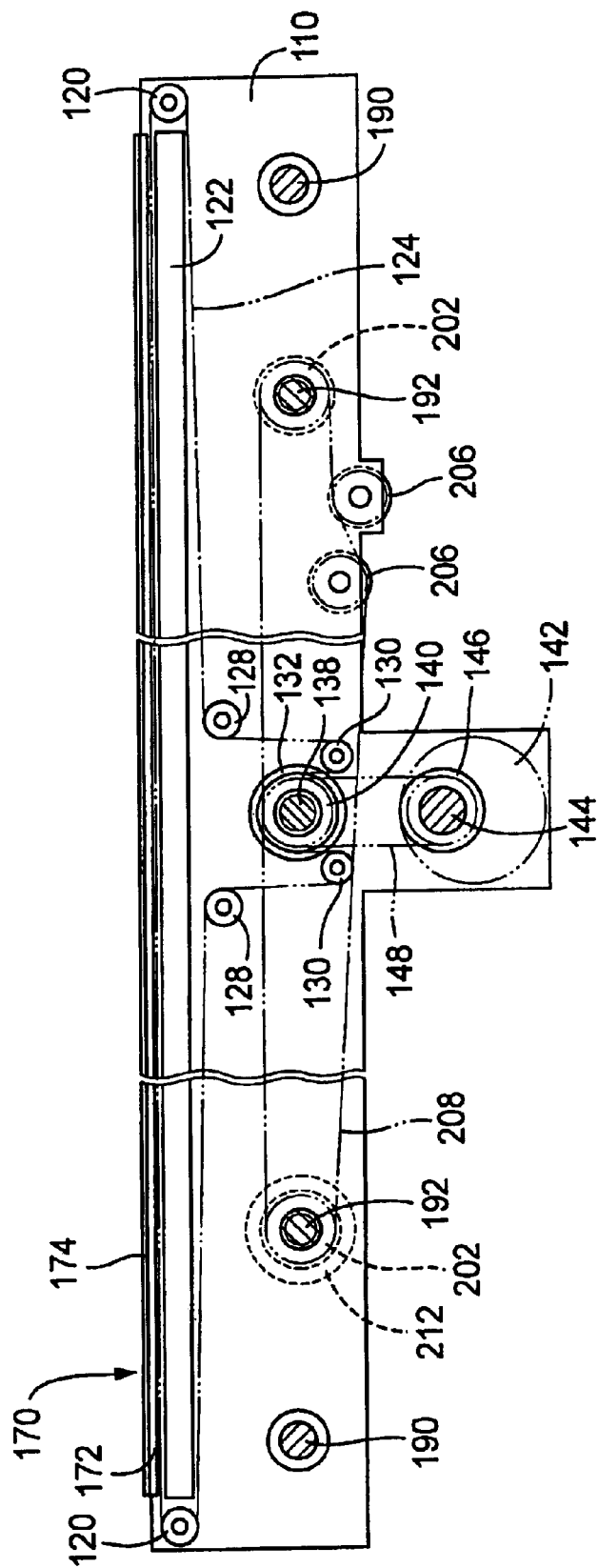
FIG. 6 is a view showing a stationary guide rail of the printed-wiring-board conveyor, as seen from s movable guide rail toward the stationary guide rail.

On the mutually opposed inner surfaces of the stationary and movable guide rails 110, 112, there are rotatably disposed four rotary members in the form of grooved pulleys 120 located at the longitudinally opposite ends of the guide rails 110, 112. Each of the stationary and guide rails 110, 120 has a guide member in the form of a belt guide 122 fixed thereto at a portion thereof between the two grooved pulleys 120 disposed thereon, as shown in FIG. 6 with respect to the stationary guide rail 110, by way of example. A looped member in the form of an endless belt 124 is wound on the two grooved pulleys 120 and the belt guide 122 of each guide rail 110, 112. When the endless belt 124 is rotated, the rotary movement is guided by the belt guide 124. Each of the grooved pulleys 120 has an annular groove formed in an axially middle portion of its outer circumferential surface, while the endless belt 124 has a projection formed in a widthwise middle portion of its inner surface. The projection of the endless belt 124 engages the annular groove of each grooved pulley 120 such that the projection is slidably movable relative to the pulley 120 in the longitudinal direction of the endless belt 124 or in the circumferential direction of the pulley 120. Thus, the endless belt 124 is positioned relative to the grooved pulleys 120 in the width direction of the endless belt 124 (in the axial direction of the pulleys 120). The belt guide 122 also has a straight groove (not shown) in its upper surface, and the projection of the endless belt 124 engages this straight groove, for positioning of the endless belt 124 relative to the belt guide 122 in the width direction of the endless belt 124.

Figure 5:
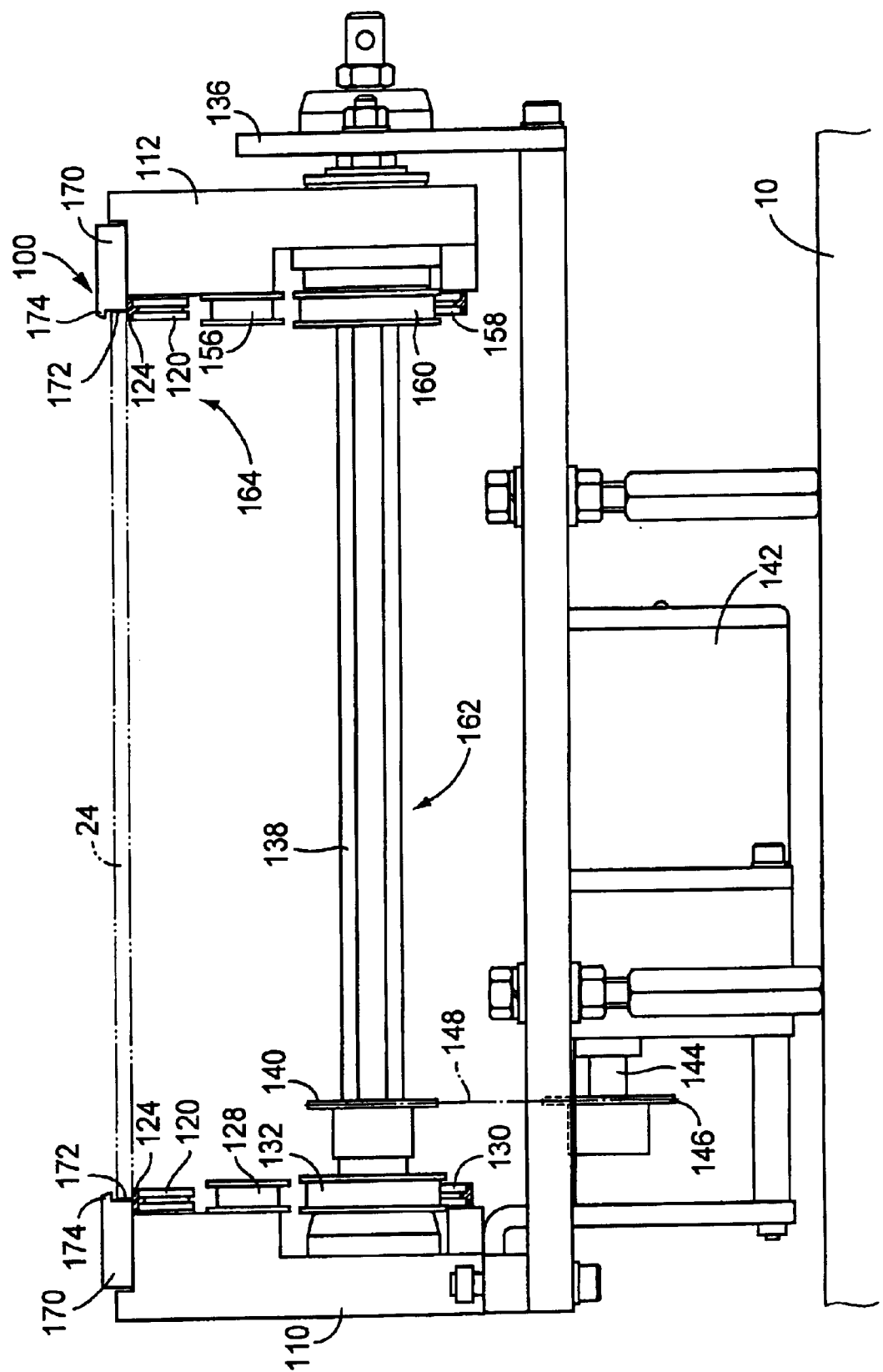
FIG. 5 is a side elevational view of the printed-wiring-board conveyor.

As shown in FIG. 6, the endless belt 124 supported by the stationary guide rail 110 is further wound on a plurality of tensioners in the form of tension pulleys 128, a plurality of idler rotary members in the form of grooved pulleys 130, and a driven rotary member in the form of a driven pulley 132. These tension pulleys 128, grooved pulleys 130 and driven pulley 132 are rotatably attached to the stationary guide rail 110. As shown in FIGS. 4 and 5, the driven pulley 132 is fixed to a rotation-transmitting shaft in the form of a spline shaft 138 which is rotatably supported at its opposite ends by the stationary guide rail 110 and a support member 136. In the present embodiment, the support member 136 is a generally elongate plate member, and is fixedly disposed on the outer side of the movable guide rail 112, that is, on one side of the movable guide rail 112 which is remote from the stationary guide rail 110. The support member 136 is positioned so as to be parallel with the movable guide rail 112. The spline shaft 138 has a sprocket 140 fixed thereto, and is connected through the sprocket 140 to a drive source in the form of a printed-wiring-board feed drive motor 142. This feed drive motor 142 is an electric motor having an output shaft 144 which has a rotary member in the form of a sprocket 146 fixed thereto. The sprocket 140 is connected to the sprocket 146 through a looped member in the form of a chain 148.

As shown in FIG. 5, the endless belt 124 supported by the movable guide rail 112 is wound on a plurality of tensioners in the form of tension pulleys 156, a plurality of idler rotary members in the form of grooved pulleys 158 and a driven rotary member in the form of a driven pulley 160. These pulleys 156, 158, 160 are rotatably attached to the movable guide rail 112. It is noted that only one of the tension pulleys 156 and only one of the grooved pulleys 158 are shown in FIG. 5. The driven pulley 160 is attached to the movable guide rail 112 such that the driven pulley 160 is rotatable relative to the guide rail 112 and is held in meshing engagement with the spline shaft 138 such that the driven pulley 160 is axially movable relative to the spline shaft 138 and is rotated with the spline shaft 138. In this arrangement, a rotary motion of the printed-wiring-board feed drive motor 142 will cause rotary motions of the sprockets 146, 140, and consequently a rotary motion of the spline shaft 138, so that the driven pulleys 132, 160 are rotated to rotate the pair of endless belts 124 in synchronization with each other.

The printed-wiring board 24 is placed at its widthwise opposite end portions on the straight portions of the endless belts 124, and is fed or transferred in the X-axis direction, in the presence of a friction between the board 24 and the endless belts 124, when the endless belts 124 are rotated. Since the endless belts 124 are supported by the horizontally extending stationary and movable guide rails 110, 112, the printed-wiring board 24 placed on the endless belts 124 is kept in its horizontal attitude while the board 24 is moved along the stationary and stationary guide rails 110, 112. In the present embodiment, a belt drive device 162 is constituted by the printed-wiring-board feed drive motor 142, chain 148, sprockets 146, 140, grooved pulleys 120, 130, 158 and driven pulleys 132, 160. This belt drive device 162 cooperates with the endless belts 124 to constitute a feeding device 164 for feeding the printed-wiring board 24.

On the upper surfaces of the stationary and movable guide rails 110, 112, there are fixed respective guide members 170, as shown in FIGS. 4–6. These guide members 170 serve as guide portions of the stationary and movable guide rails 110, 112, which function as guide means for guiding the printed-wiring board 24. Each of the guide members 170 is a elongate plate having substantially the same length as the stationary and movable guide rails 110, 112, and has a vertical guiding surface 172. The two guiding surfaces 172 of the two guide members 170, which are opposed to each other in the width direction of the printed-wiring board 24, function to guide the board 24 at the opposite side faces of the board 24, when the board 24 is fed in the longitudinal direction of the guide rails 110, 112. The two guide members 170 has respective presser portions 174 integrally formed so as to extend in their longitudinal direction. These presser portions 174 function to prevent an upward or floating movement of the printed-wiring board 24 during a movement of the board 24, and to clamp the board 24 during an operation of the component mounting head 30 to mount the electric component 32 on the board 24.

As shown in FIG. 4, a plurality of guiding members in the form of guide rods 190 are fixedly supported at their end portions by the above-indicated stationary guide rail 110 and support member 136, while a plurality of feedscrews 192 are rotatably supported at their end portions by the stationary guide rail 110 and support member 136. The guide rods 190 and feedscrews 192 are disposed in parallel with the Y-axis direction. The feedscrews 192 are held in meshing engagement with respective rail nuts 196 fixed to the movable guide rail 112, while the guide rods 190 are held in engagement with respective guide blocks 200 also fixed to the movable guide rail 112. The guide blocks 200 are slidably movable relative to the guide rods 190 in the axial direction of the guide rods 190. Each of the feedscrews 192 has a rotary member in the form of a sprocket 202 fixed at its end portion extending outwardly from the stationary guide rail 110 in its axial direction away from the movable guide rail 112. The sprockets 202 are rotated with the respective feedscrews 192.

On the outer surface of the stationary guide rail 110, there are mounted a plurality of tension sprockets 206 such that the tension sprockets 206 are rotatable about their axes parallel to the axis of rotation of the sprocket 202. A looped member in the form of a chain 208 is wound on these sprockets 202, 206. One of the two feedscrews 192 is connected to a drive source in the form of a width changing motor 210 through a speed reducing device 212, so that this feedscrew 192 is directly driven by the width changing motor 210. A rotary motion of the width changing motor 210 is also transmitted to the other feedscrew 192 through the sprocket 202 and the chain 208, so that the two feedscrews 192 are rotated in synchronization with each other, to move the movable guide rail 112 toward and away from the stationary guide rail 110 while the parallelism of the movable guide rail 112 to the stationary guide rail 110 is maintained. Thus, a distance between the stationary and movable guide rails 110, 112 can be changed to change the width of the PWB conveyor 100. Although the width changing motor 210 may be an AC motor, the present embodiment uses a DC motor as the width changing motor 210, so that the operating speed of the motor 210 can be reduced by reducing its energizing time. In the present embodiment, the sprockets 202, chain 208, etc. cooperate to constitute a rotation-transmitting device, which cooperates with the feedscrews 192, rail nuts 196, width changing motor 210, etc. to constitute a width changing device 214.

The present embodiment is arranged to permit an operator of the electric-component mounting system 12 to perform an inching operation of the width changing motor 210, for moving the movable guide rail 112. Further, the operator may change the width of the PWB conveyor 100 by manually moving the movable guide rail 112. To this end, a manually operable member in the form of a handwheel 218 may be connected to one end of the feedscrew 192 directly connected to the width changing motor 210, as indicated by two-dot chain line in FIG. 4. The movable guide rail 112 is moved by rotating the handwheel 218.

The stationary and movable guide rails 110, 112 are provided with respective fiducial marks 220, 222, as shown in FIG. 4. In the present embodiment, the fiducial marks 220, 222 are carried by respective mark carriers 224, 226 which are formed separately from and attached to the respective stationary and movable guide rails 110, 112. The mark carriers 224, 226 attached to the guide rails 110, 112 are considered as parts of these guide rails 110, 112.

Described more specifically, each of the mark carriers 224, 226 is fixed to an end portion of the corresponding guide rail 110, 112 which is on the upstream or incoming side of the PWB conveyor 100, as viewed in the direction of movement of the printed-wiring board 24. The fiducial marks 220, 222 are provided on the upper surfaces of the respective mark carriers 224, 226. In the present embodiment, the fiducial marks 220, 222 are circular in shape, and have an optical characteristic different from that of the background, namely, of the areas of the upper surfaces of the mark carriers 224, 226 which areas are not covered by the fiducial marks 220, 222. For instance, the fiducial marks 220, 222 have a brightness or color different from that of the background. In the present embodiment, the fiducial marks 220, 222 are white marks formed on the black upper surfaces of the mark carriers 224, 226. However, the fiducial marks 220, 222 may be black marks formed on the white upper surfaces of the mark carriers 224, 226. In the present embodiment, the fiducial marks 220, 222 are printed directly on the mark carriers 224, 226. However, the fiducial marks 220, 222 may be printed on films, which are bonded to the mark carriers 224, 226. The mark carriers 224, 226 are fixed to the guide rails 110, 112 such that the upper surfaces of the mark carriers 224, 226 have substantially the same height or level as the upper surface of the printed-wiring board 24 placed on the endless belts 124. The two fiducial marks 220, 222 are located at the same position in the X-axis direction in the present embodiment. However, the two fiducial marks 220, 222 may be located at different X-axis positions.

As shown in FIGS. 1 and 3, the X-axis slide 36 carries a prism 240 which is located below the Y-axis slide 48 and between the component supply device 18 and the PWB transferring device 20 in the Y-axis direction. This prism 240 cooperates with the CCD camera 68 to constitute a component imaging system operable to take an image of the electric component 32, as disclosed in JP-B-2824378. In this component imaging system, the CCD camera 68 mounted on the Y-axis slide 48 together with the component mounting head 30 is moved with the component mounting head 30. The prism 240 is arranged such that the CCD camera 69 necessarily passes the prism 240 during a movement of the component mounting head 30 from the component supply device 18 toward the printed-wiring board 24 after the component mounting head 30 has received the electric component 32 from the component supply device 18. Thus, the component imaging system permits the CCD camera 68 to take an image of the electric component 32 without having to stop the movement of the component mounting head 30, and permits the component mounting head 30 to take a shortest path to the printed-wiring board 24. When the electric component 32 is imaged by the CCD camera 68, the electric component 32 is illuminated by a light-emitting body (not shown) accommodated within the suction nozzle 70. With the electric component 32 being illuminated at its upper surface on the side of the light-emitting body, a projection or silhouette image of the electric component 32 is taken by the CCD camera 68 through the prism 240. The light-emitting body serves as an illuminating device for the electric component 32. A normal image of the electric component 32 may be taken by illuminating the lower surface of the electric component with upper and lower front lights disposed on the upper and lower sides of the prism 240.

Figure 7:
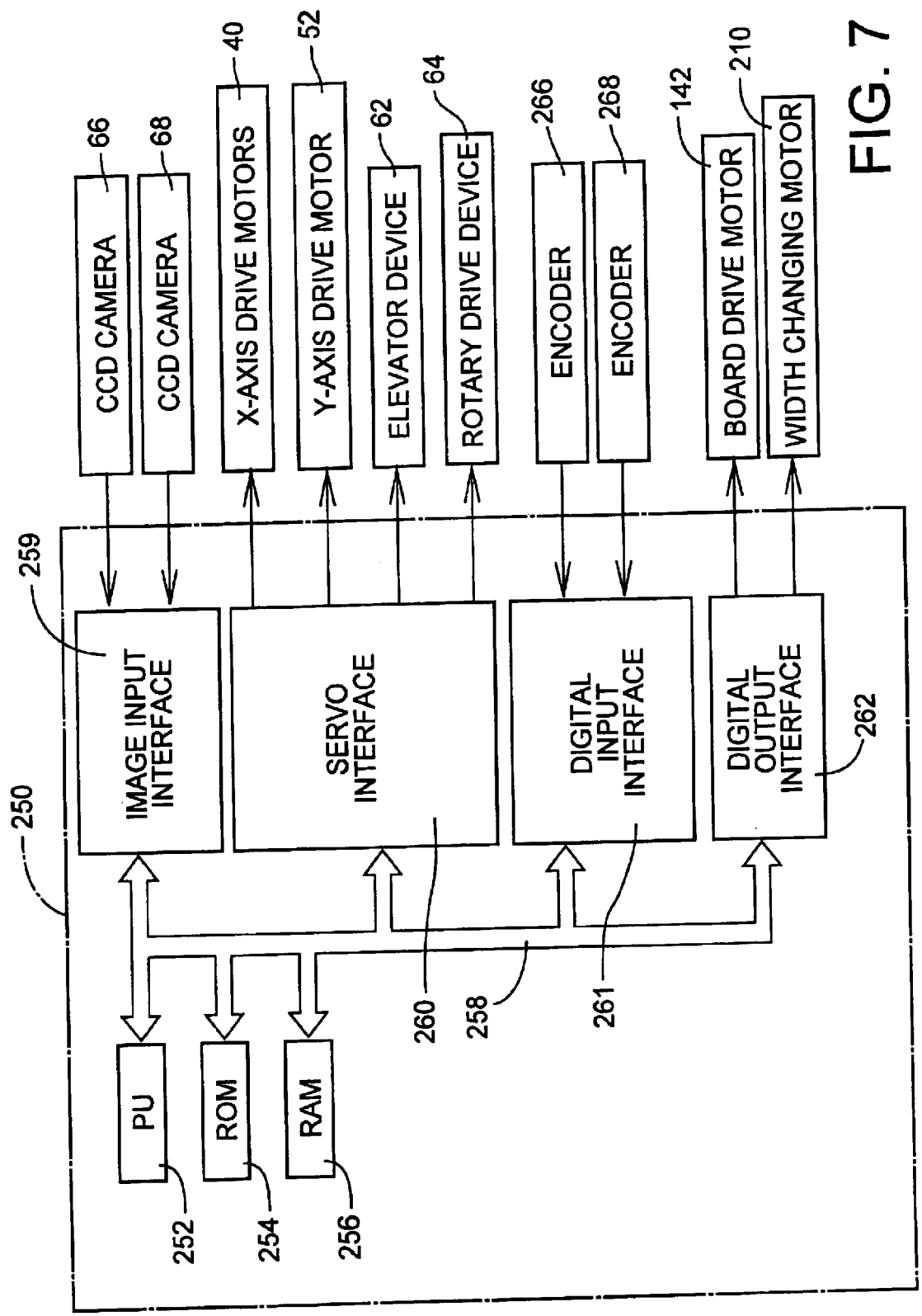
FIG. 7 is a block diagram schematically showing a control device of the electric-component mounting system for controlling its operation.

The present electric-component mounting system 12 includes a control device 250 for controlling the various components of the system, as indicated in FIG. 7. The control device 250 is principally constituted by a computer incorporating a processing unit (PU) 252, a read-only memory (ROM) 254, a random-access memory (RAM) 256 and a bus 258 interconnecting those devices 252–256. The bus 258 is connected to an image input interface 259 to which the above-indicated CCD cameras 66, 68 are connected. The operations of the CCD cameras 66, 68 are controlled by the control device 250, but this control is not indicated in the block diagram of FIG. 7. The bus 258 is also connected to a servo interface 260 to which are connected various actuators such as the X-axis drive motor 40, Y-axis drive motor 52, elevator device 62 and rotary drive device 64. These motors 40, 52, and the drive sources of the elevator device 62 and rotary drive device 64 are electric motors, more specifically, servomotors whose operating angles can be accurately controlled. However, stepping motors may be used in place of the servomotors.

The bus 258 is further connected to a digital input interface 261 to which encoders 266, 268 are connected. The encoders 266, 268 are rotary encoders for detecting the rotating angles of the X-axis and Y-axis drive motors 40, 52. The bus 258 is also connected to a digital output interface 262 to which are connected the printed-wiring-board feed drive motor 142 and the width changing motor 210.

Figure 8:
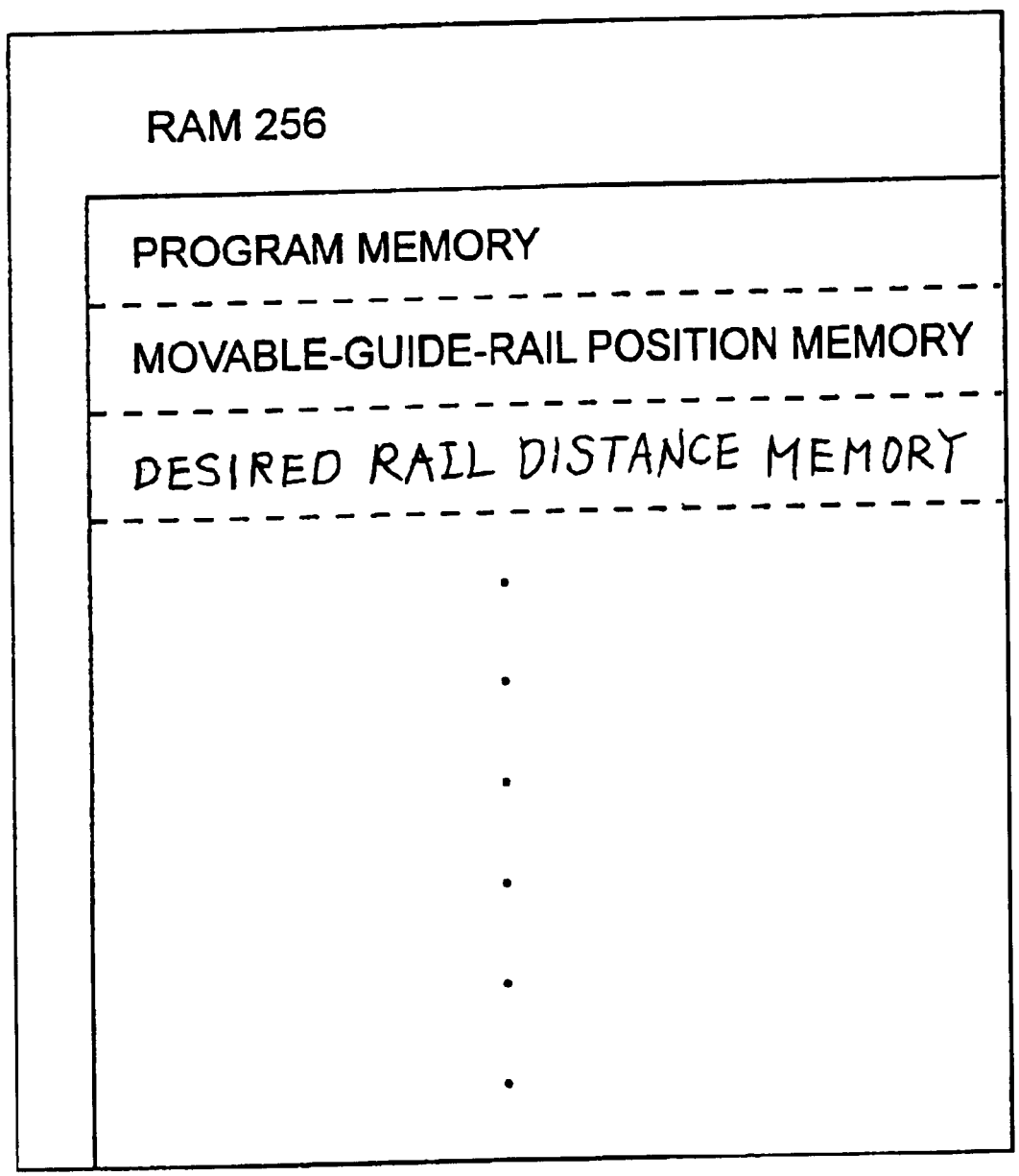
FIG. 8 is a block diagram schematically showing an arrangement of a RAM of a computer which constitutes a major portion of the control device of FIG. 7.

As indicated in FIG. 8, the RAM 256 has a program memory as well as working memories. The program memory stores control programs for a main control routine, and various other control programs such as a program for a conveyor-width changing routine illustrated in the flow chart of FIG. 9.

The working memories of the RAM 256 include a MOVABLE-GUIDE-RAIL POSITION memory stores position data indicative of the position of the movable guide rail 112 in the Y-axis direction in which the movable guide rail 112 is moved toward and away from the stationary guide rail 110, for changing the width of the PWB conveyor 100. When the width changing motor 210 is operated by an inching operation by the operator, the position of the movable guide rail 112 is obtained on the basis of the operating direction of the motor 210, and the total operating angle of the motor 210 which is calculated from the number of inching actions and the operating angle per each inching action. The position data stored in the MOVABLE-GUIDE-RAIL POSITION memory are updated depending upon the position of the movable guide rail 112. Thus, the position data represents the actual position of the movable guide rail 112 in the Y-axis direction. When the width of the PWB conveyor 100 is changed by a manual operation of the handwheel 182 to rotate the feedscrew 192, the position data stored in the MOVABLE-GUIDE-RAIL POSITION memory are not updated and do not represent the actual position of the movable guide rail 112.

When the electric-component mounting system 12 constructed as described above is operated to mount the electric component 32 on the printed-wiring board 24, the PWB conveyor 100 is operated to load the printed-wiring board 24 onto the printed-wiring-board support device (not shown). The printed-wiring board 24 is located at a predetermined component-mounting position, by a positioning device (not shown), and supported at its lower surface by the printed-wiring board support device. The printed-wiring board support device has a support portion arranged to push up the printed-wiring board 24 at its widthwise opposite end portions (parallel to the X-axis direction), away from the pair of endless belts 124, for forcing the board 24 against the presser portions 174 of the guide members 170 fixed to the stationary and movable guide rails 110, 112, whereby the board 24 is clamped in place. The support portion of the printed-wiring-board support device and the presser portions 170 cooperate to constitute the printed-wiring-board clamping device.

With the board 24 thus positioned and clamped, the CCD camera 66 is moved by the XY robot 56, to take images of the two fiducial marks 65 provided on the board 24. Image data representative of the images are processed by the control device 250, to detect the position of the board 24, for thereby obtaining X-axis and Y-axis errors of a multiplicity of component-mounting positions on the board 24. Then, the component mounting head 30 is moved by the XY robot 56 toward the component supply device 18 to receive the electric component 32 from the component supply device 18, and is then moved toward the printed-wiring board 24. During the movement of the component mounting head 30 toward the board 24, the image of the electric component 32 is taken by the CCD camera 68, and image data representative of the image of the electric component 32 are processed by the control device 250, to detect positioning errors (center position error and angular positioning error) of the electric component 32 as held by the suction nozzle 70. The electric component 32 is mounted on the board 24 after the position of the axis and the angular position of the suction nozzle 70 are compensated for the positioning errors of the electric component 32, and for the already obtained X-axis and Y-axis errors of the component-mounting positions on the board 24.

The distance between the stationary and movable guide rails 110, 112, that is, the width of the PWB conveyor 100 is changed depending upon a specific kind of the printed-wiring board 24, more precisely, depending upon a specific width of the board 24 as measured in the Y-axis direction (which is perpendicular to the X-axis direction in which the board 24 is fed). An operation to change the width of the PWB conveyor 100 will be briefly described. Initially, the images of the fiducial marks 220, 222 provided on the stationary and movable guider ails 110, 112 are taken by the CCD camera 66, and image data representative of the images are processed by the control device 250, to detect the Y-axis positions of the stationary and movable guide rails 110, 112. The CCD camera 66 can be moved by the XY robot 56 to the desired positions with high accuracy, since the XY robot 56 are moved by the X-axis and Y-axis drive motors 40, 52, which are servomotors. Further, the position of the CCD camera 66 (XY robot 56) can be accurately detected on the basis of the output signals of the encoders 266, 268. Accordingly, the positions of the stationary and movable guide rails 110, 112 can be accurately detected on the basis of the position of the CCD camera 66 and the positions of the images of the fiducial marks 220, 222 within the imaging area of the CCD camera 66.

The working memories of the RAM 56 also include a CONVEYOR WIDTH memory which stores width conveyor width data indicative of the width values of different kinds of printed-wiring board 24. The Y-axis position to which the movable guide rail 112 is moved to change the width of the PWB conveyor 100 is obtained on the basis of the detected positions of the stationary and movable guide rails 110, 112 and the width value of the board 24 in question. The width changing device 214 is operated to move the movable guide rail 112 to the obtained Y-axis position. At this time, the CCD camera 66 is moved so as to follow or trace the movement of the movable guide rail 112.

In the present embodiment, the position of the CCD camera 66 is represented by the position of its optical axis, and the position of the movable guider rail 112 is represented by the position of the fiducial mark 222. When the image of the fiducial mark 222 is taken by the CCD camera 66, the position of the optical axis of the CCD camera 66 is aligned with the Y-axis position of the movable guide rail 112, where the image of the fiducial mark 222 is centered in the imaging area of the CCD camera 66. In this case, the CCD camera 66 is moved to follow the movement of the movable guide rail 112, such that the image of the fiducial mark 222 is kept located in a central portion of the imaging area.

When the movable guide rail 112 has been moved to a position close to the desired Y-axis position, the movement of the guide rail 112 is slowed down, so that the speed of movement of the CCD camera 66 is made higher than that of the guide rail 112. As a result, the CCD camera 66 reaches the desired Y-axis position before the movable guide rail 112. The CCD camera 66 stopped at this Y-axis position initiates an imaging operation to take the image of the fiducial mark 222, while the movable guide rail 112 is still moving toward the desired Y-axis position. When the image of the fiducial mark 222 taken by the CCD camera 66 is aligned with the center of the imaging area, it indicates that the movable guide rail 112 has reached the desired Y-axis position. Accordingly, the movement of the guide rail 112 is terminated. The operating speed of the width changing motor 210 used as the drive source of the width changing device 214 to move the movable guide rail 112 can be controlled, but the operating amount of this motor 210 cannot be controlled. However, the movable guide rail 112 can be accurately located at the desired Y-axis position by turning off the motor 210 when the image of the fiducial mark 222 has been centered in the imaging area of the CCD camera 66.

Figure 9:
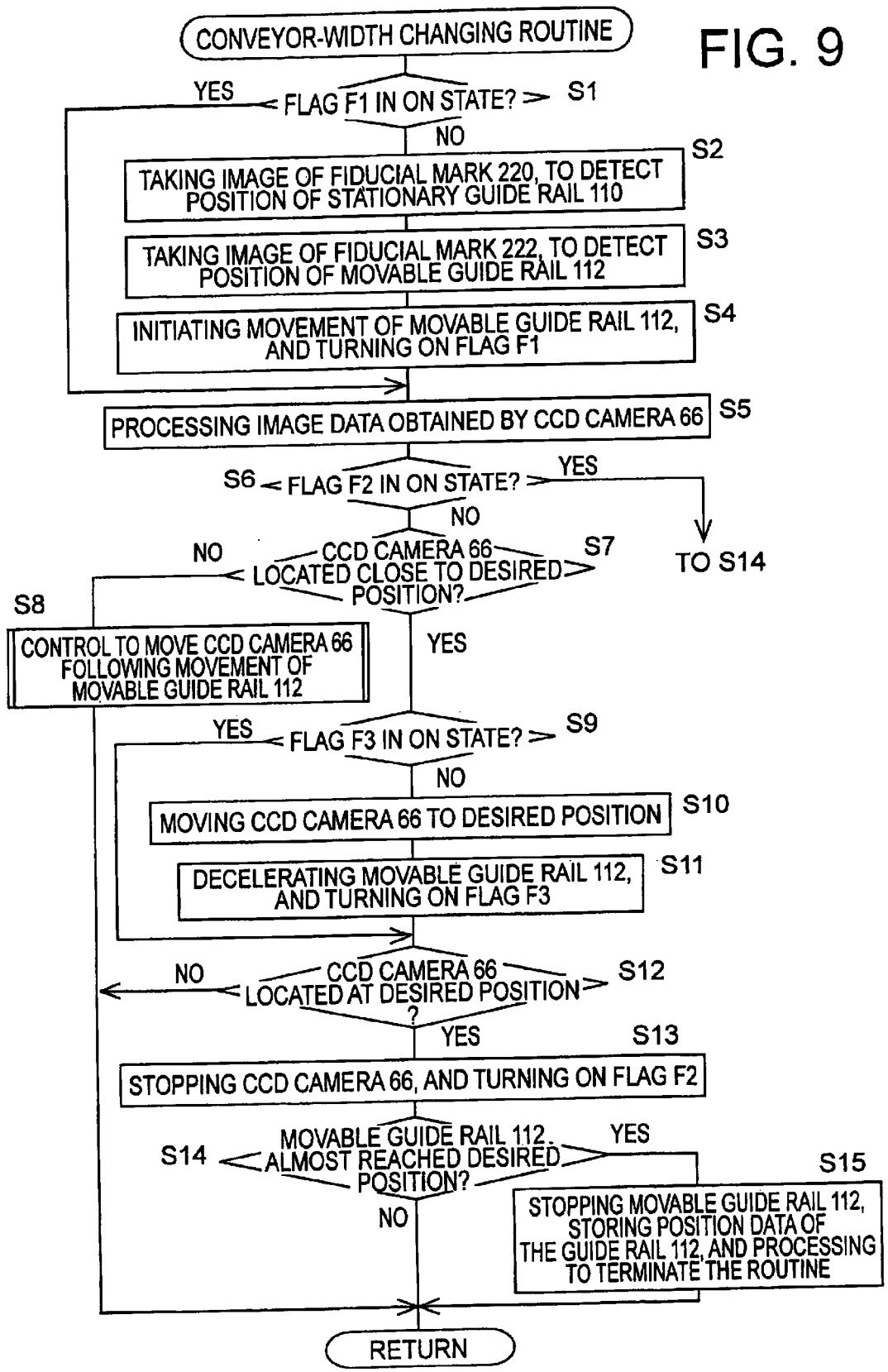
FIG. 9 is a flow chart illustrating a conveyor-width changing routine executed according to a control program stored in a RAM of the computer.

There will be described the conveyor-width changing routine, by reference to the flow chart of FIG. 9. This routine is initiated with step S1 to determine whether a flag F1 is placed in an ON state. The flag F1 is provided in the RAM 256. The flag F1 placed in the ON state indicates that the positions of the stationary and guide rails 110, 112 have been detected, and the movement of the movable guide rail 112 to change the width of the PWB conveyor 100 has been initiated.

Since the flag F1 is reset to an OFF state upon initialization in the main control routine, a negative decision (NO) is initially obtained in step S1, so that the control flow goes to step S2 in which the position of the stationary guide rail 110 is detected on the basis of the center position of the image of the fiducial mark 220 taken by the CCD camera 66. The position of the fiducial mark 220 can be detected on the basis of the position of the image of the fiducial mark 220 in the imaging area and the position of the CCD camera 66, and the position of the stationary guide rail 110 can be determined by the position of the fiducial mark 220.

To take the image of the fiducial mark 220, the CCD camera 66 is moved to a known nominal position of the stationary guide rail 110. The image data of the fiducial mark 220 taken by the CCD camera 66 are processed to obtain the position of the stationary guide rail 110. The processing of the image data is effected by a pattern matching technique as disclosed in JP-A-8-180191. The stationary guide rail 110, which is fixed in position, is theoretically located at its nominal position, but the actual position may deviate from the nominal position due to errors in the manufacture of the electric-component mounting system 12. In this respect, the actual position of the stationary guide rail 110 is obtained on the basis of the image of the fiducial mark 220. The positions of the stationary guide rail 110 in the X-axis and Y-axis directions can be obtained from the X-axis and Y-axis positions of the image of the fiducial mark 220. A deviation of the actual of the stationary guide rail 110 from the nominal position in the longitudinal or X-axis direction has substantially no influence on the width of the PWB conveyor 100 in the Y-axis direction. Since only the position of the stationary guide rail 110 in the width or Y-axis direction is required for changing the width of the PWB conveyor 100, only the Y-axis position of the stationary guide rail 110 may be obtained on the basis of the image of the fiducial mark 220. However, both of the X-axis and Y-axis positions of the stationary guide rails 110 may be obtained. Step S2 is a step of detecting the position of the stationary guide rail 110.

Then, the control flow goes to step S3 to detect the position of the movable guide rail 112 on the basis of the center position of the image of the fiducial mark 222 taken by the CCD camera 66. Both of the X-axis and Y-axis positions of the movable guide rail 112 or only the Y-axis position of this guide rail 112 may be detected. The Y-axis position of the movable guide rail 112 is represented by the position data which was stored in the MOVABLE-GUIDE-RAIL POSITION memory of the RAM 256, in the last operation to change or establish the width of the PWB conveyor 100. To take the image of the fiducial mark 222, the CCD camera 66 is moved to the Y-axis position represented by the stored position data. When the electric-component mounting system 12 is initially turned on, position data representative of the width of the PWB conveyor 100 for the first printed-wiring board 24 on which the electric component 32 is mounted are stored in the MOVABLE-GUIDE-RAIL POSITION memory of the RAM 256. Alternatively, position data representative of a predetermined initial Y-axis position of the movable guide rail 112 may be stored in the MOVABLE-GUIDE-RAIL POSITION memory. If the movable guide rail 112 is not moved by the operator using the handwheel 218 after the last operation to establish the width of the PWB conveyor 100, the movable guide rail 112 is located at the Y-axis position represented by the position data stored in the MOVABLE-GUIDE-RAIL POSITION memory of the RAM 256. In this case, the CCD camera 66 can be moved on the basis of the stored position data, to take the image of the fiducial mark 222 on which it is possible to check if the actual Y-axis position of the movable guide rail 112 coincides with the position represented by the stored position data.

If the movable guide 112 is moved by the operator with the handwheel 218 after the last operation to establish the width of the PWB conveyor 100, the actual Y-axis position of the movable guide rail 112 is different from the position represented by the stored position data. If the difference between the actual position and the position represented by the stored position data is so small as to permit the CCD camera 66 to take the image of the fiducial mark 222 within the imaging area, the image is taken by the COD camera 66 without a movement of the CCD camera 66 in the Y-axis direction. If the difference is too large to permit the CCD camera 66 to take the image of the fiducial mark 222 within the imaging area, the image is not taken at the present position of the CCD camera 66.

In this case, the CCD camera 66 is moved in the Y-axis direction over a predetermined search range to detect the fiducial mark 222. In this embodiment, this predetermined search range in the Y-axis direction is slightly broader than a predetermined range of the operating stroke of the movable guide rails 112.

For instance, the CCD camera 66 is initially moved to one end of the predetermined search range, and is then intermittently moved toward the other end, by a predetermined incremental distance for each of the intermittent movements. The CCD camera 66 is operated to try to take the image of the fiducial mark 222 each time the CCD camera 66 has been intermittently moved. The distance of the intermittent movements is slightly shorter than the Y-axis dimension of the imaging area of the CCD camera 66. The image of the fiducial mark 222 can be eventually taken by the CCD camera 66, and the position of the movable guide rail 112 is detected on the basis of the position of the CCD camera 66 and the position of the image of the fiducial mark 222 within the imaging area. Usually, the position of the movable guide rail 112 is not known upon initiation of operations to mount the electric components 32 on the first printed-wiring board 24. Therefore, a movement of the CCD camera 66 according to the position data indicative of the initial position stored in the MOVABLE-GUIDE-RAIL POSITION memory does not permit the CCD camera 66 to take the image of the fiducial mark 222 on the moved movable guide rail 112. In this case, the CCD camera 66 is moved in the Y-axis direction over the predetermined search range, to search the fiducial mark 222 for detecting the position of the movable guide rail 112. The operation to move the CCD camera 66 on the basis of the position data stored in the MOVABLE-GUIDE-RAIL POSITION memory is a step of positioning the image-taking device, and the operation to detect the position of the movable guide rail 112 is a step of detecting the position of the movable guide rail 112, while the operation to search the fiducial mark 222 is a step of searching the movable guide rail 112.

After the position of the movable guide rail 112 is detected, the control flow goes to step S4 in which the width changing motor 210 is started to initiate a movement of the movable guide rail 112 toward the desired Y-axis position, and the flag F1 is turned ON. The movable guide rail 112 is moved at a predetermined speed. The desired Y-axis position of the movable guide rail 112 is determined by the position of the stationary guide rail 110 and the width of the PWB conveyor 100 which corresponds to the width of the printed-wiring board 24 on which the electric component 32 will be mounted. At the desired Y-axis position, the distances between the guiding surfaces 172 of the stationary and movable guide rails 110, 112 are such that the printed-wiring board 24 can be fed in the X-axis direction while the board 24 are guided by the guiding surfaces 172 but are prevented from moving in the Y-axis direction (in the direction of which of the PWB conveyor 100). The width of the PWB conveyor 100 is defined by the distance between the fiducial marks 220, 222 on the stationary and movable guide rails 110, 112. The width value of the PWB conveyor 100 is represented by the conveyor width data stored in the CONVEYOR WIDTH memory of the RAM 256. The conveyor width data representative of the width values of the PWB conveyors 100 which correspond to the respective different kinds of printed-wiring board 24 are stored in the CONVEYOR WIDTH memory, in relation to the respective kinds of the board 24. An appropriate one of the width values is read depending upon the specific kind of the board 24 in question. The direction and distance of movement of the movable guide rail 112 are obtained on the basis of the position detected in step S3 and the desired Y-axis position, and the width changing motor 210 is operated to initiate the movement of the movable guide rail 112 toward the desired Y-axis position.

Then, step S5 is implemented to process the image data obtained by the CCD camera 66. Step S5 is implemented each time the width changing routine of FIG. 9 is executed with a predetermined cycle time.

Step S5 is followed by step S6 to determine whether a flag F2 is placed in an ON state. The flag F2 placed in the ON state indicates that the CCD camera 66 has been moved to the desired Y-axis position. Since the flag F2 is reset to an OFF state upon initialization in the main control routine, a negative decision (NO) is initially obtained in step S6, and the control flow goes to step S7 o determine whether the CCD camera 66 has been moved to a position close to the desired Y-axis position. This determination is effected by determining whether a distance between the Y-axis position of the CCD camera 66 and the desired Y-axis position in the Y-axis direction has become equal to or shorter than a predetermined value. The X-axis and Y-axis positions of the CCD camera 66 can be detected by the output signals of the encoders 266, 268. A negative decision (NO) is initially obtained in step S7, and the control flow goes to step S8 to effect a control of the movement of the CCD camera 66 so as to trace or follow the movement of the movable guide rail 112.

In step S8, the movement of the CCD camera 66 is controlled so as to follow the movement of the movable guide, such that the center position of the image of the fiducial mark 222 is kept in alignment with the center of the imaging area of the CCD camera 66. This alignment of the imaging area of the CCD camera 66 and the image taken by the CCD camera 66 indicates that the CCD camera 66 is moved together with the movable guide rail 112. In view of this fact, a deviation of the center position of the image of the fiducial mark 222 with respect to the center of the imaging area of the CCD camera 66 is obtained, and the CCD camera 66 is moved by the XY robot 56 so as to zero the deviation. Normally, the CCD camera 66 is moved at substantially the same speed as the movable guide rail 112, but with a slight delay of the movement of the CCD camera 66 with respect to the movement of the movable guide rail 112. Before the movement of the movable guide rail 112 is initiated, the CCD camera 66 is located at the detected position of the movable guide rail 112.

When step S1 is implemented after the Flag F1 is placed in the ON state, an affirmative decision (YES) is obtained in step S1, and the control flow goes to steps S5–S8 while skipping steps S2–S4. Steps S1 and S5–S8 are repeatedly implemented until the CCD camera 66 has been moved close to the desired Y-axis position. When an affirmative decision (YES) is obtained in step S7, the control flow goes to step S9 to determine whether a flag F3 is placed in an ON state. The flag F3 placed in the ON state indicates that the CCD camera 66 has been moved close to the desired Y-axis position. Since the flag F3 is also reset to an OFF state upon initialization of the main control routine, a negative decision (NO) is obtained in step S9, and the control flow goes to step S10 in which the CCD camera 66 is further moved to the desired Y-axis position. Step S10 is followed by step S11 to decelerate the movable guide rail 112 and turn ON the flag F3. Accordingly, the movable guide rail 112 is moved at a lower speed toward the desired Y-axis position. On the other hand, the CCD camera 66 is moved at the same speed as before, that is, at a speed higher than that of the movable guide rail 112, so that the CCD camera 66 reaches the desired Y-axis position before the movable guide rail 112.

The control flow then goes to step S12 to determine whether the CCD camera 66 has reached the desired Y-axis position. Initially, a negative decision (NO) is obtained in step S12, and one cycle of execution of the conveyor width changing routine of FIG. 9 is terminated. Since the CCD camera 66 is moved by the XY robot 56 moved by the servomotors 40, 52, the position and speed of movement of the CCD camera 66 can be accurately controlled. Further, the CCD camera 66 is also decelerated after it has been moved close to the desired Y-axis position, so that the CCD camera 66 reaches the desired Y-axis position at a sufficiently low speed. Steps S1, S5–S7, S9 and S12 are repeatedly implemented until the CCD camera 66 has reached the desired Y-axis position.

When the CCD camera 66 has reached the desired Y-axis position, an affirmative decision (YES) is obtained in step S12, and the control flow goes to step S13 to stop the movement of the CCD camera 66, and turn ON the flag F2. Step S13 is followed by step S14 to determine whether the movable guide rail 112 has almost reached the desired Y-axis position, that is, has been moved to a position a predetermined short distance apart from the desired Y-axis direction in the direction away from the stationary guide rail 110 toward the movable guide rail 112. The predetermined distance is determined so that the movable guide rail 112 is stopped at the desired Y-axis position by commanding the width changing motor 210 to be turned off at the position close to the desired Y-axis position. Since the movable guide rail 112 has been decelerated when it has reached the position close to the desired Y-axis position, the movable guide rail 112 can be stopped exactly at the desired Y-axis position by turning off the width changing motor 210 at the position close to the desired Y-axis position, if the above-indicated distance is suitably determined. As discussed above, the alignment of the position of the image of the fiducial mark 222 with the center of the imaging area of the CCD camera 66 in the Y-axis direction indicates that the movable guide rail 112 is located at the desired Y-axis position. In view of the movement of the movable guide rail 112 by the above-indicated distance even after the width changing motor 210 is turned off, step S14 is formulated to determine whether the position of the image of the fiducial mark 222 has reached a position which is the above-indicated distance apart from the center of the imaging area of the CCD camera 66 in the Y-axis direction away from the stationary guide rail 110.

When step S14 is implemented for the first time, a negative decision (NO) is obtained in step S14, and one cycle of execution of the present routine is terminated. Steps S1, S5, S6 and S14 are repeatedly implemented until the movable guide rail 112 reaches the position close to the desired Y-axis position. When an affirmative decision (YES) is obtained in step S14, the control flow goes to step S15 to turn off the width changing motor 210 to stop the movement of the movable guide rail 112, and to store, in the MOVABLE-GUIDE-RAIL POSITION memory of the RAM 256, the position data representative of the position of the movable guide rail 112, that is, the desired Y-axis position. Step S15 is further arranged to reset the flags F1–F3 to the OFF state, and effect other processing operations to terminate the execution of the present conveyor width changing routine of FIG. 9. This routine is not executed until the width of the PWB conveyor 100 is changed again. The operation to control the width changing device 214 for moving the CCD camera 66 to the desired Y-axis position, following the movement of the movable guide rail 112, is a step of controlling the width changing device 214 to establish the desired width of the PWB conveyor 100. This step includes a step of moving the CCD camera 66 so as to follow or trace the movement of the movable guide rail 112, and a step of decelerating the movable guide rail 112.

Although the operating amount of the width changing motor 210 used to move the movable guide rail 112 cannot be controlled, the position of the movable guide rail 112 can be controlled on the basis of the image of the fiducial mark 222 taken by the CCD camera 66 which is moved so as to follow the movement of the movable guide rail 112 and which is provided to take the images of the fiducial marks 65 on the printed-wiring board 24. Accordingly, the width of the PWB conveyor 100 can be changed with high accuracy, without an increase of the cost of manufacture of the variable-width PWB conveyor 100.

It will be understood from the foregoing description of the first embodiment that a portion of the control device 250 assigned to process image data obtained by the CCD camera 66 constitutes an image processing device, while a portion of the control device 250 assigned to implement steps S11, S14 and S15 constitutes a control device to control the width changing device 214. It will also be understood that a portion of the control device assigned to implement step S8 constitutes a tracing control portion to move the CCD camera 66 following the movable guide rail 112, while a portion of the control device 250 assigned to implement step S11 a deceleration control portion to decelerate the movable guide rail 112.

In the first embodiment described above, the CCD camera 66 is moved so as to follow the movement of the movable guide rail 112, and the guide rail 112 is moved to the desired Y-axis position on the basis of the image of the fiducial mark 222 taken by the CCD camera 66. However, the CCD camera 66 may be moved from the present Y-axis position to the desired Y-axis position at a higher speed than the movable guide rail 112, so that the CCD camera 66 reaches the desired Y-axis position before the movable guide rail 112. The CCD camera 66 located at the desired Y-axis position waits for the subsequent movement of the movable guide rail 112 toward the desired Y-axis position, to stop the movable guide rail 112 on the basis of the image of the fiducial mark 222 taken by the CCD camera 66. This modified arrangement will be described as a second embodiment of this invention, by reference to the flow chart of FIG. 10 illustrating a conveyor width changing routine in the second embodiment.

Figure 10:
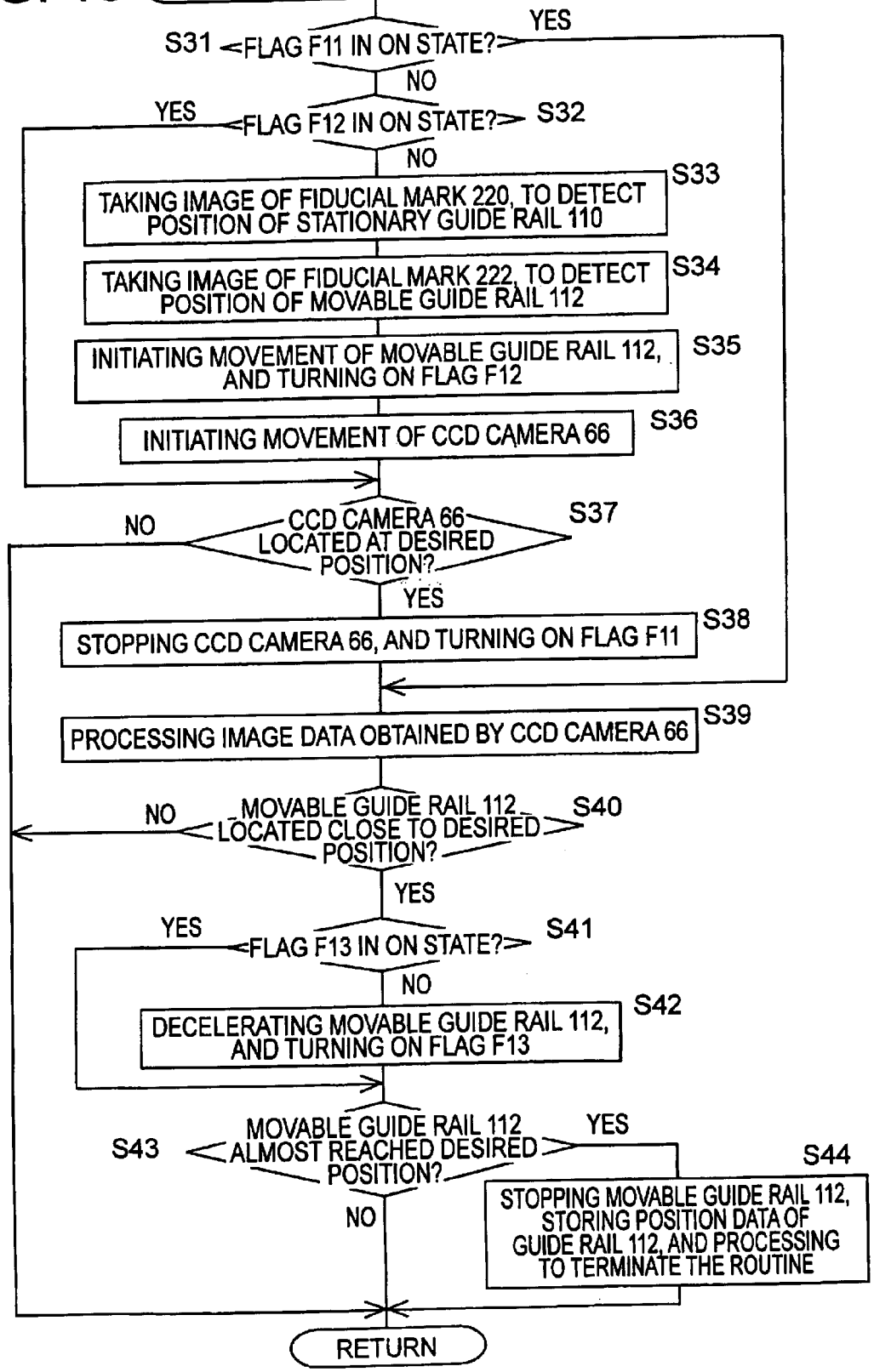
FIG. 10 is a flow chart illustrating a conveyor-width changing routine executed according to a control program stored in a RAM of a computer of a control system of an electric-component mounting system including a printed-wiring-board conveyor constructed according to a second embodiment of this invention.

The conveyor width changing routine of FIG. 10 is initiated with step S31 to determine whether a flag F1 is placed in an ON state. The flag F11 placed in the ON state indicates that the CCD camera 66 has reached the desired Y-axis position. Since the flag F11 is reset to an OFF state upon initialization in a main control routine, a negative decision (NO) is initially obtained in step S31, and the control flow goes to steps S32–S35, which are substantially identical with steps S1–S4 of the routine of FIG. 9, except in that flag F12 is set to an ON state in step S35 after a movement of the movable guide rail 112 toward the desired Y-axis position is initiated. Then, step S36 is implemented to initiate a movement of the CCD camera 66 toward the desired Y-axis position. The desired Y-axis position is obtained in the same manner as described above with respect to the first embodiment. The CCD camera 66 is moved at a higher speed than the movable guide rail 112.

Then, the control flow goes to step S37 to determine whether the CCD camera 66 has reached the desired Y-axis position. A negative decision (NO) is initially obtained in step S37, and one cycle of execution of the present routine is terminated. Steps S31, S32 and S37 are repeatedly implemented until the CCD camera 66 has reached the desired Y-axis position. When an affirmative decision (YES) is obtained in step S37, the control flow goes to step S38 to stop the movement of the CCD camera 66, and turn ON the flag F11.

Then, the control flow goes to step S39 in which an image of the fiducial mark 222 is obtained by the CCD camera 66, and image data obtained by the CCD camera 66 are processed. Step S39 is followed by step S40 to determine whether the movable guide rails 112 is located at a predetermined position close to the desired Y-axis position. This determination is effected by determining whether the image of the fiducial mark 222 is located within the imaging area of the CCD camera 66. If the image is not located within the imaging area, it means that the movable guide rail 112 has not reached the predetermined position close to the desired Y-axis position. In this case, a negative decision (NO) is obtained in step S40, and one cycle of execution of the present routine is terminated. The determination as to whether the movable guide rail 112 has reached the predetermined position close to the desired Y-axis position may be made on the basis of the operating time of the width changing motor 210.

Steps S31, S39 and S40 are repeatedly implemented until the movable guide rail 112 has been located at the predetermined position close to the desired Y-axis position. When the movable guide rail 112 has reached the predetermined position close to the desired Y-axis position, the image of the fiducial mark 222 can be taken by the CCD camera 66, and an affirmative decision (YES) is obtained in step S40, so that step S41 is implemented to determine whether a flag F13 is placed in an ON state. The flag F13 placed in the ON state indicates that the movable guide rail 112 has reached the predetermined position close to the desired Y-axis position, and that the speed of movement of the movable guide rail 112 has been lowered. Since the flag F12 is reset to an OFF state upon initialization in the main control routine, a negative decision (NO) is initially obtained in step S41, and the control flow goes to step S42 to decelerate the movable guide rail 112 (lower the speed of its movement), and turn ON the flag F13.

Step S43 is then implemented to determine whether the movable guide rail 112 has almost reached the desired Y-axis position, that is, has been moved to a predetermined position which is a short distance apart from the desired Y-axis position in the direction away form the stationary guide rail 110 toward the movable guide rail 112. Steps S31, S39, S40, S41 and S43 are repeatedly implemented until the movable guide rail 112 has reached the predetermined position indicated above. When an affirmative decision (YES) is obtained in step S43, the control flow goes to step S44 similar to step S15, in which the width changing motor 210 is turned off, so that the movable guide rail 112 is stopped at the desired Y-axis position at which the center of the image of the fiducial mark 222 is aligned with the center of the imaging area of the CCD camera 66. Thus, the operation to locate the CCD camera 66 at the desired Y-axis position and control the width changing device 214 such that the position of the fiducial mark 222 of the movable guide rail 112 is aligned with the position of the CCD camera 66 is a step of controlling the width changing device 214 to establish the desired width of the PWB conveyor 100. Further, a portion of the control device 250 assigned to implement steps S40 and S42–S44 constitutes a control device for controlling the width changing device 214.

While the first embodiment is adapted such that the CCD camera 66 follows the movement of the movable guide rail 112, the movable guide rail 112 may follow the movement of the image-taking device including the CCD camera 66. This modified arrangement will be described as a third embodiment of the invention, by reference to the flow chart of FIG. 11 illustrating a conveyor width changing routine in the third embodiment.

Figure 11:
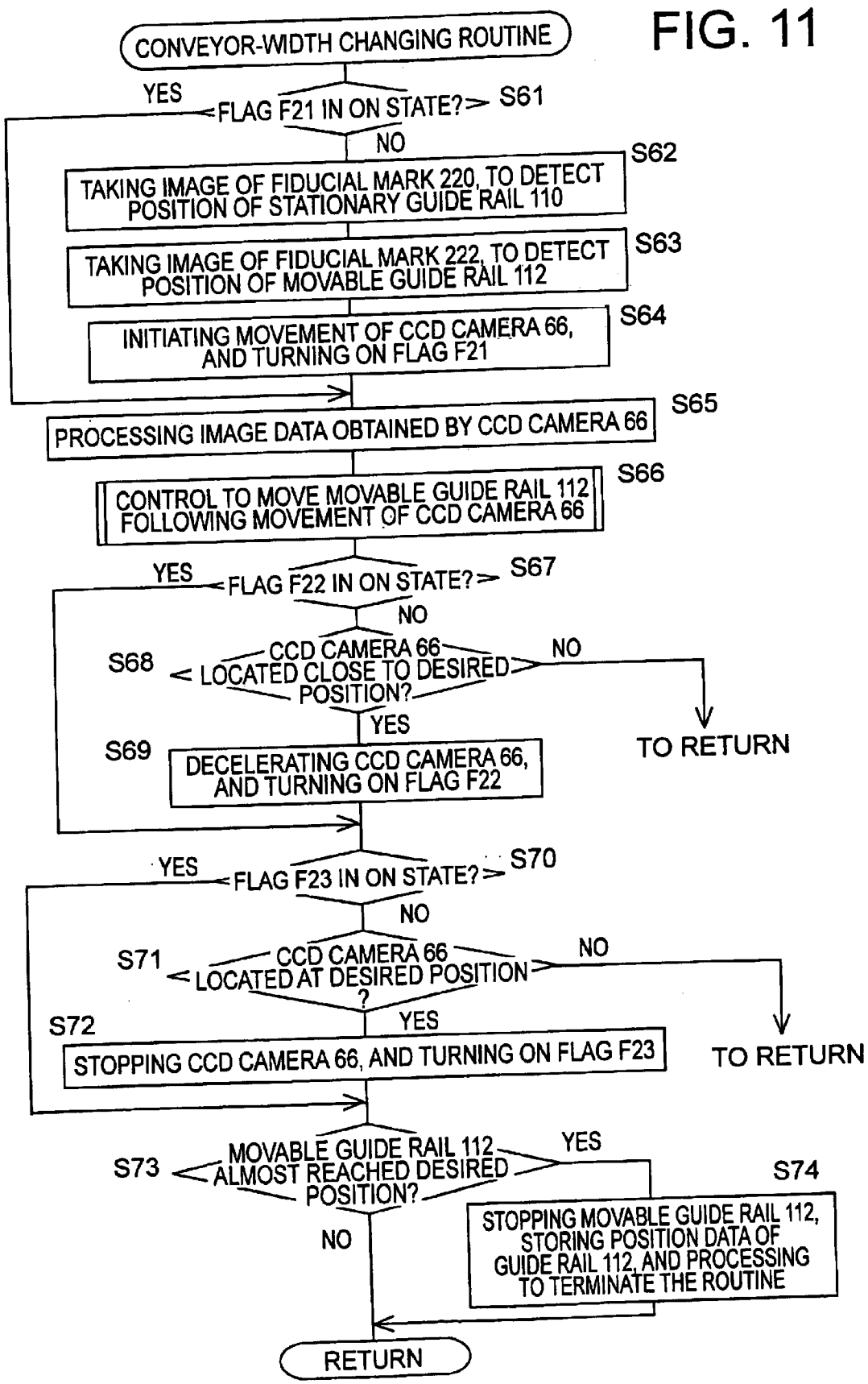
FIG. 11 is a flow chart illustrating a conveyor-width changing routine executed according to a control program stored in a RAM of a computer of a control device of an electric-component mounting system including a printed-wiring-board conveyor constructed according to a third embodiment of the invention.

The conveyor width changing routine of FIG. 11 is initiated with steps S61–S63, which are similar to steps S1–S3 of the first embodiment. Namely, the positions of the stationary and movable guide rails 110, 112 are detected. Then, step S64 is implemented to initiate a movement of the CCD camera 66 toward the desired Y-axis position, and turn ON a flag F21. In this embodiment, the speed of movement the CCD camera 66 is controlled in a predetermined pattern.

Then, the control flow goes to step S65 in which an image of the fiducial mark 222 is taken by the CCD camera 66, and image data obtained by the CCD camera 66 are processed. Step S65 is followed by step S66 in which a movement of the movable guide rail 112 is controlled such that the movable guide rail 112 follows or traces the movement of the CCD camera 66. As the CCD camera 66 is moved, the relative position of the image of the fiducial mark 222 and the imaging area of the CCD camera 66 changes. The width changing motor 210 is controlled to control the movement of the movable guide rail 112 so that the deviation of the center of the image of the fiducial mark 222 with respect to the center of the imaging area of the CCD camera 66 is zeroed.

If the movable rail 112 follows the CCD camera 66 in its movement toward the desired Y-axis position, the amount of electric current to be applied to the width changing motor 210 is increased by an amount corresponding to the distance between the movable guide rail 112 and the CCD camera 66. If the movable guide rail 112 leads the CCD camera 66, the amount of electric current is reduced by an amount corresponding to the distance. As a result, the movable guide rail 112 is moved at a speed which is controlled in substantially the same pattern as that of the CCD camera 66.

Then, step S67 is implemented to determine whether a flag F22 is placed in an ON state. The flag F22 placed in the ON state indicates that the CCD camera 66 has reached a predetermined position close to the desired Y-axis position. Since the flag F22 is reset to an OFF state upon initialization in the main control routine, a negative decision (NO) is obtained in step S67, and the control flow goes to step S68 to determine whether the CCD camera 66 has reached the predetermined position close to the desired Y-axis position. A negative decision (NO) is initially obtained in step S68, and one cycle of execution of the present routine is terminated.

Steps S61 and S65–S68 are repeatedly implemented until the CCD camera 66 has reached the predetermined position close to the desired Y-axis position. When an affirmative decision (YES) is obtained in step S68, the control flow goes to step S69 to decelerate the CCD camera 66, and turn ON the flag F22.

The control flow then goes to step S70 to determine whether a flag F23 is placed in an ON state. Since the flag F23 is reset to an OFF state upon initialization, a negative decision (NO) is initially obtained in step S70, and the control flow goes to step S71 to determine whether the CCD camera 66 has reached the desired Y-axis position. If a negative decision (NO) is obtained in step S71, one cycle of execution of the present routine is terminated. Steps S61, S65–S67, S70 and S71 are repeatedly implemented until the CCD camera 66 has reached the desired Y-axis position. As a result of the deceleration of the CCD camera 66, the movable guide rail 112 is also decelerated since the movement of the movable guide rail 112 is controlled so as to follow the movement of the CCD camera 66.

When the CCD camera 66 has reached the desired Y-axis position, an affirmative decision (YES) is obtained in step S71, and the control flow goes to step S72 to stop the movement of the CCD camera 66, and turn ON the flag F23. Then, step S73 is implemented to determine whether the movable guide rail 112 has almost reached the desired Y-axis position. This determination is effected in substantially the same manner as described above with respect to step S14 in the first embodiment. A negative decision (NO) is initially obtained in step S73, and one cycle of execution of the present routine is terminated. When the movable guide rail 112 has almost reached the desired Y-axis position, an affirmative decision (YES) is obtained in step S73, and the control flow goes to step S74 to stop the movable guider ail 112, store the position data of the movable guide rail 112 and perform a processing operation to terminate the present routine. Thus, the operation to control the width changing device 214 so as to zero the deviation of the center of the image of the fiducial mark 222 with respect to the center of the imaging area of the CCD camera 66 is a step of controlling the width changing device 214 to establish the desired width of the PWB conveyor 100. Further, a portion of the control device 250 assigned to implement step S66 constitutes a tracing control portion for controlling the movement of the movable guide rail 112 so as to follow the movement of the CCD camera 66. This tracing control portion cooperates with a portion of the control device 250 assigned to implement steps S73 and S74 to constitute a control device for controlling the width changing device 214.

In the illustrated embodiments described above, the two fiducial marks 220, 222 are provided on the respective stationary and movable guide rails 110, 112. However, a plurality of fiducial marks may be provided on each of the two guide rails 110, 112. Further, the preceding embodiments are arranged to move the movable guide rail 112 to change the distance between the stationary and movable guide rails 110, 112, by the two feedscrews 192 which are connected to each other for synchronous rotations by the single width changing motor 210. However, the movable guide rail may be moved by two feedscrews which are rotated by respective width changing motors independently of each other. This modified arrangement will be described as a fourth embodiment, by reference to FIG. 12.

Figure 12:
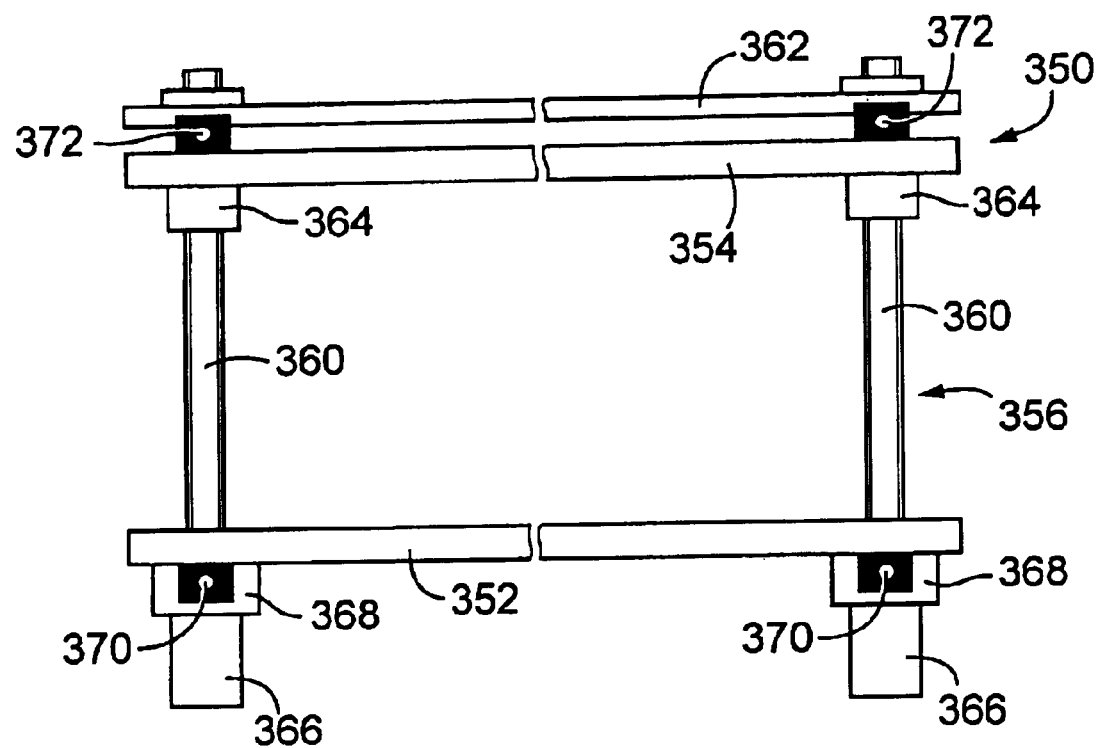
FIG. 12 is a plan view schematically showing a printed-wiring-board conveyor constructed according to a fourth embodiment of this invention.

The fourth embodiment includes a width changing device 356 for changing the width of a PWB conveyor 350, that is, for changing a distance between a stationary guide rail 352 and a movable guide rail 354 of the PWB conveyor 350. As schematically shown in FIG. 12, the width changing device 356 includes two feedscrews 360, each of which is rotatably supported at its longitudinally opposite ends by the stationary guide rail 252 and a support member 362. The feedscrews 364 are held in meshing engagement with respective nuts 364 fixed to the movable guide rails 354. The two feedscrews 364 are connected through respective speed reducing devices 368 to respective width changing motors 366 mounted on the stationary guide rail 352. The movable guide rails 354 is moved toward and away from the stationary guide rail 352 when the two feedscrews 360 are rotated by the respective width changing motors 366 independently of each other. The movable guide rail 354 is guided by a guiding device including guide rods as in the first embodiment. In FIG. 12, a mechanism for feeding the printed-wiring board 24 is not shown.

Each of the stationary and movable guide rails 352, 354 is provided at its longitudinally opposite end portions with respective fiducial marks 370 or 372, which are located at the positions of the respective two feedscrews 366. Thus, the PWB conveyor 350 uses two pairs of fiducial marks 370, 372.

The width of the PWB conveyor 350 is changed in the same manner as in the first embodiment of FIGS. 1–9. Namely, the CCD camera 66 is moved so as to follow or trace the movement of the movable guide rail 354, more precisely, the movement of one of the two fiducial marks 372 of the movable guide rail 354. However, the positions of the stationary and movable guide rails 352, 354 are detected on the basis of the images of the two pairs of fiducial marks 370, 372. In the present embodiment, two desired Y-axis positions of the movable guide rail 354 are determined on the basis of the positions of the two fiducial marks 370 of the stationary guide rail 352 and the desired width of the PWB conveyor 100, that is, the desired distance between the stationary and movable guide rails 352, 354. However, the movement of the CCD camera 66 so as to trace the movement of the movable guide rail 354 is controlled on the basis of one of the two desired Y-axis positions of the movable guide rail 354.

When the width of the PWB conveyor 350 is changed, the two electric motors 366 are operated in synchronization with each other to drive the respective two feedscrews 360, so that the movable guide rail 354 is moved in the Y-axis direction toward or away from the stationary guide rail 352. The CCD camera 66 follows one of the two fiducial marks 372 of the movable guide rail 354, and reaches the desired Y-axis position corresponding to this fiducial mark 372, before the movable guide rail 354. At this desired Y-axis position, the CCD camera 66 takes an image of the above-indicated one fiducial mark 372, and the movable guide rail 354 is located at the desired Y-axis position on the basis of the image of the fiducial mark 372 taken by the CCD camera 66. Then, the CCD camera 66 is moved to the desired Y-axis position corresponding to the other fiducial mark 372, and takes an image of this other fiducial mark 372. If the position of the image of this other fiducial mark 372 deviates from the center of the imaging area of the CCD camera 66, that is, from the desired Y-axis position in the Y-axis direction, the width changing motor 366 corresponding to the above-indicated other fiducial mark 372 is operated to move the corresponding end portion of the movable guide rail 354, so as to zero the above-indicated deviation. In this manner, the desired width of the PWB conveyor 350 can be accurately established.

As described above, the fourth embodiment uses the two pairs of fiducial marks 370, 372, and is arranged to change the distance between the stationary and movable guide rails 352, 354, at two positions of the guide rails (that are spaced apart from each other in the longitudinal direction, independently of each other, so that the desired width of the PWB conveyor 350 can be established with a higher degree of accuracy over the entire length of the guide rails 352, 354.

The distance between the stationary and movable guide rails may be changed at three or more different longitudinal positions of the guide rails independently of each other by respective drive motors. The longitudinal positions at which the width is changed independently of each other are determined depending upon the constructions and positional arrangements of the PWB conveyor and the adjacent members. Where the width is changed at three longitudinal positions of the guide rails, for instance, the width is preferably changed at the longitudinally opposite end portions and intermediate portion of the guide rails, for example. In this case, three feedscrews are preferably provided at the respective three longitudinal positions of the guide rails, and three pairs of fiducial marks are preferably provided at the respective three longitudinal positions corresponding to the three feedscrews. However, four or more fiducial marks may be provided.

Further, the number of the longitudinal positions of the stationary and movable guide rails at which the width of the PWB conveyor is changed may be equal to or different from the number of pairs of the fiducial marks provided on the guide rails. In the embodiment of FIG. 1 wherein the two feedscrews 192 are rotated by the single drive source 210 to move the movable guide rail 112, two or more pairs of fiducial marks may be provided. According to this modification, the two or more pairs of fiducial marks are spaced apart from each other in the longitudinal direction of the guide rails. In this case, an average of the positions of the two or more fiducial marks of the stationary guide rail is used as the position of the stationary guide rail, and the desired Y-axis position of the movable guide rail is determined on the basis of the average position of the stationary guide rail and the desired width of the PWB conveyor (desired distance between the stationary and movable guide rails). Initially, the movable guide rail is moved to the desired Y-axis position on the basis of an image of one of the fiducial mark of the movable guide rail. Then, images of the other fiducial marks of the movable guide rail are taken one after another, to adjust the Y-axis position of the movable guide rail on the basis of the images of those fiducial marks, if the actual positions of the movable guide rail corresponding to those fiducial marks deviate from the desired Y-axis position by more than a predetermined amount.

In the illustrated embodiments described above, the movable guide rail 112, 354 is decelerated when the CCD camera 66 has reached a position close to the desired Y-axis position, so that the movable guide rail is moved at a relatively low speed until the movable guide rail has almost reached the desired Y-axis position. However, the speed of movement of the movable guide rail may be gradually lowered to stop the movable guide rail at the desired Y-axis position, by gradually reducing the timer of energization of the width changing motor. The time of energization of the width changing motor may be reduced linearly or in steps, or along a predetermined curve. The width changing motor may be a provided with a brake, to stop the movable guide rail at the desired Y-axis position in a shorter time and with higher accuracy.

While the illustrated embodiments are arranged such that the movable guide rail 112, 354 is decelerated when it has reached a predetermined position close to the desired Y-axis position, a continuous movement of the movable guide rail 112, 354 may be changed to an intermittent movement when the movable guide rail has reached the predetermined position. The distance of each of the intermittent motions may be kept constant, or increased as the movable guide rail approaches the desired Y-axis position.

Where the CCD camera is moved so as to follow or trace the movable guide rail, the CCD camera may be moved to the desired Y-axis position when the movable guide rail has reached a position close to the desired Y-axis position. This is possible since the position of the movable guide rail can be obtained on the basis of the position of the CCD camera and the position of the image of the fiducial mark 222.

In the first embodiment wherein the CCD camera is moved so as to follow the movable guide rail, the movement of the CCD camera so as to follow the movable guide rail is terminated when the CCD camera has reached a position close to the desired Y-axis position, and the CCD camera is further moved to the desired Y-axis position before the movable guide rail reaches the desired Y-axis position. However, this arrangement is not essential. In this respect, it is noted that even if the CCD camera keeps following the movable guide rail, the position of the movable guide relative to the desired Y-axis position can be obtained on the basis of the position of the CCD camera, so that the movable guide rail can be stopped at the desired Y-axis position.

Where the movable guide rail is moved by the operator by performing an inching operation of the width changing motor, and position data indicative of the movable guide rail are not stored in the RAM, the position of the movable guide rail may be detected by moving the CCD camera over a predetermined search range determined by the range of the operating stroke of the movable guide rail, to search the fiducial mark provided on the movable guide rail, as in thecae where the movable guide rail is moved by the operator using the handwheel 218.

Although each image-taking device used in the illustrated embodiments is arranged to take a two-dimensional image of the object at one time, the image-taking device may be a line sensor having a straight array of multiple imaging elements, which is moved relative to the object to take multiple line images one after another, so that the multiple line images cooperate to form a two-dimensional image of the object. Where the line sensor is used, the line sensor is moved by a suitable feeding device, to take an image of a fiducial mark, which is used to control the width changing device.

In the illustrated embodiments, the images of the fiducial marks 220, 222 provided on the guide rails 110, 112 are taken by the CCD camera 66 which is provided to take the images of the fiducial marks 65 provided on the printed-wiring board 24. However, the images of the fiducial marks 220, 222 may be taken by other image-taking devices if provided for some other purposes.

The method according to the present invention is applicable to a variable-width substrate conveyor which includes a substrate loading portion, a substrate positioning portion and a substrate unloading portion and in which a circuit substrate received from the substrate loading portion is positioned and supported by the substrate positioning portion, so that an electric-component mounting device or other substrate handling device is moved by a moving device in a plane parallel to the surface of the circuit substrate, for performing a desired working operations at predetermined positions on the circuit substrate. The substrate positioning device may be arranged to move the circuit substrate in only the feeding direction of the substrate conveyor, or in both of the feeding direction and a direction which is parallel to the circuit substrate and perpendicular to the feeding direction. In this variable-width substrate conveyor, each of the substrate loading, positioning and unloading portions has a pair of parallel guide rails. The three portions may be provided with respective width changing devices for changing their widths independently of each other. Alternatively, the three portions may be connected to each other, and use a single common width changing device for changing the width of the connected three portions at one time. Each width changing device may use a single drive source, or a plurality of drive sources which are operable independently of each other to change the distance between the two guide rails at different longitudinal positions of the guide rails.

The fiducial mark or marks provided on the movable guide rail may be taken by the image-taking device after the movable guide rail is located at the desired Y-axis position, so that the image or images of the fiducial mark or marks is/are used to check if the movable guide rail is accurately located at the desired Y-axis position, and to correct the actual position of the movable guide rail, if necessary.

The method of the present invention is equally applicable to a variable-width substrate conveyor used to feed or transfer a circuit substrate in various devices other than the electric-component mounting device, such as a screen printer, an adhesive dispenser and other high-viscosity fluid coating devices, a re-flow furnace for melting a solder paste, and a circuit inspecting device.

Referring next to FIGS. 13–9 and FIGS. 5 and 6, there will be described a fifth embodiment of the present invention, wherein the same reference signs as used in the first embodiment of FIGS. 1–9 are used to identify substantially the same elements, which will be only briefly described in this fifth embodiment.

Figure 13:
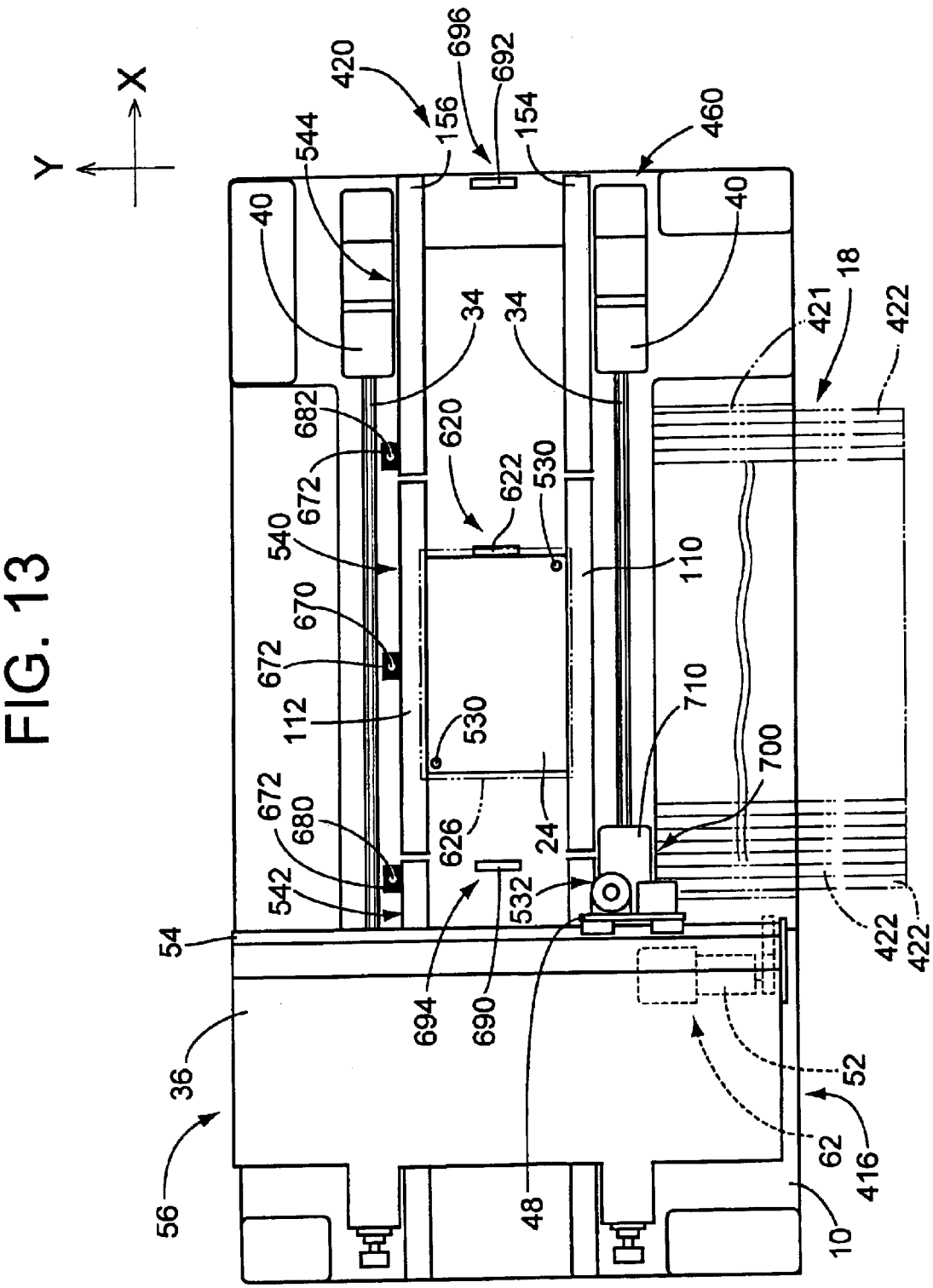
FIG. 13 is a view schematically showing an electric-component mounting system arranged to practice a method of changing the width of a printed-wiring-board conveyor and a method of matching the widths of adjacent conveyors, according to a fifth embodiment of this invention.

The electric-component mounting system according to the present sixth embodiment includes an electric-component mounting device generally indicated at 416 in FIG. 13, a printed-wiring-board supporting and transferring device generally indicated at 420 also in FIG. 13, and the component supply device 18. These elements 416, 420 and 18 are mounted on the machine base 10. The electric-component mounting device 416 is constructed to mount the electric component 32 (FIGS. 15 and 16) on the printed-wiring board 24 (FIG. 13). The component supply device 18 is located on one of opposite sides of the printed-wiring-board supporting and transferring device 420 (hereinafter abbreviated as "PWB transferring device 420), as viewed in the Y-axis direction.

The component supply device 18 includes a feeder table 421, and a multiplicity of tape feeders 422 removably mounted on the feeder table 421. Each tape feeder 422 has a tape cartridge holding a component-accommodating tape which accommodates an array of the electric components 32 (typically, electronic components). The taper feeder 422 is arranged to supply the electric components 32 one after another. The tape feeders 422 are mounted on the feeder table 421 such that component supply portions of the tape feeders 422 are arranged along a straight line parallel to the X-axis direction in which the printed-wiring board 24 is fed by the PWB transferring device 420.

The electric-component mounting device 416 includes a component-mounting unit 428, and the XY robot 56 which has been described with respect to the first embodiment. Briefly described, XY robot 56 includes the two ballscrews 34 disposed on the respective opposite sides of the PWB transferring device 420. The ballscrews 34 are held in meshing engagement with the ballnuts 38 (FIG. 15) fixed to the X-axis slide 36, and are driven by the X-axis drive motors 40 (FIG. 13) to move the X-axis slide 36 in the X-axis direction while being guided by the guide rails 42 and the guide block 44 (FIG. 15).

The X-axis slide 36 carries the Y-axis slide 48 which is moved by rotation of the ballscrew 46 (FIG. 15) by the Y-axis drive motor 52 (FIG. 13), while being guided by the guide rails 54. The ballscrew 46 is held in meshing engagement with the nut 50 fixed to the Y-axis slide 48. The nuts 38, ballscrews 34 and X-axis drive motor 40 constitutes an X-axis slide moving device 460 (FIG. 13), while the nut 50, ballscrew 46 and Y-axis drive motor 42 constitutes a Y-axis slide moving device 462 (FIGS. 15 and 16). These moving devices 460, 462 cooperate with the X-axis slide 36 and the Y-axis slide 48 to constitute the XY robot 56, which serves as a head moving device operable to move the component mounting head 30 (FIGS. 15 and 16). The X-axis and Y-axis drive motors 40, 52 may be operated in an inching mode by the operator of the present electric-component mounting system.

Figure 15:
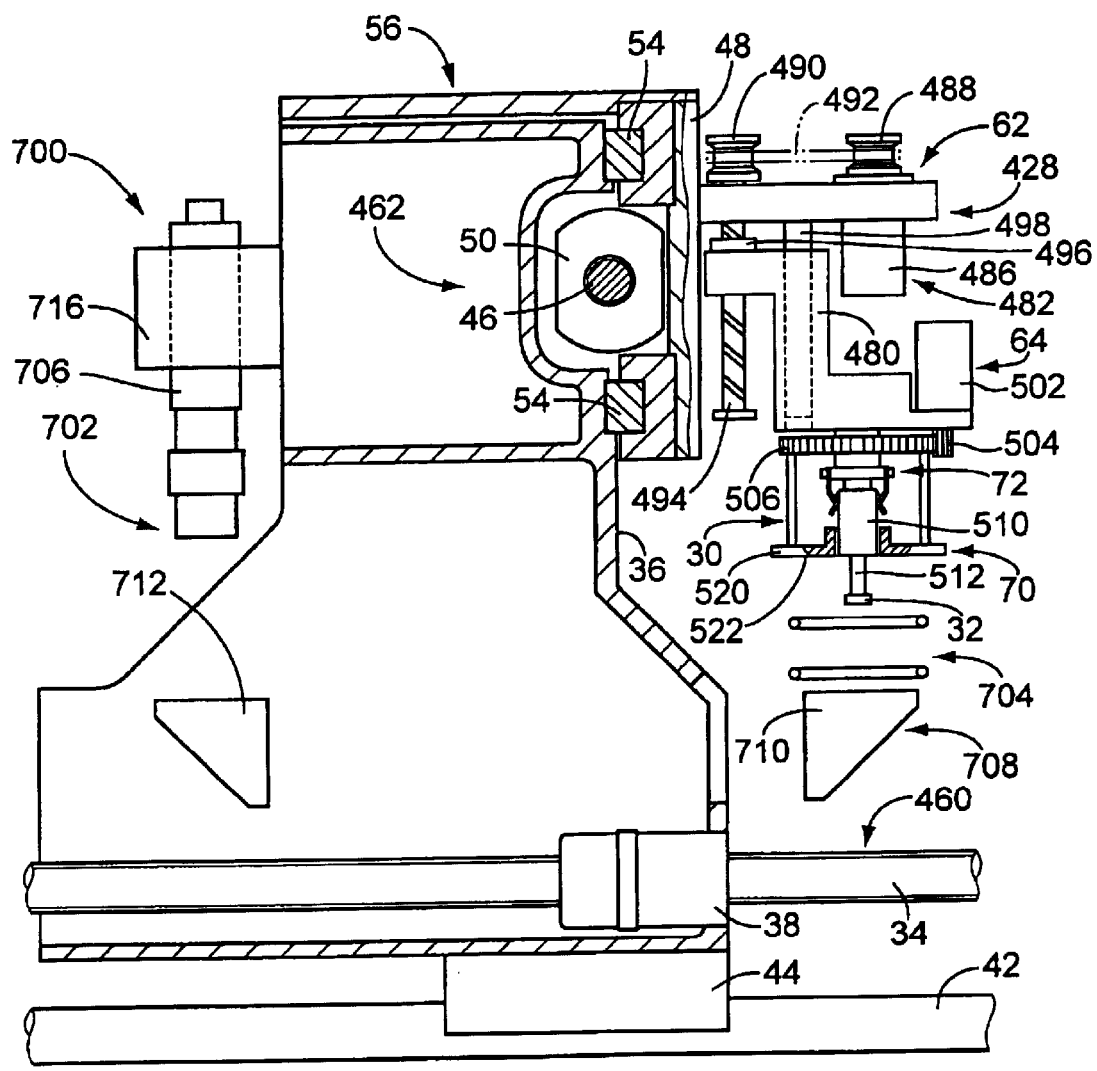
FIG. 15 is a front elevational view partly in cross section showing a component-mounting device of the electric-component mounting system of FIG. 13.
Figure 16:
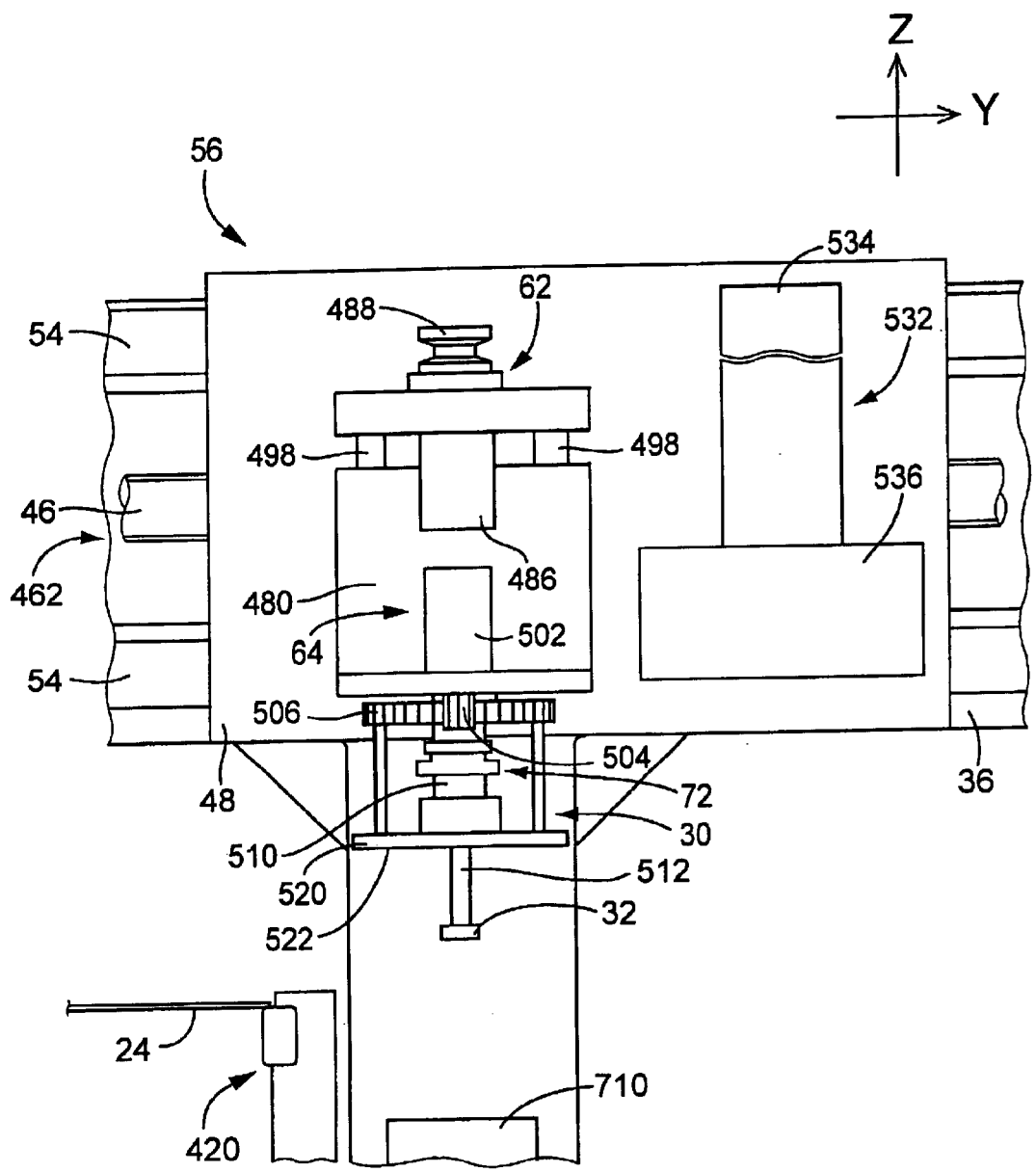
FIG. 16 is a side elevational view of the component-mounting device.

As shown in FIGS. 15 and 16, the component mounting head 30 includes the suction nozzle 70, nozzle holder 72, elevator device 62 and rotary drive device 64, which have been described with respect to the first embodiment. The elevator device 62 includes a vertically movable member 480 vertically movably mounted on the Y-axis slide 48, and further includes a vertical drive device 482 operable to move the vertically movable member 480. The vertical drive device 482 includes a drive source in the form of an elevator drive motor 486, and a rotation transmitting device which includes a drive pulley 488, a driven pulley 490 and a drive belt 492. A rotary motion of the elevator drive motor 486 is transmitted through the rotation transmitting device to a ballscrew 494, which is mounted on the Y-axis slide 48 such that the ballscrew 494 is rotatable about a vertically extending axis thereof and is not axially movable relative to the Y-axis slide 48. The ballscrew 94 is held in meshing engagement with a ballnut 496 fixed to the vertically movable member 480. A rotary motion of the ballscrew 494 by the elevator drive motor 486 causes the vertically movable member 480 to be vertically moved while being guided by guiding members 498 (only one of which is shown in FIG. 15) in the form of a pair of rails which are disposed on the Y-axis slide 48, so as to extend in the vertical direction.

The nozzle holder 72 which removably holds the suction nozzle 70 is disposed on the vertically movable member 480 such that the nozzle holder 72 is rotatable about a vertically extending axis and is not axially movable relative to the vertically movable member 480. The nozzle holder 72 is constructed as disclosed in JP-B-3093339. The nozzle holder 72 and the suction nozzle 70 cooperate to serve the component mounting head 30, which is movable by the XY robot 56 in the XY plane, to perform a component mounting operation, that is, to receive the electric component 32 from the component supply device 18, and mount the electric component 32 on the printed-wiring board 24.

The rotary drive device 64 is mounted on the vertically movable member 480, and includes a drive source in the form of a rotary drive motor 502, a drive gear 504 and a driven gear 506. A rotary motion of the rotary drive motor 502 is transmitted to the nozzle holder 72 through the drive and driven gears 504, 506, to rotate the nozzle holder 72 in the opposite directions about the vertical axis.

The suction nozzle 70 has a nozzle body 510 and a suction tube 512 engaging the nozzle body 510, and is held by the nozzle holder 72 such that the suction nozzle 70 is axially movable relative to the nozzle holder 72 and is not rotatable relative to the nozzle holder 72. The suction nozzle 70 is selectively communicated with the negative-pressure source, the positive-pressure source and the atmosphere, through solenoid-operated directional control valves, to hold and release the electric component 32, as described above with respect to the first embodiment by reference to FIG. 2.

The driven gear 506 is provided with a light-emitting body in the form of a light-emitting plate 520 fixed thereto, such that the light-emitting plate 520 is rotated with the driven gear 506. The light-emitting plate 520 is a circular plate disposed coaxially with the suction nozzle 70, and has a lower surface coated with a fluorescent material. The lower surface serves as a light-emitting surface 522.

As shown in FIG. 16, the Y-axis slide 48 also carries a fiducial-mark imaging system 532 arranged to take images of two fiducial marks 530 provided on the printed-wiring board 24 as shown in FIG. 13. The two fiducial marks 530 are located at respective corner portions of the board 24, which are opposed to each other diagonally of the rectangle of the board 24, as shown in FIG. 13. The fiducial-mark imaging system 532 includes an image-taking device in the form of a fiducial-mark camera 534 and an illuminating device 536, as shown in FIG. 16. The fiducial-mark camera 534 is substantially identical in construction with the CCD camera 68 provided in the first embodiment to take the images of the fiducial marks 65.

Like the component-mounting unit 428, the fiducial-mark camera 534 mounted on the Y-axis slide 48 is movable by the XY robot 56 in the XY plane. Thus, the XY robot 56 provided to move the component mounting head 30 is utilized as a device for moving the image-taking device in the form of the fiducial-mark camera 534.

As shown in FIG. 13, the PWB transferring device 420 includes a main conveyor 540, an upstream conveyor (incoming conveyor) 542, and a downstream conveyor (outgoing conveyor) 544, which are arranged in the X-axis direction, in the order of description as viewed in the direction of movement of the printed-wiring board 24. The upstream and downstream conveyors 542, 544 are disposed adjacent to the respective upstream and downstream ends of the main conveyor 540. The main conveyor 540 is equivalent to the PWB conveyor 100 in the first embodiment. Since these three conveyors 540, 542, 544 have substantially the same construction, the main conveyor 540 will be described by way of example.

Figure 17:
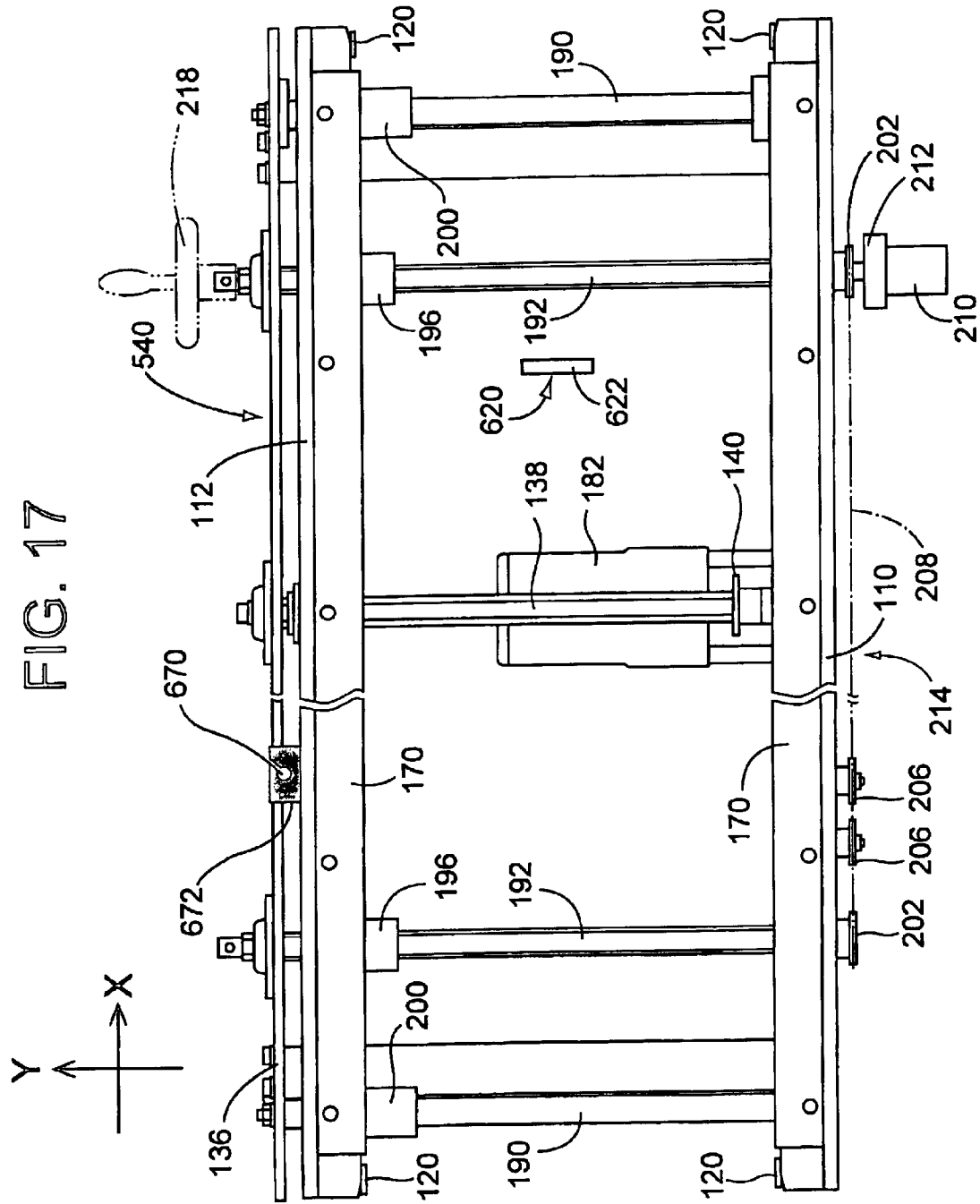
FIG. 17 is a plan view showing a main conveyor of a printed-wiring-board transferring device of the electric-component mounting system of FIG. 13.

Referring back to FIGS. 5 and 6 and further to FIG. 17, the main conveyor 540 includes the stationary guide rail 110, movable guide rail 112, feeding device 164, and width changing device 214, which have been described with respect to the first embodiment. Briefly described, the feeding device 164 includes the endless belts 124 and the belt drive device 162 which are shown in FIGS. 5 and 6, and the width changing device 214 includes the feedscrews 192, rail nuts 194, and width changing motor 210, as shown in FIG. 17.

As shown in FIGS. 13 and 17, a stopping device 620 is disposed at a downstream end portion of the main conveyor 540 as seen in the direction of movement of the printed-wiring board 24. The stopping device 620 is provided to stop the printed-wiring board 24 at a predetermined stop position. For instance, the predetermined stop position is a position at which the board 24 is aligned with a longitudinally middle part of the component supply device 18 in the X-axis direction.

The stopping device 620 includes a stopper 622 which is movable in the Y-axis direction and engageable with the printed-wiring board 24 to stop the board 24, and a stopper positioning device (not shown) operable to move the stopper 622 between an operated position within a path of movement of the board 24 and a non-operated position outside the path of movement of the board 24. When the stopper 622 is placed in its operated position, the stopper 662 is engageable with the board 24 to stop the board 24 at the predetermined stop position. The stopper 622 placed in its non-operated position permits the movement of the board 24. For instance, the stopper positioning device is a fluid-operated actuator such as an air cylinder, which is automatically actuated to move the stopper 622 between its operated and non-operated positions. A detecting device (not shown) is provided to detect a fact that the printed-wiring board 24 is located at the stop position by the stopping device 620. The operation of the feeding device 152 to feed the printed-wiring board 24 is terminated in response to the output signal of this detecting device.

As shown in FIG. 13, a printed-wiring-board support device 626 is disposed as a substrate holding device, between the stationary and movable guide rails 110, 112, and at a position corresponding to the predetermined stop position at which the board 24 is stopped by the stopping device 620. The board 24 at the stop position is supported by this support device 626. The support device 626 includes a plurality of support members for supporting the board 24 such that the board 24 is held parallel to the XY plane, that is, such that the board 24 has a horizontal attitude. The support device 626 further includes clamping members which cooperate with the presser portions 174 (FIG. 5) of the stationary and movable guide rails 110, 112 to hold the printed-wiring board 24 therebetween such that the board 24 has a horizontal attitude. Namely, the opposite upper and lower surfaces of the printed-wiring board 24 stopped at the stop position by the stopping device 220 and supported by the support device 626 are parallel to the XY plane. The upper and lower surfaces of the board 24 in this state define a reference plane (XY plane) in which the fiducial-mark camera 534 is movable by the XY robot.

The movable guide rail 112 is provided with a mark carrier 672 having a fiducial mark 670, as shown in FIG. 17.

These mark carrier 672 and fiducial mark 670 are identical with the mark carrier 226 and fiducial mark 222 provided in the first embodiment.

As described above, the upstream and downstream conveyors 542, 544 are substantially identical in construction with the main conveyor 540. Briefly described, each of the upstream and downstream conveyors 542, 544 includes the feeding device 164, stationary and movable guide rails 110, 112 and width changing device 214. The movable guide rails 112 of the upstream and downstream conveyors 542, 544 are provided, at their end portions on the side of the main conveyor 540, with respective mark carriers 672 having respective fiducial marks 680, 682. These fiducial marks 680, 682 are located at respective X-axis positions corresponding to the opposite end portions of the component supply device 18 as seen in the X-axis direction. The fiducial marks 680, 680 lie within an area in which the fiducial-mark camera 534 is movable by the XY robot 56, that is, within an area of movement of the component mounting head 30 by the XY robot 56 to receive the electric component 32 from the tape feeders 422 and mount the electric component 32 on the printed-wiring board 24. This area of movement of the component mounting head 30 covers the entire dimension of the component supply device 18 in the X-axis direction.

As schematically shown in FIG. 13, the upstream and downstream conveyors 642, 644 include respective stopping devices 694, 696 having respective stoppers 690, 692. These stopping devices 694, 696, which are identical with the stopping device 620 described above, are provided to stop the printed-wiring board 24 at respective predetermined stop positions. The upstream and downstream conveyors 542, 544 do not include a printed-wiring board supporting device. The stop position defined by the stopping device 694 is determined such that the downstream end of the board 24 stopped at the stop position is located at the downstream end of the upstream conveyor 542 on the side of the main conveyor 540, while the stop position defined by the stopping device 696 is determined such that the downstream end of the board 24 is located at the downstream end of the downstream conveyor 544 which is remote from the main conveyor 540. The stopping devices 694, 696 for the upstream and downstream conveyors 542, 544 are not essential. It is noted that the size of the fiducial marks 670, 680, 682 as shown in FIG. 13 is made larger than the actual size, for easier understanding.

Figure 14:
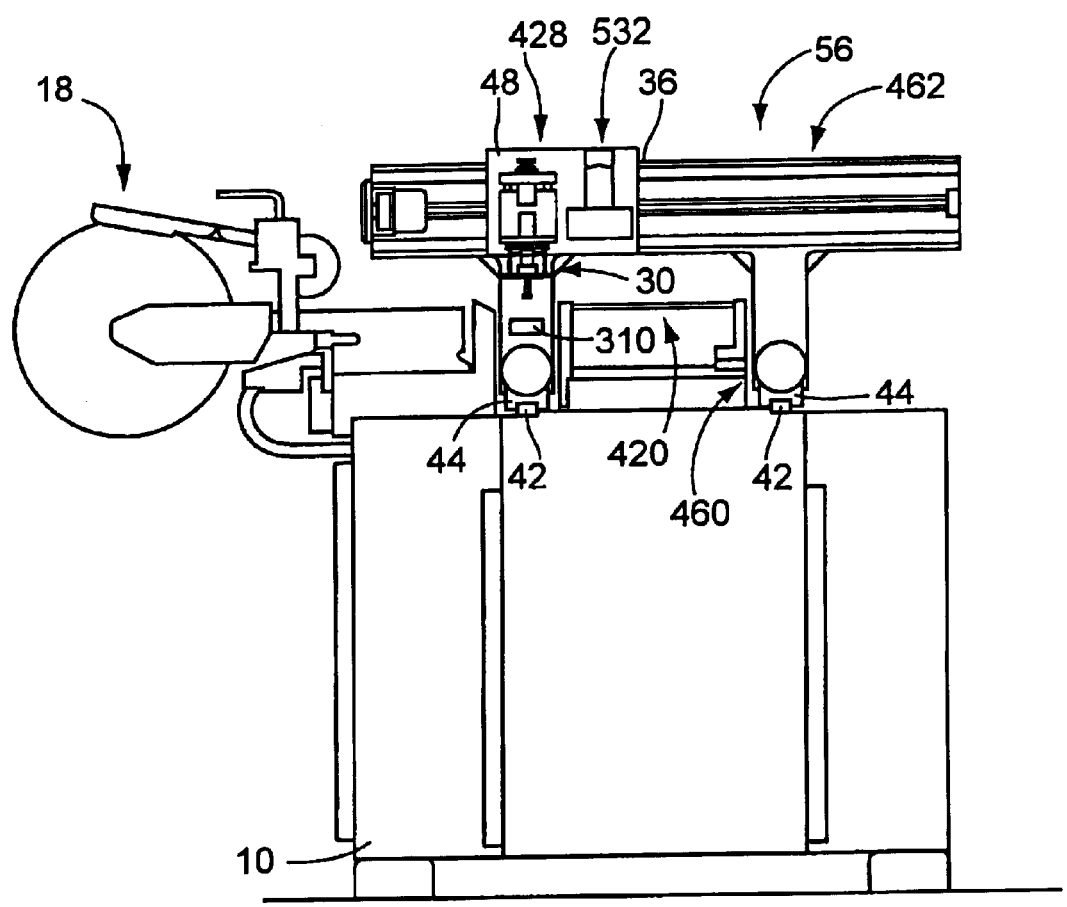
FIG. 14 is a side elevational view of the electric-component mounting system of FIG. 13.

As shown in FIGS. 13 and 14, a component imaging system 700 is attached to the X-axis slide 36 such that the component imaging system 700 is located at the Y-axis position of the ballscrew 34 disposed between the component supply device 18 and the conveyors 540, 542, 544. The component imaging system 700 is constructed as disclosed in JP-A-2001-16013.

As shown in FIG. 15, the component imaging system 700 includes an imaging device 702 and an illuminating device 704. In the present embodiment, the imaging device 702 includes a component camera 706 arranged to take an image of the electric component 32, and a light guiding device 708 having a light reflecting device including reflecting mirrors 710, 712. The reflecting mirrors 710, 712 are fixed via a bracket (not shown) to a lower portion of the X-axis slide 36, and the component camera 706 is fixed by a holder member 716 to the X-axis slide 36 such that the component camera 706 faces downwards. Like the fiducial-mark camera 534, the component camera 706 is a CCD camera arranged to taken a two-dimensional image of the object.

The illuminating device 704 is arranged to selectively emit a ultraviolet radiation and a visible radiation toward the suction nozzle 70. The light-emitting plate 520 attached to the suction nozzle 70 absorbs the ultraviolet radiation emitted from the illuminating device 704, and emits the visible radiation. When the component camera 706 is operated to take the image of the electric component 32, the component-mounting unit 428 is moved by the XY robot 56 to a Y-axis position which corresponds to the above-indicated ballscrew 34 and which is right above the reflecting mirror 710. The component camera 706 takes either a normal image or a projection or silhouette image of the object, depending upon the radiation generated by the illuminated device 704.

Figure 18:
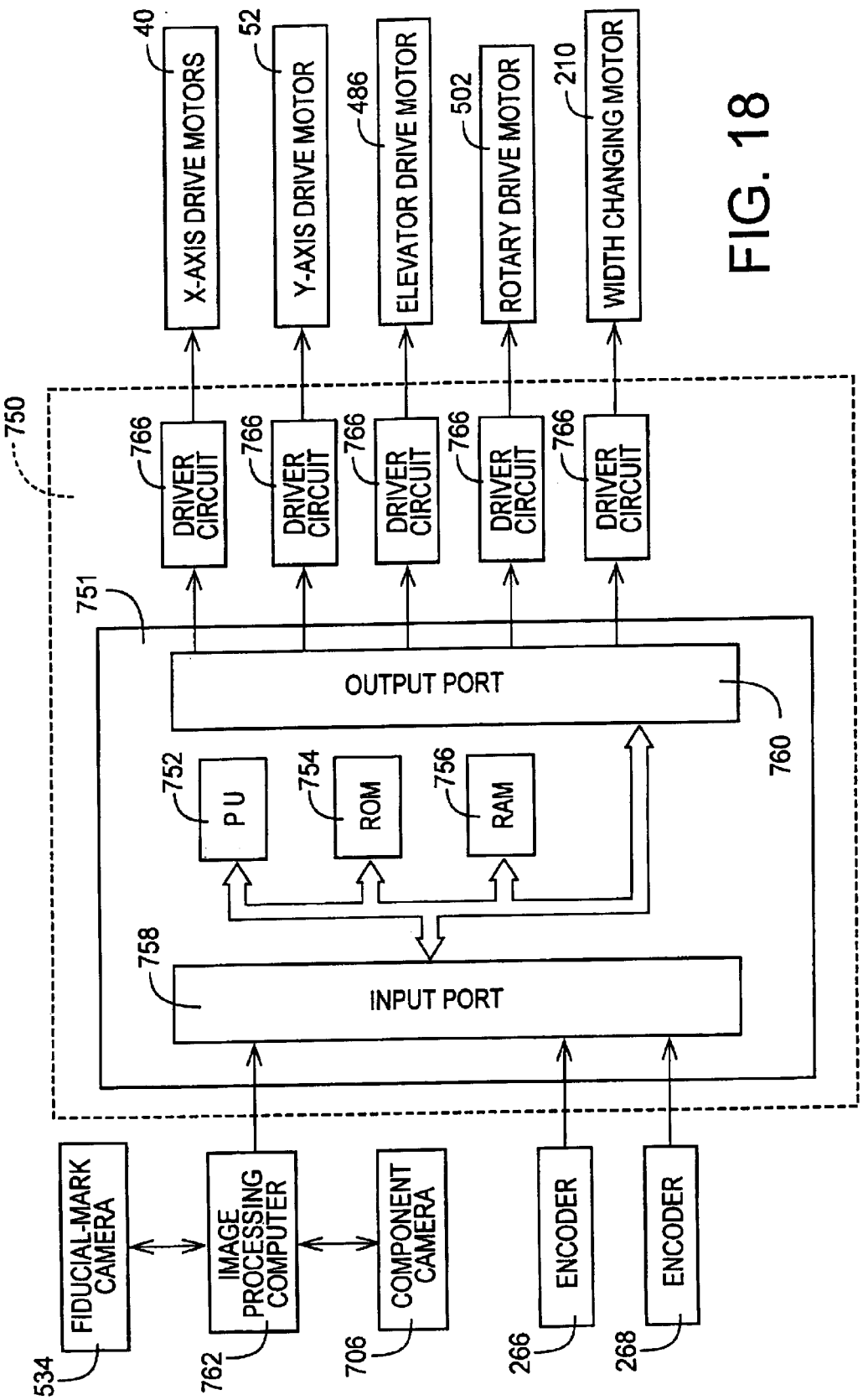
FIG. 18 is a block diagram schematically showing a control device of the electric-component mounting system for controlling its operation.

The electric-component mounting system according to the present fifth embodiment of the invention is provided with a control device 750 shown in FIG. 18. The control device 750 is principally constituted by a computer 751 incorporating a processing unit (PU) 752, a read-only memory (ROM) 754, a random-access memory (RAM) 756, an input port 758 and an output port 760, which are interconnected to each other by a bus.

To the input port 758, there are connected an image processing computer 762, the encoders 266, 268 described above with respect to the first embodiment, and various detectors or sensors and computers. To the output port 760, there are connected through respective driver circuits 366 the X-axis drive motors 40, Y-axis drive motor 52, elevator drive motor 486, rotary drive motor 502 and width changing motor 210. The RAM 756 stores various control programs and data, such as a program for executing a conveyor width changing routine illustrated in the flow chart of FIG. 19. The electric-component mounting system is operated under the control of the control device 750 according to the control programs, to perform an automatic component-mounting operation for mounting the electric components 32 on the printed-wiring board 24.

As described above with respect to the first embodiment, the X-axis and Y-axis drive motors 40, 52 and other drive motors except the width changing motor 310 are servomotors in this fifth embodiment, too, but may be stepping motors. The operating angles of the servomotors 40, 52 are controlled on the basis of the output signals of the encoders 266, 268, respectively.

There will be described the operation of the thus constructed electric-component mounting system to mount the electric components 32 on the printed-wiring board 24. Before the component-mounting operation is initiated, the widths of the main, upstream and downstream conveyors 540, 542, 544 are adjusted to the desired value corresponding to the width dimension of the board 24 on which the electric components 32 are to be mounted. That is, the distance between the stationary and movable guide rails 110, 112 is changed by the width changing device 214, to establish the desired width of the conveyors 540, 542, 544, which is suitable for feeding the board 24 having the specific width dimension as measured in the Y-axis direction (perpendicular to the X-axis direction or the direction of feeding of the board 24). Since the widths of the main, upstream and downstream conveyors 540, 542, 544 are changed in substantially the same manner, the manner of changing the width of the main conveyor 540 will be described by way of example.

To change the width of the main conveyor 540, a reference board having a known reference width is loaded onto the main conveyor 140, and the distance between the guiding surfaces 172 of the guide rails 110, 112 is adjusted to a value suitable for the reference board. In this condition, the initial position (hereinafter referred to as "reference rail position") of the fiducial mark 670 of the movable guide rail 112 is obtained. A desired Y-axis position of the movable guide rail 112 to establish the desired with of the main conveyor 540 is determined on the basis of the thus obtained reference rail position (initial position of the fiducial mark 670), the reference width of the reference board and the width of the printed-wiring board 24 in question. The movable guide rail 112 is then automatically moved so that the fiducial mark 670 is located at the determined desired Y-axis position. The reference board may be one of different kinds of the printed-wiring board 24, or a board designed exclusively for the adjustment of the width of the main conveyor 540. In the present embodiment, the reference board (not shown) is a rectangular board similar to the board 24. To change the width of the main conveyor 540, the reference board is supported in place by the main conveyor 540. Two or more reference boards having respective different width dimensions may be prepared. In this case, one of the reference boards the width of which is equal or close to the width of the board 24 in question is selected and used.

The reference rail position indicated above is obtained prior to the initiation of a component mounting operation, for instance, prior to an initial inspection of the electric-component mounting system. To obtain the reference rail position, the width changing motor 210 is manually operated by the operator in an inching mode, to move the movable guide rail 112 to a suitable position, and the reference board is placed on the pair of endless belts 124 of the main conveyor 540. In this condition, the width of the main conveyor 540 is adjusted such that the distance between the guiding surfaces 172 is suitable for the reference width of the reference board, more precisely, such that there exist a suitable amount of gaps between the guiding surfaces 172 and the opposite side faces of the reference board. Thus, the width of the main conveyor 540 is adjusted to a known initial value corresponding to the known reference width of the reference board. Described more specifically, the movable guide rail 112 is moved to adjust the width of the main conveyor 540 to the known initial value which is a sum of the known reference width of the reference board and a total amount of gaps between the guiding surfaces 172 and the side faces of the reference board.

After the movement of the movable guide rail 112 to establish the known initial width of the main conveyor 540 corresponding to the reference width of the reference board, the fiducial-mark camera 534 is moved by the XY robot 56, to take an image of the fiducial mark 670. This movement of the fiducial-mark camera 534 is effected by manual inching operations of the X-axis and Y-axis drive motors 40, 52 by the operator. The camera 534 is moved to a position at which the position of the image of the fiducial mark 670 taken by the camera 534 is located at a predetermined position within the imaging area of the camera 534, for example, to a position at which the center position of the taken image of the fiducial mark 670 is located at the center of the imaging area. This position of the fiducial-mark camera 534 is the reference rail position indicative of the position of the fiducial mark 670 on the movable guide rail 112. Described in detail, the reference rail position is represented by the output signals of the encoders 266, 268 which represent the operating angles or amounts of the X-axis and Y-axis drive motors 40, 52 and which are generated when the center of the image of the fiducial mark 670 is aligned with the center of the imaging area of the fiducial-mark camera 534. Data indicative of the reference rail position are stored in the RAM 756.

Then, the desired Y-axis positions of the movable guide rails 112 are determined for all of the different types of the printed-wiring board 24 which have respective different width dimensions and on which the electric components 32 are to be mounted in the present electric-component mounting system. The determined desired Y-axis positions are stored in the RAM 756, in relation to the respective different types of the board 24. The desired Y-axis position of the movable guide rail 112 for each type of the board 24 is spaced apart from the reference rail position in the Y-axis direction by a distance equal to a difference between the reference width of the reference board and the actual width of the board 24 of each type. The desired Y-axis position is represented by the position of the fiducial mark 670 on the movable guide rail 112, which position is represented by the output signals of the encoders 266, 268 representative of the operating amounts of the X-axis and Y-axis drive motors 40, 52. Data indicative of the desired Y-axis position are stored in the RAM 756.

There will be described a manner of changing the width of the main conveyor 540, by reference to the flow chart of FIG. 19. Initially, the fiducial-mark camera 534 is operated to take the image of the fiducial mark 670, for obtaining the present Y-axis position of the movable guide rail 112, and determining the distance and direction of movement of the movable guide rail 112 to the determined desired Y-axis position. Then, the movable guide rail 112 is moved to the desired Y-axis position by the width changing device 214. To this end, the fiducial-mark camera 534 is first moved to the desired Y-axis position before the movable guide rail 112, to take the image of the fiducial mark 670. When the position of the image of the fiducial mark 670 taken by the camera 534 has been aligned with the center of the imaging area of the camera 534, it is determined that the movable guide rail 112 has reached a position close to the desired Y-axis position. At this time, the movable guide rail 112 is decelerated, and is then stopped at the desired Y-axis position.

Figure 19:
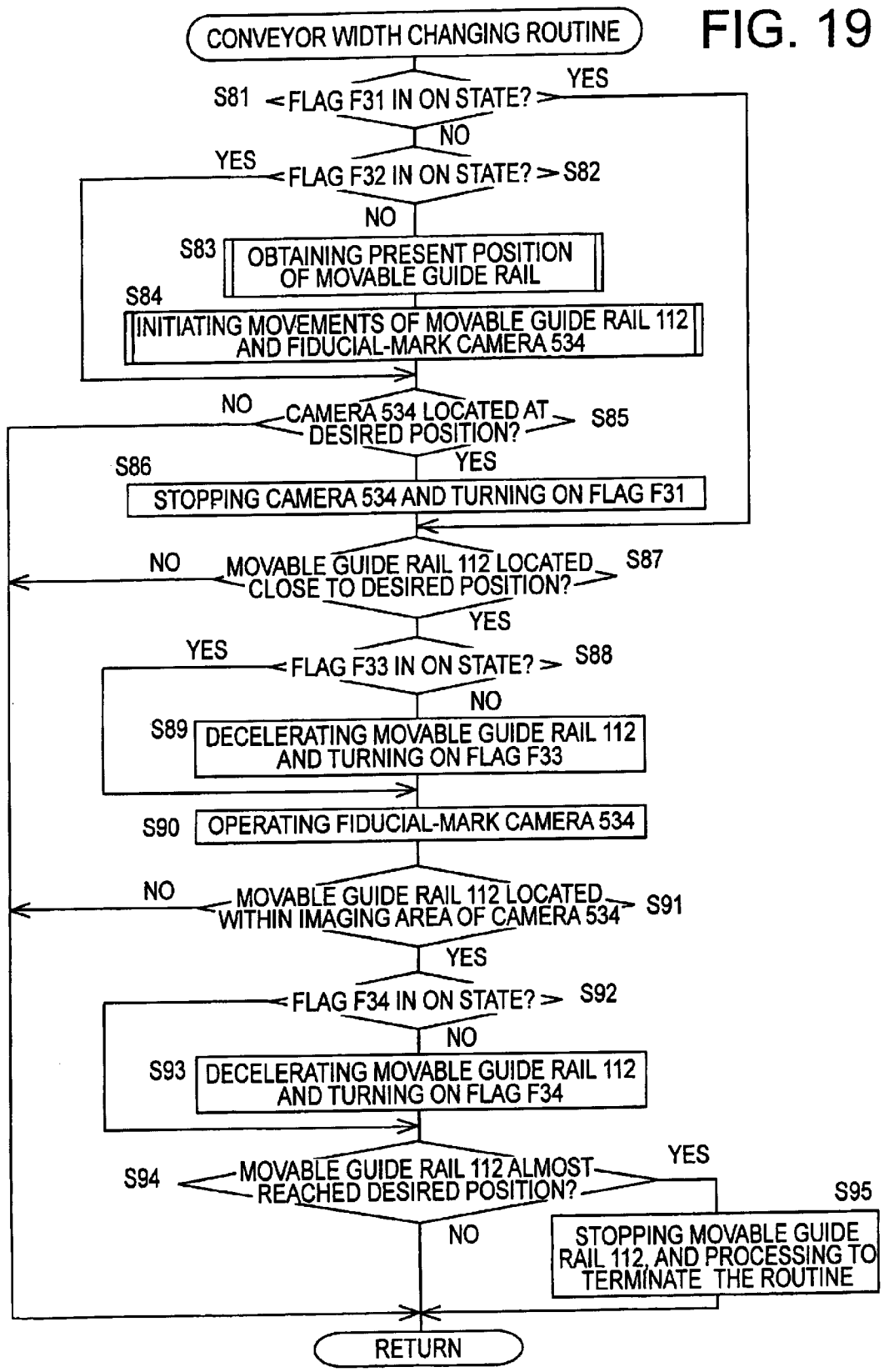
FIG. 19 is a flow chart illustrating a conveyor-width changing routine executed according to a control program stored in a RAM of the computer according to the fifth embodiment.

The conveyor width changing routine of FIG. 19 is initiated with step S81 to determine whether a flag F31 is placed in an ON state. Since the flag F31 is reset to an OFF state upon initialization in a main control routine (not shown), a negative decision (NO) is initially obtained in step S81, and the control flow goes to step S82 to determine whether a flag F32 is placed in an ON state. Since flag F32 is also reset to an OFF state upon initialization, a negative decision (NO) is obtained in step S82, and the control flow goes to step S83 to obtain the present position of the movable guide rail 112.

The present position of the movable guide rail 112 is obtained on the basis of the image of the fiducial mark 670 taken by the camera 534 located at the desired Y-axis position of the movable guide rail 112 for the last type of the printed-wiring board 24 on which the component mounting operation was performed. To this end, the position data representative of the desired Y-axis position of the movable guide rail 112 for the last type of the printed-wiring board 24 are read out from the RAM 756. According to the read-out position data, the fiducial mark camera 534 is moved by the XY robot 56. The Y-axis position of the movable guide rail 112 is represented by the value of the output signal of the encoder 268. When the value of the output signal of the encoder 268 has become equal to a value corresponding to the desired Y-axis position, the fiducial-mark camera 534 has reached the desired Y-axis position so that the center of the imaging area of the camera 534 is located at the desired Y-axis position. In this state, the image of the fiducial mark 670 is taken by the camera 534. When the width of the main conveyor 540 is adjusted for the first type of the printed-wiring board 24, the movable guide rail 112 is located at the reference rail position for the reference board described above. In this case, therefore, the image of the fiducial mark 270 of the movable guide rail 112 located at the reference rail position is taken by the fiducial-mark camera 534, to obtain the present position of the movable guide rail 112 in step S83.

Image data representative of the image of the fiducial mark 670 taken by the fiducial-mark camera 534 are processed by the image processing computer 762, which store various kinds of information of the image of the fiducial mark 670, such as shape, size and color of the mark. The image processing computer 762 defines the center of the image of the fiducial mark 670 as the position of the movable guide rail. 112. Described more specifically, the image processing computer 762 obtains the center position of the image of the fiducial mark 670 relative to the center of the imaging area of the camera 534, and provides the computer 751 with data representative of the position of the movable guide rail 112. On the basis of the present position and the desired Y-axis position of the movable guide rail 112, the computer 751 obtains the value of the output signal of the encoder 268 which corresponds to the center of the fiducial mark 670, namely, the present position of the movable guide rail 112. The image processing computer 762 may store position data representative of the desired Y-axis positions of the movable guide rail 112 for the various types of the board 24. In this case, the image processing computer 762 can obtain the value of the output signal of the encoder 268 corresponding to the present position of the movable guide rail 112 (center position of the fiducial mark 670) established for the last type of the board 24, so that the computer 751 receives the present position from the image processing computer 762.

After the present position of the movable guide rail 112 is obtained, the control flow goes to step S84 to initiate movements of the movable guide rail 112 and the fiducial-mark camera 634 to the desired Y-axis position of the movable guide rail 112 for the present type of the board 24 which is to be loaded onto the main conveyor 540. The fiducial-mark camera 534 is moved until the values of the output signals of the encoders 266, 268 have become equal to the values corresponding to the desired position of the movable guide rail 112, that is, until the center of the image of the fiducial mark 670 has been moved to the desired Y-axis position which is spaced apart from the reference rail position in the Y-axis direction by a distance equal to a difference between the reference width of the reference board and the width of the present type of the board 24 in question. The distance and direction of the movement of the movable guide rail 112 are determined on the basis of the desired Y-axis position for the present type of the board 24 and the present position of the guide rail 112. The movable guide rail 112 is moved in the determined direction by the determined distance by the width changing device 214. More specifically, the width changing motor 210 is operated to move the movable guide rail 112 until the fiducial mark 670 has been located at the desired Y-axis position which is determined by the reference rail position, the reference width of the reference board, and the width of the board 24 which is to be loaded onto the main conveyor 540. In step S84, the flag F32 is set to the ON state.

Step S84 is followed by step S85 to determine whether the fiducial-mark camera 534 has reached the desired Y-axis position. In this respect, it is noted that the camera 534 is moved at a higher speed than the movable guide rail 112, so that the camera 534 reaches the desired Y-axis position before the movable guide rail 112. A negative decision (NO) is obtained in step S85 until the camera 534 has reached the desired Y-axis position. One cycle of execution of the present routine is terminated when the negative decision is obtained in step S85.

When step S82 is implemented in the next cycle of execution of the routine, an affirmative decision (YES) is obtained in step S82, and the control flow goes to step S85 while skipping steps S83 and S84. Steps S81, S82 and S85 are repeatedly implemented until the fiducial-mark camera 534 has reached the desired Y-axis position. When an affirmative decision (YES) is obtained in step S85, the control flow goes to step S86 to stop the movement of the camera 534 and turn on the flag F31.

Then, the control flow goes to step S87 to determine whether the movable guide rail 112 has reached a first predetermined position close to the desired Y-axis position. This determination is effected by determining whether a predetermined time has passed after the moment of initiation of the movement of the movable guide rail 112 from the present position toward the desired Y-axis position. This predetermined time is shorter than a time required for the movable guide rail 112 to reach the desired Y-axis position, and is a predetermined ratio of this required time, which ratio corresponds to the above-indicated first predetermined position close to the desired Y-axis position. The predetermined time is determined on the basis of the distance between the present and desired Y-axis positions of the movable guide rail 112, and the pattern of control of the speed of the movement to the desired Y-axis position. A negative decision (NO) is initially obtained in step S87, and one cycle of execution of the present routine is terminated.

Steps S81 and S87 are repeatedly implemented until the movable guide rail 112 has reached the position close to the desired Y-axis position. If an affirmative decision (YES) is obtained in step S87, the control flow goes to step S88 to determine whether a flag F33 is placed in an ON state. Since this flag F33 is also reset to an OFF state upon initialization, a negative decision (NO) is initially obtained in step S88, and the control flow goes to step S89 to decelerate the movable guide rail 112, that is, to reduce the speed of movement of the movable guide rail 112, and turn ON the flag F33.

Step S90 is then implemented to operate the fiducial-mark camera 534 to take the image of the fiducial mark 670. Image data representative of the taken image are processed by the image processing computer 762, and a result of the processing of the image data is supplied to the computer 751. The control flow then goes to step S91 to determine whether the fiducial mark 670 on the movable guide rail 112 has entered the imaging area of the camera 534, namely, has reached a position so close to the desired Y-axis position so that the fiducial mark 670 can be taken by the camera 534. This determination is effected by determining whether the image of the fiducial mark 670 is taken by the camera 534, more precisely, whether the ratio of the area of a partial image of the fiducial mark 670 within the imaging area, to the entire area of the fiducial mark 670, has exceeded a predetermined threshold value. Alternatively, the determination may be effected by determining whether the entire image of the fiducial mark 670 is located within the imaging area of the camera 534, or whether the center of the partial or entire image of the fiducial mark 670 is located within the imaging area. A negative decision (NO) is initially obtained in step S91, and one cycle of execution of the present routine is terminated.

Steps S81, S87, S88, S90 and S91 are repeatedly implemented until the image of the fiducial mark 670 is taken by the camera 534. That is, an affirmative decision (YES) is obtained in step S11 when the fiducial mark 670 of the movable guide rail 112 has moved into the imaging area of the camera 534. In this case, the control flow goes to step S92 to determine whether a flag F34 is placed in an ON state. Since a negative decision (NO) is initially obtained in step S92, the control flow goes to step S93 to decelerate the movable guider ail 112, that is, to reduce the speed of the movement of the movable guide rail 112, and turn ON the flag F34.

Step S94 is then implemented to determine whether the movable guide rail 112 has almost reached the desired Y-axis position, that is, has reached a second predetermined position which is spaced apart from the desired Y-axis position by a predetermined short distance. This distance is determined such that the movable guide rail 112 is moved due to inertia and stopped with its fiducial mark 670 located at the desired Y-axis position, if the width changing motor 210 is commanded to be turned off when the movable guide rail 112 has reached the above-indicated second predetermined position spaced apart from the desired Y-axis position. Since the movable guide rail 112 has been decelerated at the first predetermined position close to the desired Y-axis position, the movable guide rail 112 can be stopped at the desired Y-axis position by commanding the width changing motor 210 when the movable guide rail 112 has reached the second predetermined position closer to the desired Y-axis position. The determination in step S94 as to whether the movable guide rail 112 has almost reached the desired Y-axis position is effected by determining whether the center of the image of the fiducial mark 670 taken by the camera 534 has reached a position which is spaced apart from the center of the imaging area by the predetermined short distance indicated above. A negative decision (NO) is initially obtained in step S94, and one cycle of execution of the routine is terminated.

Steps S81, S87, S88, S90–S92 and S94 are repeatedly implemented until the movable guide rail 112 has almost reached the desired Y-axis position. When an affirmative decision (YES) is obtained in step S94, the control flow goes to step S95 to turn off the width changing motor 210, reset the flags F31–F33 to the OFF state and perform other processing operations to terminate the present routine. Thus, the movable guide rail 112 is stopped at the desired Y-axis position which is determined by the reference rail position, the reference width of the reference board and the width of the present type of the board 24 (which is to be loaded onto the main conveyor 540) and at which the image of the fiducial mark 670 taken by the camera 534 is aligned with the center of the imaging area of the camera 534. The movable guide rail 112 is moved to the desired Y-axis position by the width changing device 214, to establish the width of the main conveyor 540 suitable for feeding and guiding the type of the board 24 on which the electric components 32 are to be mounted.

As described above, the fiducial-mark camera 534 reaches the desired Y-axis position before the movable guide rail 112, and takes the image of the fiducial mark 670, and the movable guide rail 112 is stopped at the desired Y-axis position at which the center of the image of the fiducial mark 670 is located at the center of the imaging area of the camera 534. Thus, the width of the main conveyor 540 is changed to the value suitable for the present type of the printed-wiring board 24 to be loaded onto the main conveyor 540. It is possible to take the image of the fiducial mark 670 after the movable guide rail 112 is stopped, for checking if the actual position of the movable guide rail 112 is located at the desired Y-axis position, and correcting the actual position by moving the movable guide rail 112 in the appropriate direction by a suitable distance, if the actual position deviates from the desired position. It is also possible to check if the width of the main conveyor 540 has been changed to the desired value, on the basis of the Y-axis position of the movable guide rail 112.

The widths of the upstream and downstream conveyors 542, 544 can be changed, in the same manner as described above with respect to the main conveyor 540. Initially, the width of the conveyors 542, 544 is changed to the known initial value, by using the reference board. Then, the desired Y-axis position of the movable guide rail 112 is determined, and the present position of the movable guide rail 112 is obtained on the basis of the positions of the images of the fiducial marks 680, 682 taken by the fiducial-mark camera 534. Then, the movable guide rail 112 is moved from the present position to the desired position. The widths of the three conveyors 540, 542, 544 may be changed one after another, in a suitable order depending upon the situation, or in the predetermined order. The widths of the three conveyors 542, 544 are changed to the same value, that is, matched with each other, so that the printed-wiring board 24 can be smoothly fed from the upstream conveyor 542 onto the main conveyor 540, and unloaded onto the downstream conveyor 544. The movable rails 112 of the conveyors 540, 542, 544 are moved to the desired Y-axis position to establish the width of the conveyors 540, 542, 544 suitable for the width of the present type of the board 24 in question. The movement of the movable guide rail 112 of each conveyor is stopped on the basis of the image of the fiducial mark 670, 680, 682 taken by the camera 534, so that the guide rails 112 of the three conveyors 540, 542, 544 are located at the same Y-axis position for establishing the desired conveyor width for the board 24 in question. After the guide rails 112 of the three conveyors 540, 542, 544 have been moved to the desired Y-axis position, the actual Y-axis positions of these guide rails 112 may be checked for matching with each other, by taking the images of the fiducial marks 670, 680, 682. If the actual Y-axis positions are not well matched with each other due to a deviation of the position of any of the guide rails from the desired position, the deviation is eliminated by further adjusting the actual Y-axis position or positions of the appropriate guide rail or rails 112.

When the electric components 32 are mounted on the printed-wiring board 24 in the present electric-component mounting system, the upstream conveyor 542 receives the board 24 from a suitable board supply device (not shown), or another substrate working system located upstream of the present system, such as an adhesive coating system or a screen printing system. If the leading or preceding board 24 is not present on the main conveyor 540, the board received by the upstream conveyor 542 is fed directly onto the main conveyor 540, and stopped at the predetermined stop position by the stopping device 620. If the leading board 24 is present on the main conveyor 540, the board received by the upstream conveyor 540 is stopped at the predetermined stop position by the stopping device 694, and remains on the upstream conveyor 542 until the board 24 on the main conveyor 540 is unloaded onto the downstream conveyor 544. Thus, the upstream conveyor 542 functions as a buffer or standby conveyor. Upon completion of a component-mounting operation to mount the electric components 32 on the leading board 34 on the main conveyor 540, this preceding board 24 is fed onto the downstream conveyor 544, and the trailing board 24 is fed from the upstream conveyor 542 onto the main conveyor 540.

The board 24 is stopped by the stopping device 620, and supported by the support members of the printed-wiring-board support device 626 such that the board 24 is raised from the endless belts 124 and is forced at its widthwise opposite portions by the clamping members of the support device 626, into pressing contact with the presser portions 174 of the guiding members 170. Thus, the board 24 is clamped on the main conveyor 540. The clamping members and the presser portions 174 cooperate to constitute a clamping device for clamping the board 24.

In this condition, the fiducial-mark camera 534 is moved by the XY robot 30, to take images of the two fiducial marks 530 provided on the board 24. Image data representative of the taken images are processed to obtain a positioning error of the board 24 as held by the printed-wiring-board support device 626, for thereby obtaining X-axis and Y-axis positioning errors of a multiplicity of component mounting spots or areas on the board 24 in the XY plane. The component mounting head 30 is moved by the XY robot 56 to receive the electric components 32 from the tape feeders 422 of the component supply device 18. If the angular position of the electric component 32 as held by the suction nozzle 70 is different from the angular position in which the electric component 32 is mounted on the board 24, the suction nozzle 70 is rotated by the rotary drive device 64 so that the electric component 32 can be mounted in the predetermined angular position on the board 24.

Then, the movement of the component mounting head 30 toward the board 24 is initiated, and the movement is temporarily stopped when the electric component 32 has reached the position of the reflecting mirror 710 of the component-imaging system 700. At this position, the image of the electric component 32 is taken by the component camera 706. Positioning errors (center position error and angular position error) of the electric component 32 as held by the suction nozzle 70 are detected on the basis of image data representative of the image of the electric component 32, and the XY position and angular position of the component mounting head 30 are compensated for the detected positioning errors, before the electric component 32 is eventually mounted on the board 24. The center position error is eliminated by changing the distance of movement of the component mounting head 30 by the XY robot 56 to the nominal mounting spot or area on the board 25, while the angular position error is eliminated by rotating the suction nozzle 70 by the rotary drive device 64. The XY position of the component mounting head 30 is compensated for not only the center position error of the electric component 32 as held by the suction nozzle 70, but also the X-axis and Y-axis positioning errors of the mounting spot on the board 24, and a center position error of the electric component 32 which is caused by rotation of the suction nozzle 70 to eliminate the angular position error.

The board 24 on which all of the electric components 32 have been mounted as intended is unloaded from the main conveyor 540 onto the downstream conveyor 544, and is fed from the downstream conveyor 544 onto a substrate working system located downstream of the present system, such as an inspecting system for inspecting the states of the electric components 32 as mounted by the present system, or a solder re-flow system, or onto a board receiving device. If the downstream system is not ready to receive the board 24 from the downstream conveyor 544, the board 24 is stopped at the predetermined stop position by the stopping device 696 and remains on the downstream conveyor 544 until the downstream system becomes ready to receive the board 24. Thus, the downstream conveyor 544 also functions as a buffer or standby conveyor. In the meantime, the new board 24 is loaded onto the main conveyor 540, for mounting the electric components 32 on this board 24. Thus, thee boards 24 are successively fed from the upstream conveyor 542 to the downstream conveyor 544, by operations of the feeding devices 164 of the individual conveyors 542, 540, 544, while being guided at their opposite side faces by the guiding surfaces 172 of the stationary and movable guide rails 110, 112.

In the electric-component mounting system according to the present fifth embodiment of the invention described above, the width changing motor 210 of the width changing device 214 cannot be controlled of its operating angle or amount, but is available at a comparatively low cost so that the cost of the width changing device 214 is accordingly reduced. However, the width of the conveyors 540, 542, 544 can be changed with high accuracy, by utilizing the fiducial-mark camera 534 which is moved by the XY robot 56 using the Y-axis drive motor 52 the operating angle of which can be controlled with high accuracy. In addition, the desired Y-axis position of the movable guide rail 112 for each type of the board 24 is determined on the basis of the reference rail position obtained by using the reference board having the known reference width. Accordingly, the change of the width of the conveyors 540, 542, 544 does not suffer from a cumulative error of the Y-axis position of the movable guide rail 112, even where the width of the conveyors is changed each time the type of the board 24 is changed. Accordingly, the conveyor width can be changed with high accuracy.

As described above, the present position of the movable guide rail 112 is obtained by moving the fiducial-mark camera 534 to the desired Y-axis position corresponding to the last type of the board 24 on which the component mounting operation was finished. If the image of the fiducial mark 670 cannot be taken by the camera 534 thus located at the desired Y-axis position, a suitable alarm or indicator device may be activated to provide a suitable signal informing that the movable guide rail 112 is not located at the desired Y-axis position set for the last type of the board 24. Alternatively, the fiducial-mark camera 534 may be moved to search the position of the movable guide rail 112, more precisely, to search the fiducial mark 670 on the guide rail 112. For example, the camera 534 is intermittently moved by a predetermined distance in the X-axis and Y-axis direction, and operated to try to take the image of the fiducial mark 670 at the end of each intermittent motion, until the fiducial mark 670 is detected. The present position of the movable guide 112 is obtained on the basis of the image of the fiducial mark 670 taken by the camera 534. If the mark 670 cannot be detected or imaged by the camera 534, a suitable alarm or indicator device may be activated to indicate that the present system is defective.

In the present embodiment, the speed of movement of the movable guide rail 112 toward the desired Y-axis position is reduced in two steps in steps S89 and S93. However, the speed of movement of the movable guide rail 112 may be reduced only once before the movable guide rail 112 reaches the desired Y-axis position. Further, the movable guider rail 112 may be moved to and stopped at the above-indicated second predetermined position closer to the desired Y-axis position, without any deceleration during the movement. The camera 534 may reach the desired Y-axis position before or after the movable guide rail 112, provided that the camera 534 is operated to take the image of the fiducial mark 670 after stopping of the movable guide rail 112, so that the determination as to whether the conveyor width has been adjusted to the desired value for the present type of the board 24 in question is made on the basis of the center position of the image of the fiducial mark 670 relative to the imaging area of the camera 534. If the center of the image is not aligned with the center of the imaging area, it means that the conveyor width is not suitable for the width of the board 24 in question. In this case, the width changing device 214 is operated again to move the movable guide rail 112 to re-establish the conveyor width.

It is possible to first move the movable guide rail 112 by a predetermined distance and stop the movable guide rail 112 at a predetermined position spaced apart from the desired Y-axis position in the direction from the stationary guide rail 110 toward the movable guide rail 112, and then intermittently move the guide rail 112 toward the desired Y-axis position. In this case, the fiducial-mark camera 534 is operated to try to take the image of the fiducial mark 670 at the end of each intermittent motion of the movable guide rail 112, for eventually confirming that the movable guide rail 112 has reached the desired Y-axis position.

The desired Y-axis positions of the movable guide rails 112 for the different types of the board 24 may be determined before the component mounting operation. Alternatively, the desired Y-axis position is determined when the type of the board 24 is changed, that is, each time the conveyor width is required to be changed upon changing of the width of the board 24. In any case, the desired Y-axis position for each type of the board 24 is determined on the basis of the reference rail position (of the movable guide rail 112), the width of the reference board and the width of the specific type of the board 24.

The width changing device 214 may use as its drive source a stepping motor the operating angle of which can be controlled. In this case, the movable guide rail 112 can be moved to the desired Y-axis position with high accuracy, by controlling the operating angle of the stepping motor, and it is not necessary to check if the desired conveyor width has been established. Referring to the flow chart of FIG. 20, there will be described a conveyor width changing routine according to a second embodiment of the invention in which a stepping motor is used as the width changing motor of the width changing device 214.

Figure 20:
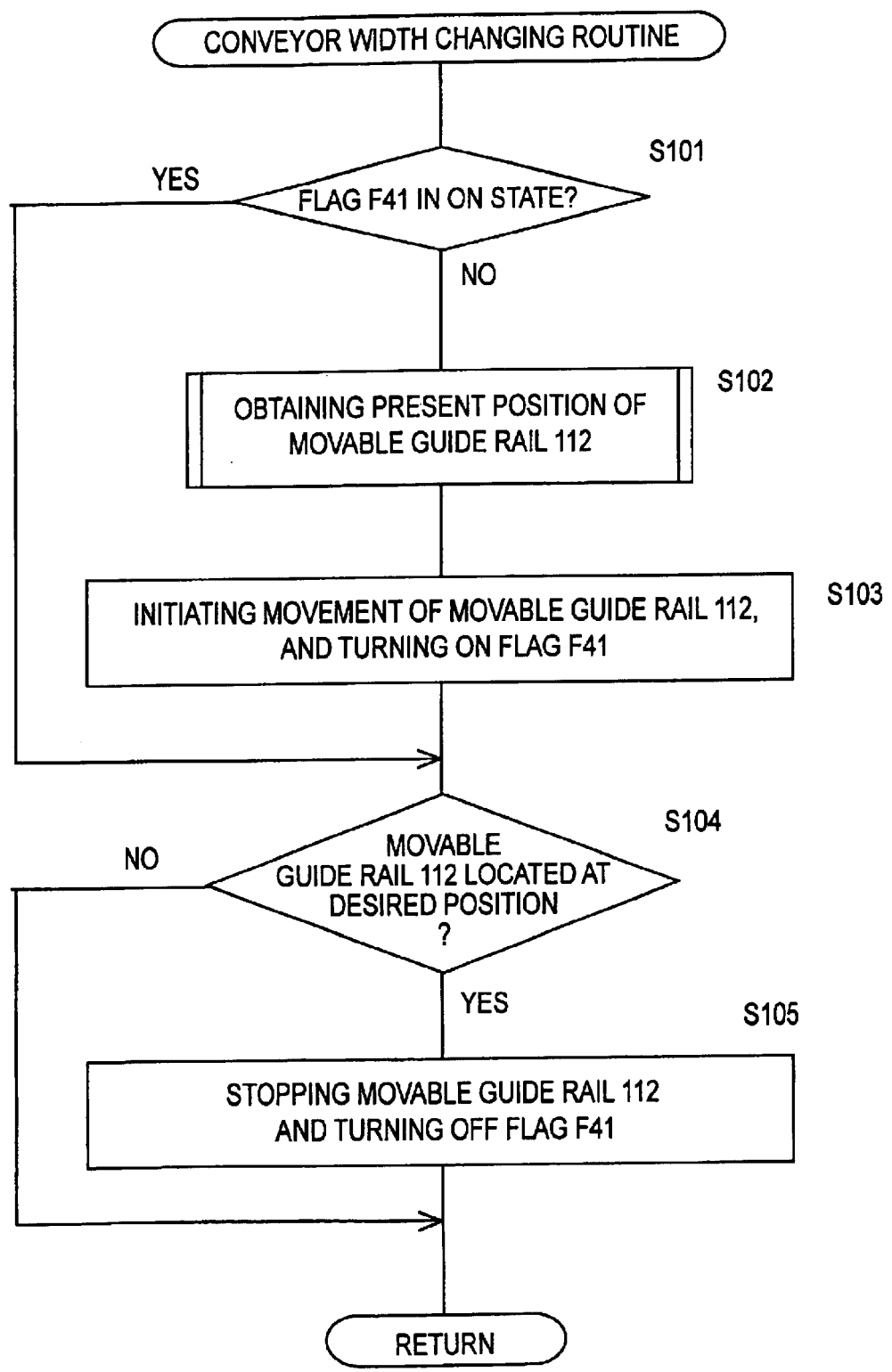
FIG. 20 is a flow chart illustrating a conveyor-width changing routine executed according to a control program stored in a RAM of a computer of a control system of an electric-component mounting system, according to a sixth second embodiment of this invention.

The width changing routine of FIG. 20 is initiated with step S101 to determine whether a flag F41 is placed in an OFF state. Since a negative decision (NO) is initially obtained in step S101, the control flow goes to step S102 to obtain the present position of the movable guide rail 112, in the same manner as in step S83. Step S103 is then implemented to initiate the movement of the movable guide rail 112 toward the desired Y-axis position and turn ON the flag F41. The distance and direction of movement of the movable guide rail 112 are determined on the basis of the obtained present position of the guide rail 112 and the desired Y-axis position for the type of the board 24 in question. The stepping motor of the width changing device 214 is controlled to move the movable guide rail 112 by the determined distance in the determined direction.

Then, step S104 is implemented to determine whether the movable guide rail 112 has reached the desired Y-axis position. This determination is effected by determining whether the stepping motor has been operated by an amount required to move the movable guide rail 112 to the desired Y-axis position. Described more specifically, the number of pulses to operate the stepping motor is counted, and the determination in step S104 is made by determining whether the number of the counted pulses has increased to a predetermined value corresponding to the above-indicated distance between the present and desired Y-axis positions of the movable guide rail 112. Initially, a negative decision (NO) is obtained in step S104, and one cycle of execution of the present routine of FIG. 20 is terminated. When the movable guide rail 112 has reached the desired Y-axis position, that is, when an affirmative decision (YES) is obtained in step S104, the control flow goes to step S105 to turn off the stepping motor for stopping the movable guide rail 112 and turn OFF the flag F41.

Like the fifth embodiment described above, the present sixth embodiment is arranged such that the conveyor width is adjusted to a value corresponding to the reference width of the reference board, before the component mounting operation on the board 24 is initiated. When the conveyor width is adjusted to a value corresponding to the width of the first type of the board 24, the movable guide rail 112 is moved from the reference rail position to the desired Y-axis position for the first type of the board 24, by operating the stepping motor by an amount or angle corresponding to a difference between the reference width of the reference board and a sum of the width of the first type of the board 24 and a suitable amount of gaps between the guiding surfaces 172 and the side faces of the board 24. Described more precisely, the stepping motor is operated by an angle corresponding to the above-indicated difference and a suitable amount of gap between the side faces of the board 24 and the guiding surfaces 172 of the guide rails 110, 112. When the conveyor width is changed to a value corresponding to the width of the second type of the board 24, the stepping motor is operated by an angle corresponding to a difference between the desired Y-axis position for the first type of the board (the obtained present position of the movable guide rail 112) and the desired Y-axis position for the second type of the board 24. These desired Y-axis positions are determined on the basis of the reference rail position, that is, the position of the movable guide rail 112 (fiducial mark 670) after the conveyor width has been adjusted to the value suitable for guiding the reference board having the reference width. Accordingly, the stepping motor is operated by an angle corresponding to the difference between the reference width and the width of the second or present type of the board 24 in question.

In the present sixth embodiment, the movable guide rail 112 is moved from the present position to the desired Y-axis position to change the conveyor width, without prior re-adjustment of the conveyor width using the reference board, once the reference rail position is obtained. While this arrangement improves the efficiency of changing the conveyor width, it is possible to re-adjust the conveyor width using the reference board, so as to obtain the reference rail position, at a suitable opportunity during the component mounting operation on the different types of the board 24. In this case, the desired Y-axis positions for the different types of the board 24 are determined on the basis of the newly obtained reference rail position. This re-adjustment of the conveyor width using the reference board may be effected each time the type of the board 24 is changed, where the component mounting operation is performed on a large number of the board 24 of the same type. Alternatively, the re-adjustment may be made when the number of the different types of the board 24 has exceeded a predetermined threshold value. Where the conveyor width is re-adjusted using the reference board, the desired Y-axis positions of the movable guide rail 112 need not be determined again on the basis of the newly obtained reference rail position, and the conveyor width is changed from the re-established width value to the value corresponding to the width of the specific type of the board 24.

Figure 21:
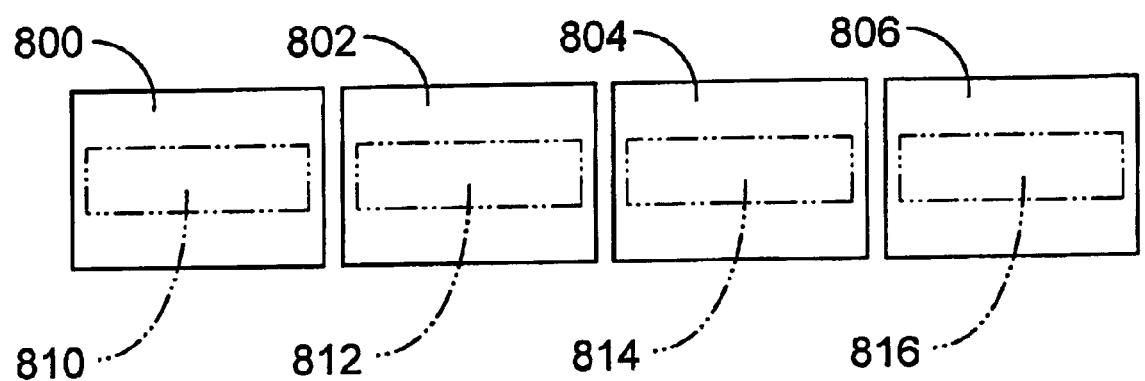
FIG. 21 is a view for explaining a method of changing the width of a printed-wiring-board conveyor and a method of matching the width of this conveyor and adjacent conveyors, according to a seventh embodiment of this invention.

The component-mounting system according to the fifth and sixth embodiments is arranged such that the plurality of conveyors 540, 542, 544 are arranged in series, and the width changing devices 214 of the system are controlled to change the widths of the individual conveyors to the same value. However, the principle of the present invention is also applicable to a plurality of substrate working systems, for instance, four substrate working systems 800, 802, 804 and 806 arranged in series in a line, as shown in FIG. 21. In this seventh embodiment of the invention, the working systems 800, 802, 804, 806 have respective conveyors 810, 812, 814 and 816, the widths of which are changed to the same value. For instance, the four working systems 800, 802, 804, 806 are respectively a screen printing system, an adhesive coating system, an electric-component mounting system, and an inspecting system. The screen printing system is arranged to apply a solder paste to a substrate through a printing screen or stencil, to produce the printed-wiring board 24, and the adhesive coating system is arranged to apply an adhesive agent to the printed-wiring board 24. The electric-component mounting system is similar to the one described above, and the inspecting system is arranged to inspect the electric components 32 mounted the printed-wiring board 24.

The conveyors 810, 812, 814 and 816 provided on the respective four systems 800, 802, 804, 806 are similar to the main conveyor 540 described above with respect to the fifth embodiment of FIGS. 13–18. Each of the four systems includes a fiducial-mark camera, a camera moving device and a working device. The printed-wiring board is intermittently fed from the system 800 toward the system 806, and the intended working operation is performed on the original substrate or the printed-wiring board in each system. The conveyor 810 of the system 800 is located upstream of the conveyor 812 of the system 802, and the conveyor 814 of the system 804 is located downstream of the conveyor 812 of the system 802. The conveyor 812 of the system 802 is located upstream of the conveyor 814 of the system 804, and the conveyor 816 of the system 806 is located downstream of the conveyor 814 of the system 804. In this embodiment, the working operations are performed on all of the upstream, intermediate and downstream conveyors 810, 812 and 814, or 812, 814 and 816.

The width of the conveyor 810, 812, 814, 816 of each of the systems 00, 802, 804, 806 is changed in the same manner as the width of the main conveyor 540 in the fifth embodiment. The movable guide rail in each system is moved to the desired Y-axis position corresponding to the width of the printed-wiring board on which the working operation is to be performed in the system in question, so that the widths of the conveyors 810–816 are matched with each other.

Any one of the four systems 800–806 may be provided with a plurality of conveyors, the widths of which are changed to the same value.

The present invention is also applicable to a system not including a working device operable to perform a working operation on a circuit substrate. For instance, the present invention is applicable to a substrate supply system arranged to load circuit substrates onto a working system, or a substrate receiving system arranged to receive the circuit substrate from a working system.

Although each of the fiducial-mark imaging system 532 and the component imaging system 700 used in the fifth through seventh embodiments is arranged to take a two-dimensional image of the object at one time, the image-taking device may be a line sensor having a straight array of multiple imaging elements, which is moved relative to the object to take multiple line images one after another, so that the multiple line images cooperate to form a two-dimensional image of the object. Where the line sensor is used, the line sensor is moved by a suitable feeding device, to take an image of a fiducial mark, which is used to control the width changing device.

In the fifth through seventh embodiments, the fiducial mark 670 is taken by the fiducial-mark camera 534 after the conveyor width is changed to a value corresponding to the reference width of the reference board. At this time, the camera 534 is manually moved to the position of the fiducial mark 670 by the operator by inching the X-axis and Y-axis drive motors 40, 52. However, at least a part of the movement of the camera 534 to the position of the fiducial mark 670 may be automatically effected. For instance, the camera 534 is automatically moved by the XY robot 56 to a predetermined position close to the position of the fiducial mark 670. In this case, the camera 534 is manually moved from this predetermined position to the position of the mark 670 until the image of the mark 670 has reached a predetermined position within the imaging area of the camera 534. Alternatively, the camera 534 is automatically moved all the way to the position of the fiducial mark 670. Since the reference width of the reference board is known, the position of the fiducial mark 670 may be obtained from the reference width, so that the camera 534 can be automatically moved by the XY robot 56 to the position of the fiducial mark 670 or to the predetermined position close to the fiducial mark.

It will be understood that the principle of the present invention is equally applicable to a substrate working system having only one variable-width substrate conveyor.

While the presently preferred embodiments of this invention have been described in detail, for illustrative purpose only, it is to be understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. A method of changing a width of a variable-width substrate conveyor including (a) a pair of guide rails, (a) a feeding device for feeding a circuit substrate along the guide rails, (b) a pair of guide rails having respective guiding surfaces for guiding opposite side faces of the circuit substrate being fed by the feeding device, in a longitudinal direction of said pair of guide rails, and (c) a width changing device for moving said pair of guide rails relative to each other toward or away from each other, to change a distance between the pair of guide rails, for thereby changing the width of the variable-width substrate conveyor, said method comprising:

an image-taking step of operating an image-taking device to take an image of a portion of at least one of said pair of guide rails; and a controlling step of controlling said width changing device on the basis of the image taken by said image-taking device.

2. A method according to claim 1, wherein said pair of guide rails consist of a stationary guide rail fixed in position and a movable guide rail which is movable toward and away from said stationary guide rail, wherein said image-taking step comprises a movable-guide-rail detecting step of operating said image-taking device to take an image of a portion of said movable guide rail, and detecting a position of the movable guide rail on the basis of the image taken by said image-taking device, and said controlling step comprises controlling said width changing device on the basis of the position of the movable guide rail detected in said guide-rail detecting step, a position of said stationary guide rail, and a desired value of the distance between the stationary and movable guide rails, such that an actual value of said distance coincides with said desired value.

3. A method according to claim 1, wherein said pair of guide rails consist of a stationary guide rail fixed in position and a movable guide rail which is movable toward and away from said stationary guide rail, wherein said image-taking step comprises a moving step of moving said image-taking device to a position determined on the basis of a position of the stationary guide rail, and said controlling step comprises controlling said width changing device such that the position of the image-taking device coincides with a position of a portion of said movable guide rail.

4. A method according to claim 1, wherein said pair of guide rails consist of a stationary guide rail fixed in position and a movable guide rail which is movable toward and away from said stationary guide rail, wherein said controlling step comprises operating said width changing device to move said movable guide rail, while moving said image-taking device so as to follow a movement of a portion of said movable guide device, and controlling said width changing device such that said movable guide rail is moved to a position determined on the basis of a position of said stationary guide rail.

5. A method according to claim 1, wherein said pair of guide rails consist of a stationary guide rail fixed in position and a movable guide rail which is movable toward and away from said stationary guide rail, wherein said controlling step comprises moving said image-taking device toward a desired position at which the width of the substrate conveyor is changed to a desired value, and controlling said width changing device so as to minimize an amount of deviation of a position of the image of a portion of said movable guide rail and a predetermined position within an imaging area of said image-taking device.

6. A method according to claim 2, comprising a stationary-guide-rail detecting step of operating said image-taking device to take an image of a portion of said stationary guide rail, and detecting a position of the stationary guide rail, as said portion of said at least one of said pair of guide rails, on the basis of the image of said portion of the stationary guide rail taken by the image-taking device.

7. A method according to claim 1, wherein said pair of guide rails includes a movable guide rail, said method comprising a step of storing in memory means position data representative of a position of a portion of said movable guide rail which was detected during a last operation of said width changing device to change the width of said substrate conveyor, and a positioning step of positioning said image-taking device on the basis of said position data stored in said memory means.

8. A method according to claim 1, wherein said pair of guide rails includes a movable guide rail, said method comprising a searching step of moving said image-taking device over a predetermined search range determined by a range of an operating stroke of said movable guide rail, to search a portion of the movable guide rail, as said portion of said at least one of said pair of guide rails.

9. A method according to claim 1, wherein said step of operating an image-taking device to take an image of a portion of at least one of said pair of guide rails comprises taking a fiducial mark provided on said portion of said at least one of said pair of guide rails.

10. A method according to claim 1, wherein said pair of guide rails have a plurality of pairs of fiducial marks which are spaced apart from each other in a longitudinal direction of the guide rails, each of said pairs consisting of two fiducial marks located on said pair of guide rails, respectively, at a same position in said longitudinal direction, and said step of controlling said width changing device comprises controlling said width changing device on the basis of images of said plurality of pairs of fiducial marks taken by said image-taking device.

11. A method according to claim 10, wherein said width changing device is capable of changing said distance of said pair of guide rails at a plurality of positions in said longitudinal direction, independently of each other, and said step of controlling said width changing device comprises controlling said width changing device such that the distance between said fiducial marks of each of said plurality of pairs coincides with a predetermined desired value.

12. A method according to claim 1, wherein said image-taking device is provided by an image-taking device operable to take an image of at least a portion of said circuit substrate, for detecting a position of the circuit substrate which has been fed by said feeding device of said variable-width substrate conveyor.

13. A method according to claim 12, wherein said image-taking device takes an image of a fiducial mark provided on at least said portion of said circuit substrate.

14. A variable-width substrate conveyor comprising:
 a feeding device for feeding a circuit substrate along the guide rails;
 a pair of guide rails having respective guide surfaces for guiding opposite side faces of the circuit substrate being fed by the feeding device, in a longitudinal direction of said pair of guide rails;
 a width changing device for moving said pair of guide rails relative to each other toward or away from each other, to change a distance between the pair of guide rails, for thereby changing a width of the variable-width substrate conveyor;
 an image-taking device operable to take an image of a predetermined portion of at least one of said pair of guide rails;
 a moving device operable to move said image-taking device in at least a direction of movement of said pair of guide rails relative to each other, and to detect a position of said image-taking device;
 an image processing device operable to process image data which are obtained by said image-taking device and which represent said image of said predetermined portion of said at least one of said pair of guide rails; and
 a control device operable to control said width changing device on the basis of a result of processing of said image data by said image processing device.

15. A variable-width conveyor according to claim 14, wherein said pair of guide rails consist of a stationary guide rail fixed in position and a movable guide rail which is movable toward and away from said stationary guide rail, and said image-taking device is operable to take an image of a predetermined portion of said stationary guide rail, as well as an image of a predetermined portion of said movable guide rail, as said predetermined portion of said at least one of said pair of guide rails.

16. A variable-width conveyor according to claim 14, wherein a fiducial mark is provided on said predetermined portion of said at least one of said pair of guide rails, and said image-taking device is operable to take an image of said fiducial mark, as the image of said predetermined portion of said at least one of said pair of guide rails.

17. A method of changing a width of a variable-width substrate conveyor in a substrate working system including (i) said substrate conveyor, (ii) a working device for performing a predetermined working operation on a circuit substrate which is fed to and stopped at a predetermined stop position by said substrate conveyor, (iii) an image-taking device for taking an image of a predetermined part of said circuit substrate stopped at said predetermined stop position, and (iv) a moving device for moving the image-taking device in at least a first direction parallel to a direction of said width of the substrate conveyor and detecting apposition of said image-taking device, said substrate conveyor including (a) a feeding device for feeding said circuit substrate in a second direction perpendicular to said first direction, (b) a pair of guide rails having respective guiding surfaces for guiding opposite side faces of the circuit substrate parallel to said second direction while the circuit substrate is fed by said feeding device, and (c) a width changing device for moving at least one of said guide rails relative to the other in said first direction to change a distance between said guiding surfaces, for thereby changing the width of the substrate conveyor, said method comprising:

an initial-width obtaining step of obtaining an initial value of the width of said substrate conveyor;

an imaging step of operating said moving device, after said initial value is obtained, to move said image-taking device to an image-taking position at which an image of a predetermined portion of at least one of said pair of guide rails can be taken by said image-taking device, and operating said image-taking device to take said image of said predetermined portion;

a position-obtaining step of obtaining a position of said predetermined portion of said at least one of said pair of guide rails, on the basis of said image-taking position of said image-taking device and a position of the image of said predetermined portion within an imaging area of said image-taking device; and a width-changing step of operating said width changing device to move said pair of guide rails relative to each other in said first direction, for moving said predetermined portion of said at least one of said pair of guide rails, to a desired position which is determined on the basis of the position of said predetermined portion obtained in said position-obtaining step, said initial value of the width of the substrate conveyor, and a width of the circuit substrate to be fed by the substrate conveyor.

18. A method according to claim 17, wherein said initial-width obtaining step comprises placing a reference board having a known reference width on said substrate conveyor, and adjusting the width of said substrate conveyor to said initial value, by adjusting said distance between said guiding surfaces to a value suitable for guiding said reference board.

19. A method according to claim 17, wherein said circuit substrate is provided with at least one fiducial mark which functions as said predetermined part.

20. A method according to claim 17, wherein said imaging step comprises operating said image-taking device to take an image of a fiducial mark which is provided on said at least one of said pair of guide rails and which functions as said predetermined portion.

21. A method according to claim 17, wherein said substrate working system includes:

a working head for performing said predetermined working operation; and a head moving device for moving said working head in a plane parallel to a working surface of said circuit substrate stopped at said predetermined stop position;

and wherein said imaging step comprises utilizing said head moving device as said moving device for moving said image-taking device.

22. A method according to claim 17, wherein said position-obtaining step comprises obtaining, as said position of said predetermined portion of said at least one of said pair of guide rails, a position of said image-taking device at which the position of said image of said predetermined portion is located at a predetermined position within said imaging area of said image-taking device.

23. A method according to claim 17, wherein said width changing device includes as a drive source thereof a stepping motor, and said width-changing step comprises operating said stepping motor by an angle corresponding to a difference between said initial value of the width of said substrate conveyor and a sum of the width of the circuit substrate to be fed by said substrate conveyor and a total amount of gaps between said guiding surfaces and said opposite side faces of said circuit substrate.

24. A method according to claim 17, wherein said width-changing step comprises a step of checking whether the width of said substrate conveyor has been changed to a value suitable for the width of the circuit substrate to be fed by the substrate conveyor, said checking being effected on the basis of the position of said image of said predetermined portion of said at least one of said pair of guide rails.

25. A method according to claim 24, wherein said step of checking comprises; moving said image-taking device in said first direction from said image-taking position by a distance equal to a difference between said initial value of the width of said substrate conveyor and a sum of the width of the circuit substrate to be fed by said substrate conveyor and a total amount of gaps between said guiding surfaces and said opposite side faces of said circuit substrate; operating said image-taking device to take another image of said predetermined portion of said at least one of said pair of guide rails, after the movement of said image-taking device by said distance; and effecting said checking on the basis of said another image.

26. A method according to claim 17, wherein said substrate conveyor is provided in combination with at least one of an upstream conveyor and a downstream conveyor which are disposed on respective upstream and downstream sides of said substrate conveyor, each of said at least one of said upstream and downstream conveyors including a feeding device, a pair of guide rails and a width changing device, which are identical with those of said substrate working system, said method further comprising a width-matching checking step of checking whether the position of said predetermined portion of said at least one of said pair of guide rails of said substrate conveyor is matched in said first direction with that of a position of a predetermined portion of at least one of said pair of guide rails of each of said at least one of said upstream and downstream conveyors, said width-matching checking step comprising operating said image-taking device to take an image of said predetermined portion of said at least one of said pair of guide rails of said each of said at least one of said upstream and downstream conveyors.

27. A method of matching widths of a substrate conveyor and at least one of an upstream conveyor and a downstream conveyor in a working system including (i) said substrate conveyor, (ii) said at least one of said upstream and downstream conveyors disposed on respective upstream and downstream sides of said substrate conveyor, (iii) a working device for performing a predetermined working operation on a circuit substrate which is fed to and stopped at a predetermined stop position by said substrate conveyor, (iv) an image-taking device for taking an image of a predetermined part of said circuit substrate stopped at said predetermined stop position, and (v) a moving device for moving the image-taking device in at least a first direction parallel to a direction of said width of the substrate conveyor, each of said substrate conveyor and said at least one of said upstream and downstream conveyors including (a) a feeding device for feeding said circuit substrate in a second direction perpendicular to said first direction, (b) a pair of guide rails having respective guiding surfaces for guiding opposite side faces of the circuit substrate parallel to said second direction while the circuit substrate is fed by said feeding device, and (c) a width changing device for moving said guide rails relative to each other in said first direction to change a distance between said guiding surfaces, said method comprising:

a first imaging step of operating said moving device to move said image-taking device to a first image-taking position at which an image of a predetermined portion of at least one of said pair of guide rails of said substrate conveyor can be taken by said image-taking device, and operating said image-taking device to take said image of said predetermined portion of said substrate conveyor;

a second imaging step of operating said moving device, after or before said first imaging step, to move said image-taking device to a second image-taking position at which an image of a predetermined portion of at least one of said pair of guide rails of said at least one of said upstream and downstream conveyors can be taken by said image-taking device, and operating said image-taking device to take said image of said predetermined portion of said at least one of said upstream and downstream conveyors; and a width-matching step of matching the widths of said substrate conveyor and said at least one of said upstream and downstream conveyors, on the basis of said images of said predetermined portions of said at least one of said pair of guide rails of said substrate conveyor and said at least one of said upstream and downstream conveyors.

* * * * *